United States Patent
Hsu et al.

(10) Patent No.: US 12,356,729 B2
(45) Date of Patent: Jul. 8, 2025

(54) SNAPBACK ELECTROSTATIC DISCHARGE (ESD) CIRCUIT, SYSTEM AND METHOD OF FORMING THE SAME

(71) Applicant: TAIWAN SEMICONDUCTOR MANUFACTURING COMPANY, LTD., Hsinchu (TW)

(72) Inventors: Chia-Lin Hsu, Hsinchu (TW); Yu-Hung Yeh, Hsinchu (TW); Yu-Ti Su, Hsinchu (TW); Wun-Jie Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 644 days.

(21) Appl. No.: 17/143,407

(22) Filed: Jan. 7, 2021

(65) Prior Publication Data

US 2021/0305235 A1    Sep. 30, 2021

Related U.S. Application Data

(60) Provisional application No. 63/000,611, filed on Mar. 27, 2020.

(51) Int. Cl.
   *H10D 89/60*   (2025.01)
   *H02H 9/04*   (2006.01)
   *H10D 30/60*   (2025.01)

(52) U.S. Cl.
   CPC .......... *H10D 89/815* (2025.01); *H02H 9/046* (2013.01); *H10D 30/603* (2025.01)

(58) Field of Classification Search
   None
   See application file for complete search history.

(56) References Cited

U.S. PATENT DOCUMENTS

| 7,260,442 B2 | 8/2007 | Hwang et al. |
| 9,256,709 B2 | 2/2016 | Yu et al. |
| (Continued) | | |

FOREIGN PATENT DOCUMENTS

| CN | 101617452 | 12/2009 |
| CN | 105917467 | 8/2016 |
| (Continued) | | |

OTHER PUBLICATIONS

Office Action dated Jan. 27, 2022 for corresponding case No. KR 10-2021-0029467. (pp. 1-4).

(Continued)

*Primary Examiner* — Nilufa Rahim
(74) *Attorney, Agent, or Firm* — Hauptman Ham, LLP

(57) ABSTRACT

A snapback electrostatic discharge (ESD) protection circuit includes a first well in a substrate, a drain region of a transistor, a source region of the transistor, a gate region of the transistor, and a second well embedded in the first well. The first well has a first dopant type. The drain region is in the first well, and has a second dopant type different from the first dopant type. The source region is in the first well, has the second dopant type, and is separated from the drain region in a first direction. The gate region is over the first well and the substrate. The second well is embedded in the first well, and is adjacent to a portion of the drain region. The second well has the second dopant type.

20 Claims, 26 Drawing Sheets

(56) References Cited

U.S. PATENT DOCUMENTS

| | | | |
|---|---|---|---|
| 2004/0141269 A1* | 7/2004 | Kitagawa | H01L 27/0251 |
| | | | 361/56 |
| 2005/0145947 A1 | 7/2005 | Russ et al. | |
| 2008/0218922 A1* | 9/2008 | Mallikararjunaswamy | ................. |
| | | | H01L 27/0262 |
| | | | 361/111 |
| 2014/0040838 A1 | 2/2014 | Liu et al. | |
| 2015/0278429 A1 | 10/2015 | Chang | |
| 2017/0170167 A1 | 6/2017 | Jang et al. | |
| 2017/0309613 A1* | 10/2017 | Chao | H01L 29/0626 |
| 2019/0206858 A1* | 7/2019 | Lin | H01L 27/027 |
| 2021/0366898 A1* | 11/2021 | Choi | H01L 27/0274 |

FOREIGN PATENT DOCUMENTS

| | | |
|---|---|---|
| CN | 109712971 | 5/2019 |
| JP | 2006523032 | 10/2006 |
| JP | 2009534845 | 9/2009 |
| KR | 20170071676 | 6/2017 |
| TW | 200623389 | 7/2006 |
| TW | 201917867 | 5/2019 |
| WO | 2004093133 | 10/2004 |
| WO | 2007124079 | 11/2007 |

OTHER PUBLICATIONS

Office Action dated Nov. 29, 2021 for corresponding case No. TW 11021173310. (pp. 1-7).

* cited by examiner

SNAPBACK ELECTROSTATIC DISCHARGE (ESD) CIRCUIT, SYSTEM AND METHOD OF FORMING THE SAME

PRIORITY CLAIM AND CROSS-REFERENCE

This application claims the benefit of U.S. Provisional Application No. 63/000,611, filed Mar. 27, 2020, which is herein incorporated by reference in its entirety.

BACKGROUND

The recent trend in miniaturizing integrated circuits (ICs) has resulted in smaller devices which consume less power, yet provide more functionality at higher speeds than before. The miniaturization process has also increased the devices' susceptibility to electrostatic discharge (ESD) events due to various factors, such as thinner dielectric thicknesses and associated lowered dielectric breakdown voltages. ESD is one of the causes of electronic circuit damage and is also one of the considerations in semiconductor advanced technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1A, 1B:
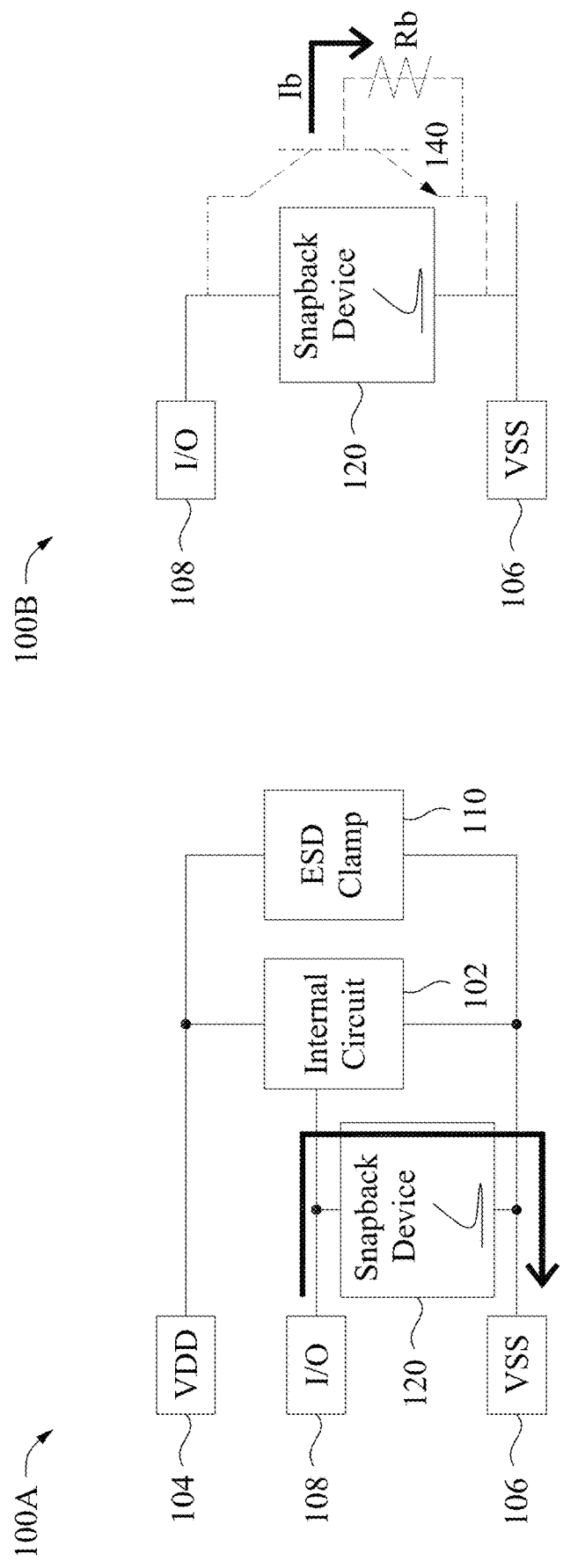
FIG. 1A is a schematic block diagram of an integrated circuit, in accordance with some embodiments.
FIG. 1B is a circuit diagram of an equivalent circuit of a portion of an integrated circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A parameter to be considered in an ESD protection device is an ESD threshold voltage or trigger voltage at which the ESD protection device is turned on, i.e., becomes conductive, to discharge high and harmful voltage and/or current of an ESD event away from circuits to be protected. A high ESD trigger voltage is potentially harmful to the circuits to be protected, and/or potentially causes non-uniform turning on and/or early failure of the ESD protection device itself. In some embodiments, to reduce the ESD threshold voltage or trigger voltage, an additional N-well is added to a P-well of the ESD protection device thereby increasing a base resistance of a parasitic bipolar junction transistor (BJT) of the ESD protection device.

In some embodiments, during an ESD event, increasing the base resistance of the parasitic BJT lowers the ESD threshold voltage of the parasitic BJT, thereby causing the parasitic BJT to turn on earlier at a lowered ESD trigger voltage, and the ESD voltage is able to be discharged faster than other approaches. In other words, the ESD trigger voltage is lowered resulting in improved ESD performance. Compared to other approaches, at least one or more embodiments advantageously provides a layout design or placement solution for reducing the ESD trigger voltage of snapback devices without additional manufacturing processes, and with improved ESD performance.

FIG. 1A is a schematic block diagram of an integrated circuit 100A, in accordance with some embodiments.

Integrated circuit 100A comprises an internal circuit 102, a voltage supply terminal 104, a reference voltage supply terminal 106, an input/output (IO) pad 108, an ESD clamp 110, and a snapback device 120. In some embodiments, at least integrated circuit 100A, 100B (FIG. 1B) or 400A (FIG. 4A) is incorporated on a single integrated circuit (IC), or on a single semiconductor substrate. In some embodiments, at least integrated circuit 100A, 100B or 400A includes one or more ICs incorporated on one or more single semiconductor substrates.

Internal circuit 102 is coupled to voltage supply terminal 104 (e.g., VDD), reference voltage supply terminal 106 (e.g., VSS) and IO pad 108. Internal circuit 102 is configured to receive a supply voltage VDD from voltage supply terminal 104 (e.g., VDD), a reference voltage VSS from reference voltage supply terminal 106 (e.g., VSS) and an IO signal from IO pad 108.

Internal circuit 102 includes circuitry configured to generate or process the IO signal received by or output to IO pad 108. In some embodiments, internal circuit 102 comprises core circuitry configured to operate at a voltage lower than supply voltage VDD of voltage supply terminal 104. In some embodiments, internal circuit 102 includes at least one n-type or p-type transistor device. In some embodiments, internal circuit 102 includes at least a logic gate cell. In some embodiments, a logic gate cell includes an AND, OR, NAND, NOR, XOR, INV, AND-OR-Invert (AOI), OR-AND-Invert (OAI), MUX, Flip-flop, BUFF, Latch, delay, or clock cells. In some embodiments, internal circuit 102 includes at least a memory cell. In some embodiments, the memory cell includes a static random access memory (SRAM), a dynamic RAM (DRAM), a resistive RAM (RRAM), a magnetoresistive RAM (MRAM) or read only memory (ROM). In some embodiments, internal circuit 102 includes one or more active or passive elements. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), FinFETs, and planar MOS transistors with raised source/drain. Examples of passive elements include, but are not limited to, capacitors, inductors, fuses, and resistors.

Voltage supply terminal 104 is configured to receive supply voltage VDD for normal operation of internal circuit 102. Similarly, reference voltage supply terminal 106 is configured to receive reference supply voltage VSS for normal operation of internal circuit 102. In some embodiments, at least voltage supply terminal 104 is a voltage supply pad. In some embodiments, at least reference voltage supply terminal 106 is a reference voltage supply pad. In some embodiments, a pad is at least a conductive surface, a pin, a node or a bus. Voltage supply terminal 104 or reference voltage supply terminal 106 is also referred to as a power supply voltage bus or rail. In the example configuration in FIGS. 1A-1B and 4A, supply voltage VDD is a positive supply voltage, voltage supply terminal 104 is a positive power supply voltage, reference supply voltage VSS is a ground supply voltage, and reference voltage supply terminal 106 is a ground voltage terminal. Other power supply arrangements are within the scope of the present disclosure.

IO pad 108 is coupled to internal circuit 102. IO pad 108 is configured to receive IO signal from internal circuit 102 or configured to output IO signal to internal circuit 102. IO pad 108 is at least a pin that is coupled to internal circuit 102. In some embodiments, IO pad 108 is a node, a bus or a conductive surface that is coupled to internal circuit 102.

ESD clamp 110 is coupled between voltage supply terminal 104 (e.g., supply voltage VDD) and reference voltage supply terminal 106 (e.g., VSS). If an ESD event occurs, ESD clamp 110 is configured to provide a current shunt path between voltage supply terminal 104 (e.g., supply voltage VDD) and reference voltage supply terminal 106 (e.g., VSS). When no ESD event occurs, ESD clamp 110 should be turned off. For example, when no ESD event occurs, ESD clamp 110 is turned off, and is therefore a nonconductive device or circuit during the normal operation of internal circuit 102. When an ESD event occurs, ESD clamp 110 should turn on to discharge the ESD current. For example, when an ESD event occurs, the voltage difference across the ESD clamp 110 is equal to or greater than a threshold voltage of ESD clamp 110, and ESD clamp 110 is turned ON thereby conducting current between voltage supply terminal 104 (e.g., VDD) and reference voltage supply terminal 106 (e.g., VSS).

In some embodiments, ESD clamp 110 includes a large NMOS transistor configured to carry the ESD current without entering the avalanche breakdown region of the ESD clamp 110. In some embodiments, ESD clamp 110 is implemented without having avalanching junctions inside ESD clamp 110, and is also known as a "non-snapback protection scheme."

Figure 4A:
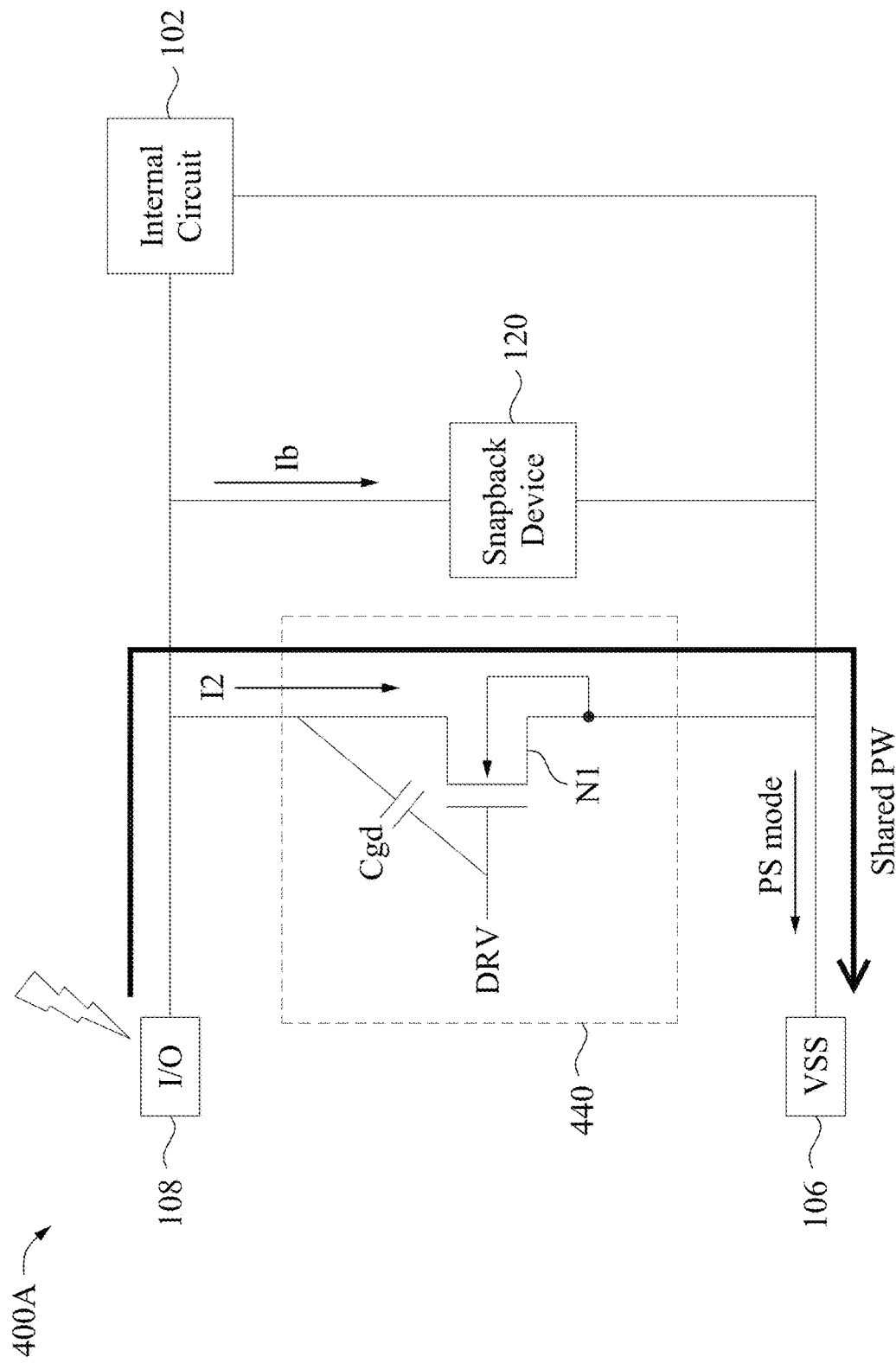
FIG. 4A is a schematic block diagram of an integrated circuit, in accordance with some embodiments.

Snapback device 120 is coupled between IO pad 108 and reference voltage supply terminal 106. Snapback device 120 is configured to have a minimal impact on the normal behavior (e.g., no ESD conditions) of internal circuit 102 or integrated circuit 100A-100B or 400A. In other words, snapback device 120 is turned OFF or is non-conductive in the absence of an ESD event. An ESD event occurs when an ESD voltage or current higher than a level of voltage or current expected during the normal operation of internal circuit 102 is applied to IO pad 108. Without snapback device 120, such an ESD event causes excessive and potentially damaging voltages or currents in internal circuit 102 and/or driver circuit 440 (FIG. 4A). Under ESD conditions, snapback device 120 is configured to turn on and exhibits snapback. In other words, under ESD conditions, snapback device 120 is configured to turn on, and operate in the avalanche breakdown region of snapback device 120 thereby carrying a large ESD current that will be discharged through snapback device 120 instead of through internal circuit 102.

In some embodiments, snapback device 120 is configured to turn-on or operate when a Positive-to-VSS (PS) mode of ESD stress or event occurs. For example, in PS-mode, a positive ESD stress or ESD voltage (at least greater than reference supply voltage VSS) is applied to IO pad 108, while voltage supply terminal 104 (e.g., VDD) is floating and reference voltage supply terminal 106 (e.g., VSS) is ground. In at least this example, when the ESD voltage is greater than an ESD trigger voltage Vth or threshold voltage of snapback device 120, snapback device 120 is turned ON and discharges the ESD voltage on IO pad 108 through the turned ON snapback device 120 to reference voltage supply terminal 106 (e.g., VSS) as shown by arrow "PS Mode" in FIG. 1A.

In some embodiments, snapback device 120 is disabled or is configured to turn-off or not operate when a Negative-to-VSS (NS) mode of ESD stress or event occurs. In some embodiments, snapback device 120 is turned off or non-operational when a NS-mode of ESD stress or event occurs. In NS-mode, a negative ESD stress is received by IO pad 108, while the voltage supply terminal 104 (e.g., VDD) is floating and reference voltage supply terminal 106 (e.g., VSS) is ground.

In some embodiments, snapback device 120 includes, but is not limited to, a snapback device having a parasitic NPN BJT, a snapback MOS device, a field oxide device (FOD), a silicon-controlled-rectifier (SCR), or the like.

Figure 2A:
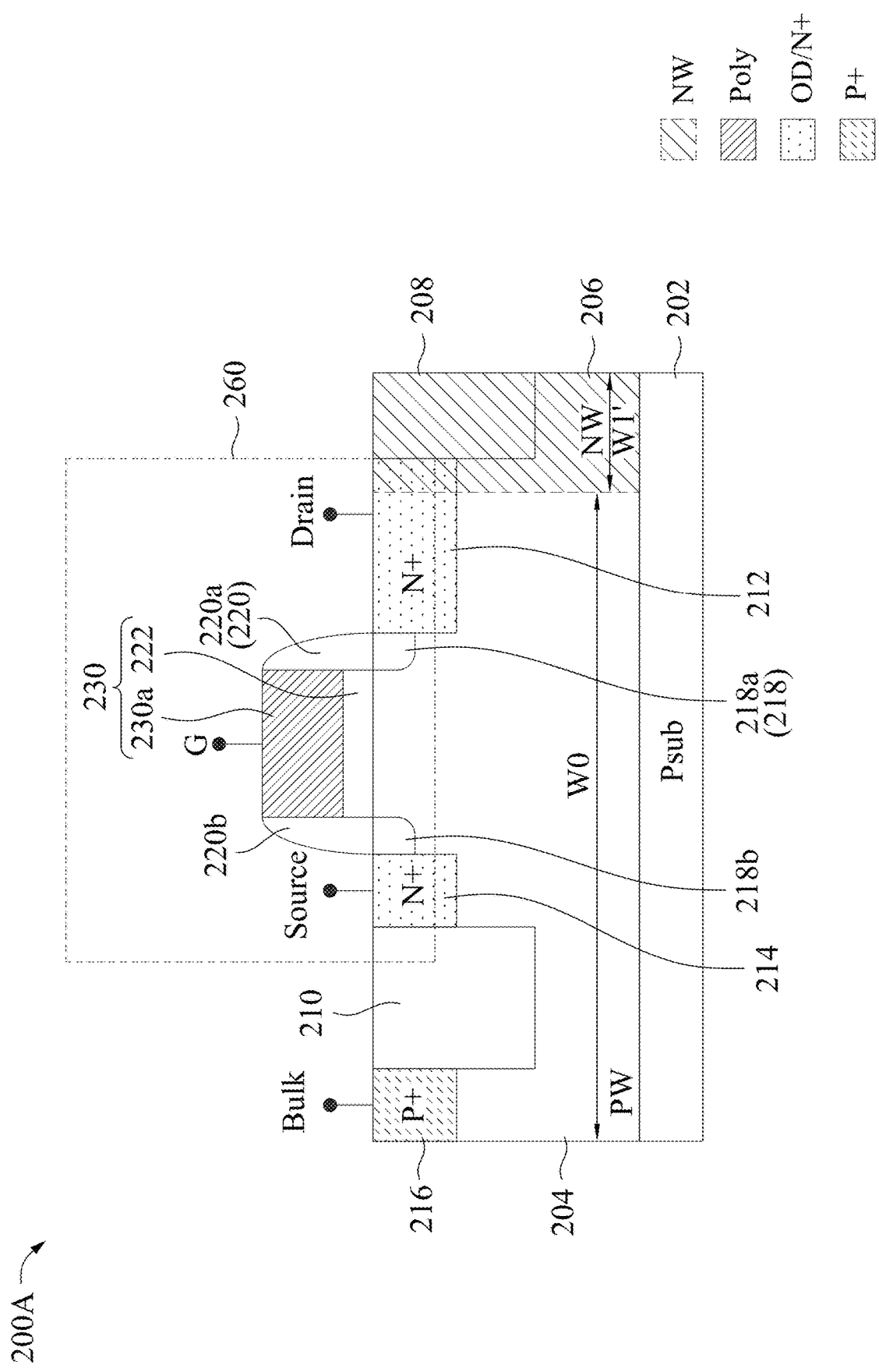
FIG. 2A is a cross-sectional view of an integrated circuit, in accordance with some embodiments.
Figure 2B:
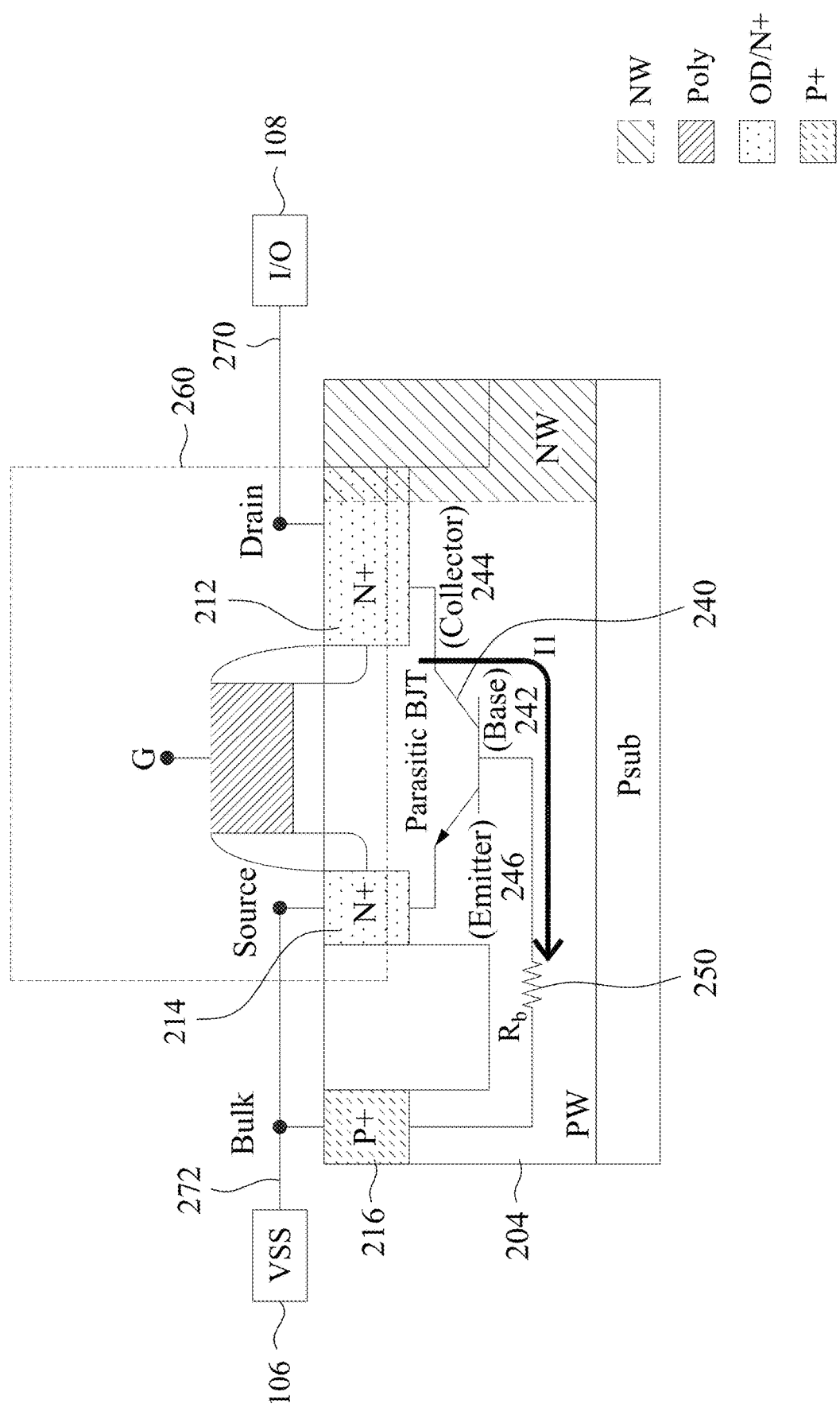
FIG. 2B is a cross-sectional view of an equivalent circuit of an integrated circuit, in accordance with some embodiments.

In some embodiments, integrated circuit 100A further includes an additional snapback device (not shown) similar to snapback device 120, but coupled between IO pad 108 and voltage supply terminal 104. In some embodiments, a cross-sectional view of the additional snapback device (not shown) is similar to integrated circuit 200A-200B (FIGS. 2A-2B).

In some embodiments, the additional snapback device is configured to turn-on or operate when a Positive-to-VDD (PD) mode of ESD stress or event occurs. For example, in PD-mode, a positive ESD stress or ESD voltage (at least greater than supply voltage VDD) is applied to IO pad 108, while voltage supply terminal 104 (e.g., VDD) is ground and reference voltage supply terminal 106 (e.g., VSS) is floating. In at least this example, when the ESD voltage is greater than an ESD trigger voltage Vth or threshold voltage of the additional snapback device, the additional snapback device is turned ON and discharges the ESD voltage on IO pad 108 through the turned ON additional snapback device to voltage supply terminal 104 (e.g., VDD).

In some embodiments, the additional snapback device is disabled or is configured to turn-off or not operate when a Negative-to-VDD (ND) mode of ESD stress or event occurs. In some embodiments, the additional snapback device is turned off or non-operational when a ND-mode of ESD stress or event occurs. In ND-mode, a negative ESD stress is received by IO pad 108, while the voltage supply terminal 104 (e.g., VDD) is ground and reference voltage supply terminal 106 (e.g., VSS) is floating.

In some embodiments, the additional snapback device includes, but is not limited to, a snapback device having a parasitic NPN BJT, a snapback MOS device, a field oxide device (FOD), a silicon-controlled-rectifier (SCR), or the like.

FIG. 1B is a circuit diagram of an equivalent circuit 100B of a portion of integrated circuit 100A, in accordance with some embodiments.

Equivalent circuit 100B is a variation of integrated circuit 100A, and shows a parasitic transistor 140 of snapback device 120, and similar detailed description is therefore omitted. For example, equivalent circuit 100B corresponds to snapback device 120 of FIG. 1A with parasitic elements (e.g., a parasitic transistor 140), in accordance with some embodiments.

Components that are the same or similar to those in one or more of FIGS. 1A-1B, 2B-2C, 3A-3B, 4A-4B, 5A-5C, 6A-6C, 7A-7C, 8A-8C and 9-13 (shown below) are given the same reference numbers, and detailed description thereof is thus omitted.

Equivalent circuit 100B includes IO pad 108, reference voltage supply terminal 106, snapback device 120 and parasitic transistor 140.

Parasitic transistor 140 is a bipolar junction transistor (BJT). In some embodiments, parasitic transistor 140 is an NPN parasitic transistor. Parasitic transistor 140 includes a collector of the BJT that corresponds to a drain region of snapback device 120, an emitter of the BJT that corresponds to the source region of snapback device 120, a base of BJT that corresponds to the P well and P substrate of snapback device 120, and a base resistance Rb that corresponds to a resistance of the P well and P substrate of snapback device 120.

The collector of parasitic transistor 140 is coupled to IO pad 108. Base resistance Rb is coupled between the base of parasitic transistor 140 and the emitter of parasitic transistor 140. The emitter of parasitic transistor 140 is further coupled to reference voltage supply terminal 106.

In some embodiments, during a positive ESD stress (e.g., PS-mode), when the ESD voltage is greater than an ESD trigger voltage Vth or threshold voltage of parasitic transistor 140, parasitic transistor 140 is turned ON, and thereby discharges the ESD voltage to reference voltage supply terminal 106 (e.g., VSS).

The trigger voltage Vth of parasitic transistor 140 is inversely related to each of the base current Ib and the base resistance Rb. For example, a decrease in at least the base current Ib or the base resistance Rb results in an increase of the trigger voltage Vth of parasitic transistor 140. For example, an increase in at least the base current Ib or the base resistance Rb results in a decrease of the trigger voltage Vth of parasitic transistor 140. In some embodiments, to reduce the ESD trigger voltage Vth, an N-well (FIGS. 2A-2B) is included in snapback device 120 which decreases the effective area of the P-well (FIGS. 2A-2B) inside snapback device 120. In some embodiments, by reducing the effective area of the P-well (FIGS. 2A-2B) inside snapback device 120 results in an increase in the base resistance Rb, and a reduction in the trigger voltage Vth than when the additional N-well (FIGS. 2A-2B) is not included.

Compared to other approaches, at least one embodiment advantageously provides a design technology co-optimization solution for lowering the ESD trigger voltage Vth without additional manufacturing processes including tuning processes.

In at least one embodiment, the lower ESD trigger voltage Vth advantageously avoids one or more issues associated with a higher ESD trigger voltage Vth in other approaches including, but not limited to, potential damage to the circuits to be protected, non-uniform turning ON, or early failure of the ESD protection device itself.

Figure 2C:
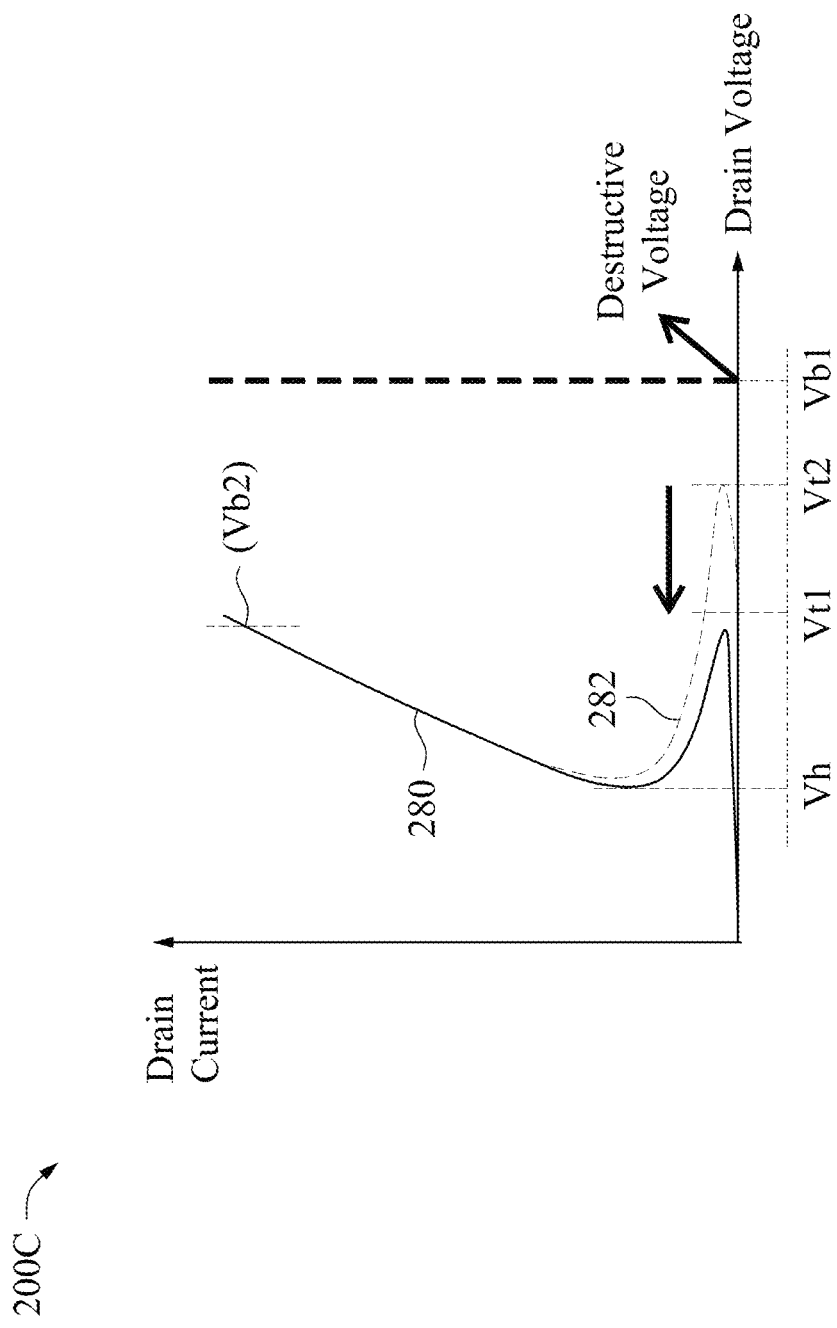
FIG. 2C is a waveform diagram of some embodiments compared with other approaches.

FIG. 2A is a cross-sectional view of an integrated circuit 200A, in accordance with some embodiments. FIG. 2B is a cross-sectional view of an equivalent circuit 200B of integrated circuit 200A, in accordance with some embodiments. For example, equivalent circuit 200B corresponds to integrated circuit 200A with parasitic BJT 240. For example, in comparison with FIG. 2B, integrated circuit 200A of FIG. 2A does not show parasitic BJT 240 of FIG. 2B for ease of illustration. FIG. 2C is a waveform diagram 200C of some embodiments compared with other approaches.

Integrated circuit 200A is an embodiment of snapback device 120.

Integrated circuit 200A includes a substrate 202. Substrate 202 is a p-type substrate. In some embodiments, substrate 202 is an n-type substrate. In some embodiments, substrate 202 includes an elemental semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, first substrate 202 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure.

Integrated circuit 200A further includes a P-well 204 and an N-well 206 in substrate 202. N-well 206 is adjacent to P-well 204. P-well 204 has a width W0 in a first direction X, and N-well 206 has a width W1' in the first direction X. In some embodiments, width W0 is greater than width W1'. P-well 204 has a dopant impurity type opposite of a dopant impurity type of N-well 206. N-well 206 includes an n-type dopant impurity, and P-well includes a p-type dopant impurity.

N-well 206 is located on the drain side of transistor 260. In some embodiments, by including N-well 206 in integrated circuit 200A decreases the effective area of P-well 204 in integrated circuit 200A thereby increasing the base resistance Rb of P-well 204 and substrate 202 during an ESD event. By increasing the base resistance Rb results in a reduction in the trigger voltage Vth1 of integrated circuit 200A during an ESD event than when N-well 206 is not included.

Integrated circuit 200A further includes a gate structure 230 that is over P-well 204. The gate structure 230 includes a gate dielectric 222 and a gate electrode 230a. Integrated circuit 200A further includes sidewalls on opposite sides of gate structure 230.

Integrated circuit 200A further includes a drain region 212 and a source region 214. The source region 214 is an N-type active region having N-type dopants implanted in the P-well 204. The drain region 212 is an N-type active region having N-type dopants implanted in at least the P-well 204 or the N-well 206. In some embodiments, at least source region 214 or drain region 212 extends above substrate 202. In some embodiments, the N-well 206 is embedded in the P-well 204. In some embodiments, the N-well 206 is adjacent to a portion of the drain region 212. In some embodiments, a first element is adjacent to a second element corresponds to the first element being directly next to the second element. In some embodiments, the first element is adjacent to the second element corresponds to the first element not being directly next to the second element. In some embodiments, the N-well 206 directly contacts a portion of the drain region 212.

In some embodiments, the drain region 212 and source region 214 of transistor 260 of FIGS. 2A-2B is referred to as an oxide definition (OD) region which defines the source or drain diffusion regions of integrated circuits 200A-200B or NMOS transistor N1 of FIG. 4A (described below).

In some embodiments, integrated circuit 200A further includes lightly doped drain (LDD) regions 218 adjacent to source region 214 and drain region 212, and below sidewalls 220. In some embodiments, LDD region 360 helps transistor 260 maintain a low leakage current.

Integrated circuit 200A further includes a P-well tap 216 over the P-well 204, and shallow trench isolation (STI) regions 208 and 210. STI region 208 is configured to isolate drain region 212 from other portions of integrated circuit 200A (not shown). STI region 210 is configured to isolate source region 214 from other portions of integrated circuit 200A. In some embodiments, region 210 is configured to isolate source region 214 from tap region 216. While FIGS. 2A-2B and FIGS. 5A-5B illustrate that STI region 208 is within N-well 206, in some embodiments, STI region 208 is not within N-well 206. In some embodiments, STI region 208 is adjacent or directly next to N-well 206. In some embodiments, N-well 206 is between drain region 212 and STI region 208. In some embodiments, STI region 208 is not formed in the same region or space as N-well 206. In some embodiments, STI region 208 is not formed in the N-well 206. In some embodiments, integrated circuit 200A or 200B does not include STI region 208 or 210.

In some embodiments, drain region 212, source region 214, LDD regions 218, sidewalls 220 and gate structure 230 together form a transistor 260. In some embodiments, transistor 260 is an NMOS transistor. In some embodiments, transistor 260 is a PMOS transistor. In some embodiments, transistor 260 corresponds to snapback device 120 of FIGS. 1A-1B. In some embodiments, transistor 260 corresponds to driver device 440 of FIG. 4A.

In some embodiments, drain region 212 is coupled to IO pad 108, and source region 214 and tap region 216 are coupled to reference voltage supply terminal 106 (e.g., voltage VSS). In some embodiments, gate structure 230 is also coupled to source region 214, tap region 216 and reference voltage supply terminal 106 (e.g., voltage VSS), and therefore corresponds to a grounded gate NMOS (ggNMOS) device.

In some embodiments, drain region 212 and source region 214 comprise fins in accordance with fin field-effect transistor (FinFET) complementary metal oxide-semiconductor (CMOS) technologies. In some embodiments, drain region 212 and source region 214 comprise nanosheets of nanosheet transistors. In some embodiments, drain region 212 and source region 214 comprise nanowire of nanwire transistors. In some embodiments, drain region 212 and source region 214 are free of fins in accordance with planar CMOS technologies. Other types of transistors are within the scope of the present disclosure.

In some embodiments, drain region 212 is an extended drain region and has a greater size than source region 214. In at least one embodiment, a silicide layer (not shown) covers a portion, but not the entirety, of drain region 212. Such a partially silicided configuration of drain region 212 improves self-protection of transistor 260 from ESD events. In at least one embodiment, drain region 212 is fully silicided.

Gate structure 230 is arranged between drain region 212 and source region 214. In some embodiments, gate electrode 230a comprises a conductive material such as metal or polysilicon (also referred to herein as "POLY"). In some embodiments, gate structure 230 is coupled to voltage supply terminal 104 (e.g., voltage VDD), or reference voltage supply terminal 106 (e.g., voltage VSS). In some embodiments, gate structure 230 is coupled to an external control circuit as described with respect to FIG. 4A.

FIG. 2B is a cross-sectional view of an equivalent circuit 200B of integrated circuit 200A, in accordance with some embodiments. For example, in comparison with FIG. 2B, integrated circuit 200A of FIG. 2A does not show parasitic BJT 240 of FIG. 2B for ease of illustration.

Integrated circuit 200B includes integrated circuit 200A, a parasitic BJT 240 (hereinafter "BJT 240"), and parasitic base resistance Rb.

BJT 240 includes a base 242, a collector 244 and an emitter 246. BJT 240 is an embodiment of parasitic transistor 140, and similar detailed description is therefore omitted. In comparison with parasitic transistor 140 of integrated circuit 100B of FIG. 1B, the base 242 replaces the base of parasitic transistor 140, the collector 244 replaces the collector of parasitic transistor 140, and the emitter 246 replaces the emitter of parasitic transistor 140, and similar detailed description is therefore omitted. Base resistance Rb of FIG. 2B corresponds to base resistance Rb of FIG. 1B, and similar detailed description is therefore omitted.

BJT 240 is an NPN parasitic BJT formed by at least the N-type drain region 212 and the N-type source region 214 in the P-well 204 and substrate 202. The P-well 204 and substrate 202 correspond to the base 242 of BJT 240, the drain region 212 of transistor 260 corresponds to the collector 244 of BJT 240, and the source region 214 of transistor 260 corresponds to the emitter 246 of BJT 240.

IO pad 108 is coupled to drain region 212 by conductive region 270 thereby coupling the IO pad 108 to collector 244 of BJT 240. Reference voltage supply 106 (e.g., VSS) is coupled to the source region 214 and the P-well tap 216 by conductive region 272 thereby coupling the emitter 246 of BJT 240 to the reference voltage supply 106 (e.g., VSS). In other words, the collector 244 and the emitter 246 are coupled between the IO pad 108 and reference voltage supply 106 (e.g., VSS).

The base resistance Rb corresponds to at least the resistance of P-well 204 or the substrate resistance of substrate 202. The base resistance Rb is coupled between the base 242 and the P-well tap 216. Since the reference voltage supply 106 (e.g., VSS) is coupled to the source region 214 and the P-well tap 216, a voltage drop across the base resistance Rb corresponds to a base-emitter voltage Vbe between the base 242 and the emitter 246 of BJT 240.

In the absence of an ESD event, the Vbe of BJT 240 is lower than a threshold or trigger voltage of BJT 240, and therefore BJT 240 is turned off. For example, in some embodiments, Vbe is zero, and BJT 240 is turned off. In some embodiments, when the gate structure 230 of transistor 260 is coupled to reference voltage supply terminal 106 (e.g., VSS) as described with respect to FIGS. 1A-1B, transistor 260 is also turned OFF without affecting the normal operation of the internal circuit 140. When the gate structure 230 of transistor 260 is configured to receive a driver control signal DRV (as described with respect to FIG. 4A) from a driver control circuit (not shown), transistor 260 is turned on or off in response to driver control signal DRV to controllably pull a voltage of IO pad 108 to a reference voltage VSS of reference voltage supply terminal 106 during the normal operation of the internal circuit 140.

In an ESD event, an ESD voltage is applied to IO pad 108. The ESD voltage on IO pad 108 is much higher than the voltage of the gate structure 230 and produces a strong electric field. The strong electric field can cause mobile charge carriers to energetically strike bounded charge carriers, which can then break free. This process leads to the production of new charge carriers and repeats until avalanche breakdown occurs where an avalanche current is generated. When the ESD voltage is applied to IO pad 108, the PN junction between the N-type drain region 212 and the P-well 204 is reverse biased until avalanche breakdown occurs. At this point, the drain current increases and the generated holes drift towards the base 242 of BJT 240. The flow of positively charged holes from the avalanche breakdown cause a voltage drop across the base resistance Rb of BJT 240. As the voltage of base 242 increases causes the base-emitter junction of BJT 240 to become more forward biased. As the base-emitter junction of BJT 240 becomes more forward biased, causes the base-emitter junction of BJT 240 to reach the threshold voltage, thereby turning BJT 240 on and discharging ESD current I1 from the collector 244 to the emitter 246. Thus, the high current from the ESD event is redirected away from gate structure 230 of transistor 260. In some embodiments, the base resistance Rb controls the speed of triggering avalanche mode of the BJT 240 by reducing the collector-to-emitter trigger voltage for BJT 240 that triggers avalanche mode. For example, by increasing the base resistance Rb causes the speed of triggering avalanche mode for BJT 240 to increase, thereby causing BJT 240 to turn on at a lower threshold voltage and to discharge ESD current I1 faster than other approaches.

In some embodiments, the voltage drop across the base resistance Rb of BJT 240 corresponds to Vbe. The higher the ESD voltage on IO pad 108, the higher the Vbe. When Vbe reaches the threshold voltage of BJT 240, BJT 240 is turned on and causes an ESD current I1 to flow from the drain region 212 to the source region 214. As a result, the ESD voltage on IO pad 108 is discharged through the turned on BJT 240 to the reference voltage supply terminal 106 (e.g., VSS). The voltage at which Vbe reaches the threshold voltage of BJT 240 is an ESD trigger voltage of transistor 260 or snapback device 120 of FIGS. 1A-1B.

As a result, at the same ESD voltage, Vbe in the other approaches is lower than in embodiments where the N-well 206 is included. In other words, embodiments including the N-well 206 permit Vbe to reach the threshold voltage of BJT 240 at a lower ESD voltage, and therefore, have a lower ESD trigger voltage than the other approaches. In at least one embodiment, the lower ESD trigger voltage advantageously avoids one or more issues associated with a higher ESD trigger voltage in other approaches, including, but not limited to, potential damage to the circuits to be protected, non-uniform turning on, early failure of the ESD protection device itself.

FIG. 2C is a waveform diagram 200C of some embodiments compared with other approaches.

Waveform diagram 200C includes a current voltage (I-V) characteristic curve of integrated circuit 200A, in accordance with some embodiments. Waveform diagram 200C further includes an I-V characteristic curve 282 of other approaches.

As shown in FIG. 2C, the x-axis corresponds to the drain voltage in the y-axis corresponds to the drain current.

As shown in FIG. 2C, the BJT 240 turns on when the drain voltage has a voltage value Vt1 for curve 280, and a parasitic BJT of other approaches turns on when the drain voltage of a transistor of other approaches has a voltage value Vt2 for curve 282. Each of voltage value Vt1 for curve 280 and voltage value Vt2 for curve 282 are less than a destructive voltage Vb1 of transistor 260.

As shown in FIG. 2C, once BJT 240 turns on, the high electric field that started the avalanche process is not present to sustain the drain current, and is known as snapback. For example, the drain current is increased at a lower drain voltage then voltage Vt1. Therefore, the drain voltage is reduced to the holding voltage Vh, and the snapback behavior is observed. After BJT 240 turns on, an increase in the drain voltage further increases the drain current until thermal damage to transistor 260 occurs at voltage Vt2. In some embodiments, the holding voltage Vh is greater than supply voltage VDD thereby preventing transistor 260 from turning on and preventing latch-up.

In some embodiments, by including N-well 206 in transistor 260 decreases the effective area of P-well 204 in transistor 260 thereby increasing the base resistance Rb of the P-well 204 and substrate 202. By increasing the base resistance Rb results in a reduction in the trigger voltage Vth of transistor 260 during an ESD event compared to other approaches at the same ESD trigger voltage. Compared to other approaches, at least one embodiment advantageously provides a design technology co-optimization solution for lowering the ESD trigger voltage Vth without additional manufacturing processes including tuning processes. In at least one embodiment, the lower ESD trigger voltage Vth advantageously avoids one or more issues associated with a higher ESD trigger voltage Vth in other approaches, including, but not limited to, potential damage to the circuits to be protected, non-uniform turning on, or early failure of the ESD protection device itself.

Figure 3A:
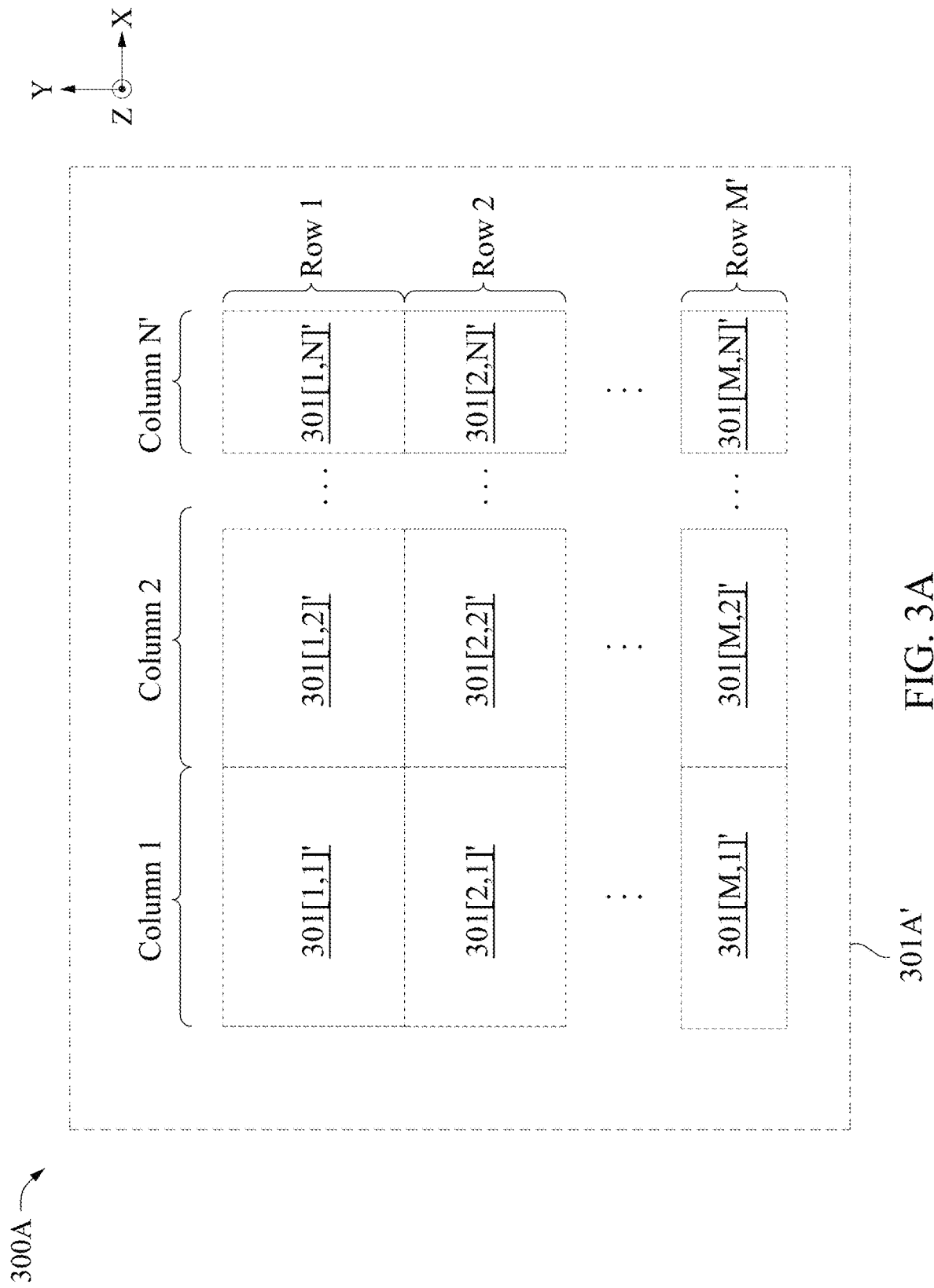
FIG. 3A is a block diagram of a snapback device array having a plurality of snapback device cells, in accordance with some embodiments.

FIG. 3A is a block diagram of a snapback device array 300' having a plurality of snapback device cells (e.g., integrated circuit 200A-200B), in accordance with some embodiments. For example, snapback device 120 and parasitic transistor 130 of FIGS. 1A-1B or integrated circuit 200A-200B of FIGS. 2A-2B is usable as one or more snapback devices in snapback device array 301'.

Snapback device array 301' comprises an array of snapback devices 301 [1,1]', 301 [1,2]', . . . , 301 [2,2]', . . . , 301 [M',N']' (collectively referred to as "array of snapback devices 301A'") having M' rows and N' columns, where N' is a positive integer corresponding to the number of columns in array of snapback devices 301A' and M' is a positive integer corresponding to the number of rows in array of snapback devices 301A'. The rows of cells in array of snapback devices 301A' are arranged in a first direction X. The columns of cells in array of snapback devices 301A' are arranged in a second direction Y. The second direction Y is different from the first direction X. In some embodiments, the second direction Y is perpendicular to the first direction X.

In some embodiments, each snapback device 301 [1,1]', 301 [1,2]', . . . , 301 [2,2]', . . . , 301 [M',N']' in array of snapback devices 301A' includes a corresponding transistor 260.

In some embodiments, each snapback device 301 [1,1]', 301 [1,2]', . . . , 301 [2,2]', . . . , 301 [M',N']' in array of snapback devices 301A' that is located on the perimeter of the array includes a circuit similar to integrated circuit 200A-200B, and each snapback device 301 [1,1]', 301 [1,2]', . . . , 301 [2,2]', . . . , 301 [M,N]' in array of snapback devices 301A' that is not located on the perimeter of the array includes a circuit similar to integrated circuit 200A-200B without P-well tap 216, and similar detailed description is therefore omitted.

Different types of snapback device cells in snapback device array 301' are within the contemplated scope of the present disclosure.

Figure 3B:
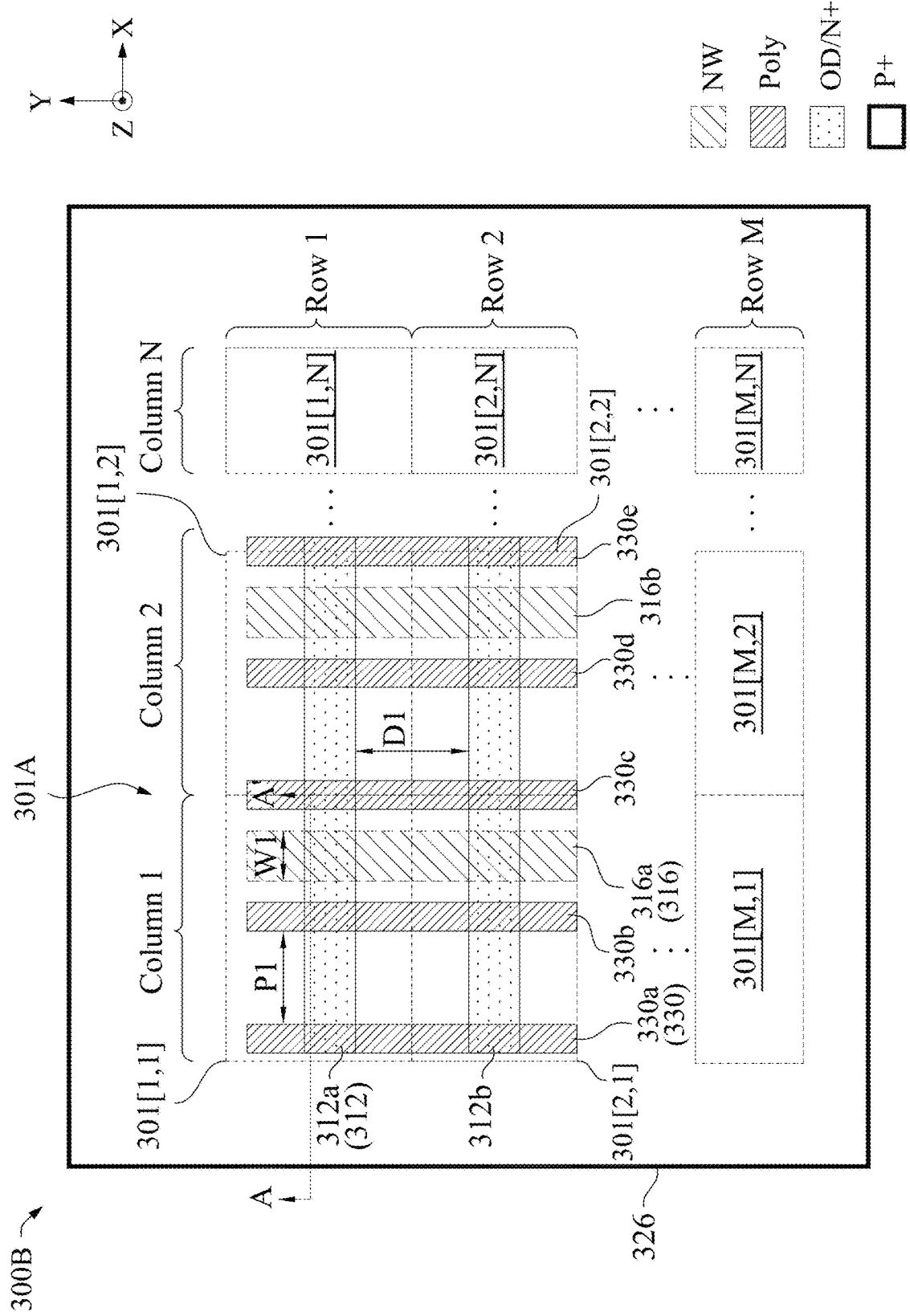
FIG. 3B is a diagram of a layout design, in accordance with some embodiments.

FIG. 3B is a diagram of a layout design 300B, in accordance with some embodiments.

Layout design 300B is a layout diagram of snapback device array 300A of FIG. 3A. Layout design 300B is usable to manufacture snapback device array 300A of FIG. 3A. In some embodiments, a portion of layout design 300B is usable to manufacture snapback device 120 and parasitic transistor 130 of FIGS. 1A-1B or integrated circuits 200A-200B of FIGS. 2A-2B. In some embodiments, FIG. 3B includes additional elements not shown in FIG. 3B.

Structural relationships including alignment, distances, lengths, widths and pitches, as well as configurations of at least integrated circuit 100A-100B (FIGS. 1A-1B), 200A-200B (FIGS. 2A-2B), 400A (FIG. 4A) 500A-500B (FIGS. 5A-5B) or 600A-600B (FIGS. 6A-6B) or snapback device array 300A (FIG. 3A) are similar to the corresponding structural relationships and corresponding configurations of at least layout design 300B (FIG. 3B), 400B (FIG. 4B), 500C (FIG. 5C), 600C (FIG. 6C), 700A-700C (FIGS. 7A-7C) or 800A-800C (FIGS. 8A-8C), and similar detailed description will not be described in FIGS. 1A-1B, 2A-2C, 3A-3B, 4A-4B, 5A-C, 6A-6C, 7A-7C, 8A-8C and 9-13 for brevity.

Layout design 300B includes a snapback device layout array 301. Snapback device layout array 301 comprises an array of snapback device layout designs 301 [1,1], 301 [1,2], . . . , 301 [2,2], . . . , 301 [M,N] (collectively referred to as an "array of snapback device layout designs 301A) having M rows and N columns, where N is a positive integer corresponding to the number of columns in array of snapback device layout designs 301A and M is a positive integer corresponding to the number of rows in array of snapback device layout designs 301A. The rows of cells in array of snapback device layout designs 301A are arranged in the first direction X. The columns of cells in array of snapback device layout designs 301A are arranged in the second direction Y. In some embodiments, at least M or N is equal to M' or N' of FIG. 4A.

In some embodiments, each snapback device layout design 301 [1,1], 301 [1,2], 301 [2,2], . . . , 301 [M,N] in array of snapback device layout designs 301A is useable to manufacture a corresponding snapback device 301 [1,1]', 301 [1,2]', . . . , 301 [2,2]', . . . , 301 [M',N']' in array of snapback devices 301A'.

In some embodiments, each snapback device layout design 301 [1,1], 301 [1,2], . . . , 301 [2,2], . . . , 301 [M,N] in array of snapback device layout designs 301A includes a layout design of corresponding transistor 260.

In some embodiments, each snapback device layout design 301 [1,1], 301 [1,2], . . . , 301 [2,2], . . . , 301 [M,N] in array of snapback device layout designs 301A includes a corresponding layout design of corresponding integrated circuit 200A-200B.

Each layout design in snapback device layout array 301 corresponds to a layout design of integrated circuit 200A or 200B. In some embodiments, the cross-sectional view of integrated circuit 200A or equivalent circuit 200B corresponds to layout design 300B as intersected by plane A-A'.

FIG. 3B shows the details of snapback device layout designs 301 [1,1], 301 [1,2], 301 [2,2] and 301 [2,2] and omits the details of other snapback device layout designs in snapback layout device array 301 for brevity. However, the details of other snapback device layout designs in snapback device layout array 301 are similar to the details of snapback device layout designs 301 [1,1], 301 [1,2], 301 [2,1] and 301 [2,2], and similar detailed description is therefore omitted.

In some embodiments, snapback device layout designs 301 [1,1] and 301 [1,2] include an active region layout pattern 312a. In some embodiments, snapback device layout designs 301 [2,1] and 301 [2,2] include an active region layout pattern 312b.

In some embodiments, snapback device layout designs 301 [1,1] and 301 [2,1] include a well layout pattern 316a. In some embodiments, snapback device layout designs 301 [1,1] and 301 [2,1] include gate layout patterns 330a and 330b, and at least a portion of gate layout pattern 330c.

In some embodiments, snapback device layout designs 301 [1,2] and 301 [2,2] include a well layout pattern 316b. In some embodiments, snapback device layout designs 301 [1,2] and 301 [2,2] include gate layout pattern 330d, and at least a portion of gate layout pattern 330c and 330e.

Different types of snapback device layout designs in array of snapback device layout designs 301 are within the contemplated scope of the present disclosure.

Layout design 300B includes at least active region layout pattern 312a or 312b (collectively referred to as a "set of active region layout patterns 312") extending in the second direction Y. Active region layout patterns 312a, 312b of the set of active region layout patterns 312 are separated from one another in the second direction Y.

In some embodiments, an end of each of the active region layout patterns of the set of active region layout patterns 312 is separated from an end of an adjacent active region layout pattern of the set of active region layout patterns 312 in the second direction Y by a distance D1.

In some embodiments, active region layout pattern 312a is usable to manufacture an active region (e.g., drain region 212 and source region 214) of transistor 260 of FIGS. 2A-2B. In some embodiments, active region layout pattern 312b is usable to manufacture an active region (e.g., drain region 212 and source region 214) of transistor 260 of FIGS. 2A-2B or the drain region and source region of NMOS transistor N1 of FIG. 4A.

In some embodiments, at least active region layout pattern 312a or 312b corresponds to the P-well 204. Active region layout pattern 312a or 312b is part of corresponding row 1 or 2 of snapback device layout array 301.

In some embodiments, at least active region layout pattern 312a or 312b is a continuous layout pattern that extends in the first direction X. In some embodiments, at least active region layout pattern 312a or 312b includes at least N discontinuous layout patterns that extend in the first direction X, where N corresponds to the number of columns in snapback device layout array 301.

In some embodiments, the set of active region layout patterns 312 is located on a first level. In some embodiments, the first level corresponds to an active level or an OD level of one or more of layout designs 300B, 400B, 500C, 600C, 700A-700C or 800A-800C (FIGS. 3B, 4B, 5C, 6C, 7A-7C or 8A-8C) or integrated circuit 200A-200B, 500A-500B, 600A-600B (FIGS. 2A-2B, 5A-5B or 6A-6B).

Other configurations, levels or quantities of patterns in at least set of active region layout patterns 312 are within the scope of the present disclosure.

Layout design 300B further includes at least gate layout pattern 330a, 330b, 330c, 330d or 330e (collectively referred to as a "set of gate layout patterns 330") each extending in the second direction Y. Each of the gate layout patterns of the set of gate layout patterns 330 is separated from an adjacent gate layout pattern of the set of gate layout patterns 330 in the first direction X by a first pitch. In some embodiments, an end of each of the gate layout patterns of the set of gate layout patterns 330 is separated from an end of an adjacent gate layout pattern of the set of gate layout patterns 330 in the first direction X by a pitch P1.

In some embodiments, at least gate layout pattern 330a, 330b, 330c, 330d or 330e is usable to manufacture a gate similar to gate structure 230. In some embodiments, at least gate layout pattern 330a, 330b, 330c, 330d or 330e is usable to manufacture a gate similar to the gate of NMOS transistor N1 in FIG. 4A. In some embodiments, at least gate layout pattern 330a, 330c and 330e are useable to manufacture dummy gate structures (not shown) in FIGS. 2A-2B.

Gate layout pattern 330b or 330d is part of corresponding column 1 or 2 of snapback device layout array 301. In some embodiments, at least a portion of gate layout pattern 330a or 330c is part of column 1 of snapback device layout array 301. In some embodiments, at least a portion of gate layout pattern 330c or 330e is part of column 2 of snapback device layout array 301.

The set of gate layout patterns 330 are positioned on a second level (POLY) different from the first level. The set of gate layout patterns 330 overlap the set of active region layout patterns 312. In some embodiments, the second level corresponds to a POLY level of one or more of layout designs 300B, 400B, 500C, 600C, 700A-700C or 800A-800C (FIGS. 3B, 4B, 5C, 6C, 7A-7C or 8A-8C) or integrated circuit 200A-200B, 500A-500B, 600A-600B (FIGS. 2A-2B, 5A-5B or 6A-6B).

Other configurations, levels or quantities of patterns in the set of gate layout patterns 330 are within the scope of the present disclosure.

Layout design 300B further includes at least well layout pattern 316a or 316b (collectively referred to as a "set of well layout patterns 316") each extending in the second direction Y. Each of the well layout patterns of the set of well layout patterns 316 is separated from an adjacent well layout pattern of the set of well layout patterns 316 in the first direction X. Each of the well layout patterns of the set of well layout patterns 316 has a width W1 extending in the first direction X. At least well layout pattern 316a or 316b is usable to manufacture the N-well 206. The width W1 is less than the pitch P1. In some embodiments, the width W1 is equal to the pitch P1.

In some embodiments, the set of well layout patterns 316 overlap the set of active region layout patterns 312. Well layout pattern 316a is between gate layout patterns 330b and 330c. Well layout pattern 316b is between gate layout patterns 330d and 330e. Well layout pattern 316a or 316b is part of corresponding column 1 or 2 of snapback device layout array 301. In some embodiments, at least well layout pattern 316a or 316b is positioned on the drain side of corresponding active region layout pattern 312a or 312b of snapback device layout array 301. At least well layout pattern 316a or 316b has a rectangular shape. In some embodiments, at least well layout pattern 316a or 316b has a polygonal shape.

In some embodiments, at least well layout pattern 316a or 316b is a continuous well layout pattern that extends in the second direction Y. In some embodiments, at least well layout pattern 316a or 316b includes at least M discontinuous well layout patterns that extend in the second direction Y, where M corresponds to the number of rows in snapback device layout array 301.

In some embodiments, at least well layout pattern 316a or 316b separates the set of active region layout patterns 312 into discontinuous layout patterns arranged in columns. In some embodiments, at least well layout pattern 316a or 316b separates the set of active region layout patterns 312 into discontinuous layout patterns thereby separating the P-well 204 into discontinuous patterns arranged in columns.

The set of well layout patterns 316 are positioned on a third level. In some embodiments, the third level is different from the first level and the second level. In some embodiments, the third level is the same as the first level. In some embodiments, the third level corresponds to the active level or the OD level of one or more of layout designs 300B, 400B, 500C, 600C, 700A-700C or 800A-800C (FIGS. 3B, 4B, 5C, 6C, 7A-7C or 8A-8C) or integrated circuit 200A-200B, 500A-500B, 600A-600B (FIGS. 2A-2B, 5A-5B or 6A-6B).

Other configurations, levels or quantities of patterns in the set of well layout patterns 316 are within the scope of the present disclosure.

Layout design 300B further includes at least a tap cell layout pattern 326 extending in the first direction and the second direction Y. Layout pattern 326 surrounds the snapback device layout array 301. Tap cell layout pattern 326 is separated from snapback device layout array 301 in the first direction X and the second direction Y. In some embodiments, tap cell layout pattern 326 is a continuous layout pattern that extends in the first direction X and the second direction Y.

Tap cell layout pattern 326 is usable to manufacture the P-well tap 216 of FIGS. 2A-2B. In some embodiments, tap cell layout pattern 326 is usable to manufacture the body terminal of NMOS transistor N1 of FIG. 4A.

In some embodiments, the tap cell layout patterns 326 is located on the first level. Other configurations, levels or quantities of patterns in the tap cell layout pattern 326 are within the scope of the present disclosure.

FIG. 4A is a schematic block diagram of an integrated circuit 400A, in accordance with some embodiments.

Integrated circuit 400A is a variation of integrated circuit 100A-100B, and similar detailed description is therefore omitted. For example, integrated circuit 400A is a portion of integrated circuit 100A of FIG. 1A combined with driver circuit 440, in accordance with some embodiments. While integrated circuit 400A of FIG. 4A shows a portion of integrated circuit 100A, it is understood that integrated circuit 400A can be modified to include each of the features of integrated circuit 100A combined with driver circuit 440 similar to that shown in FIG. 4A, and similar detailed description is therefore omitted for brevity.

Integrated circuit 400A includes internal circuit 102, IO pad 108, reference voltage supply terminal 106, snapback device 120 and driver circuit 440.

Driver circuit 440 is an N-type Metal Oxide Semiconductor (NMOS) transistor N1. In some embodiments, driver circuit 440 is a P-type Metal Oxide Semiconductor (PMOS) transistor.

Driver circuit 440 is coupled between IO pad 108 and reference voltage supply terminal 106 (e.g., VSS). A gate of NMOS transistor N1 is configured to receive a driver signal DRV. A drain of NMOS transistor N1 is coupled to I/O pad 108 and snapback device 120, and a source of NMOS transistor N1 is coupled to reference voltage supply terminal 106 and snapback device 120. The source of NMOS transistor N1 is further coupled to a body of NMOS transistor N1.

In some embodiments, driver circuit 440 is coupled to internal circuit 102, and is configured to handle signal transfer between internal circuit 102, supply voltage VDD of reference voltage supply terminal 104 and reference voltage VSS of the reference voltage supply terminal 106.

Driver circuit 440 is coupled in parallel with snapback device 120. In some embodiments, driver circuit 440 is included as part of snapback device 120. For example, in some embodiments, NMOS transistor N1 of driver circuit 440 corresponds to the NMOS device in the snapback device of integrated circuits 200A-200B. In the absence of an ESD event, NMOS transistor N1 is configured to, under control of driver signal DRV, operate as a driver circuit during the normal operation of internal circuit 102. When an ESD event occurs, NMOS transistor N1 is configured to operate as an ESD protection device (e.g., snapback device) as described with respect to FIGS. 1A-1B and 2A-2C. In these embodiments, NMOS transistor N1 of driver circuit 440 is configured to share the P-well 204 with integrated circuit 200A or snapback device 120.

Driver circuit 440 has a parasitic capacitance Cgd between the gate of NMOS transistor N1 and the drain of NMOS transistor N1. In some embodiments, during a positive ESD stress (e.g., PS-mode), the gate of NMOS transistor N1 is capacitively coupled to the drain of NMOS transistor N1 and IO pad 108 through the parasitic capacitance Cgd, thereby receiving the positive ESD stress. By receiving the positive ESD stress during the ESD event, causes NMOS transistor N1 to at least slightly turn on thereby generating a channel current 12 in the p-well of NMOS transistor N1. In some embodiments, since NMOS transistor N1 of driver circuit 440 shares the P-well 204 with integrated circuits 200A-200B or snapback device 120, NMOS transistor N1 of driver circuit 440 contributes channel current to the other devices that also share P-well 204 (e.g., integrated circuits 200A-200B, snapback device 120 or other snapback devices in snapback array 301A') thereby generating a higher base current Ib for integrated circuits 200A-200B or snapback device 120 than other approaches. In some embodiments, the earlier turn-on behavior of driver circuit 440 combined with the higher base current Ib triggers other snapback devices in parallel in snapback array 301A' to turn on jointly, thereby further reducing the trigger voltage Vth of integrated circuits 200A-200B and 400A or snapback device 120.

In some embodiments, an additional driver circuit (not shown) is coupled between IO pad 108 and voltage supply terminal 104 of integrated circuit 100A of FIG. 1A. In some embodiments, the additional driver circuit (not shown) is a PMOS transistor. In some embodiments, the additional driver circuit (not shown) is similar to driver circuit 440, and similar detailed description is therefore omitted.

Other configurations or quantities of circuits in integrated circuit 400A are within the scope of the present disclosure.

Figure 4B:
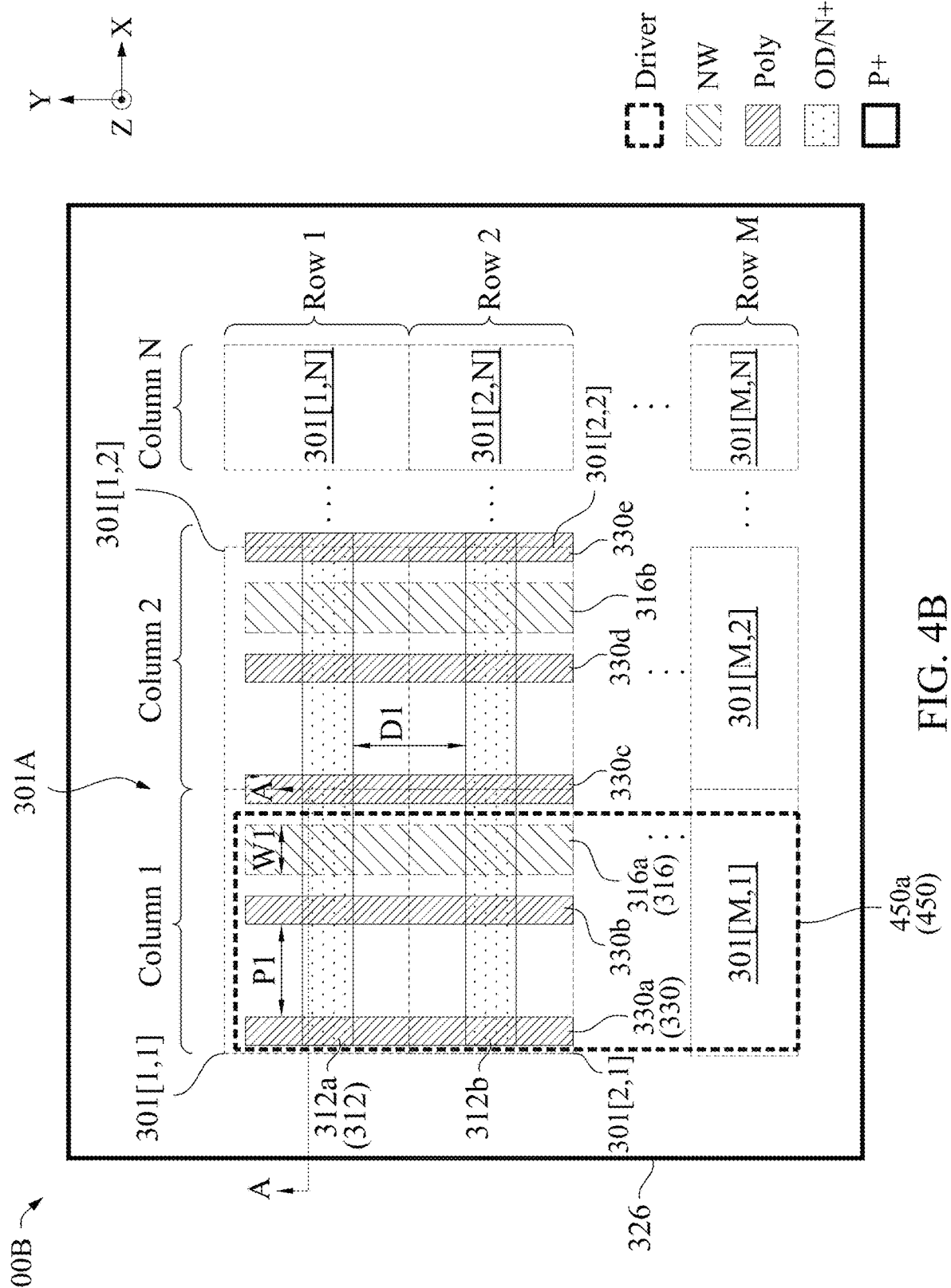
FIG. 4B is a diagram of a layout design, in accordance with some embodiments.

FIG. 4B is a diagram of a layout design 400B, in accordance with some embodiments.

Layout design 400B is a layout diagram of integrated circuit 400A. Layout design 400B is usable to manufacture integrated circuit 400A. In some embodiments, FIG. 4B includes additional elements not shown in FIG. 4B.

Layout design 400B is a variation of layout design 300B (FIG. 3B), and therefore similar detailed description is omitted. For example, layout design 400B illustrates an example where a driver circuit layout pattern 450 is positioned in the same P-well column (e.g., column 1) as snapback device layout patterns 301 [1,1], . . . , 301 [M,1] of snapback device layout array 301.

In some embodiments, by positioning driver circuit layout pattern 450 in the same P-well column (e.g., column 1) as snapback device layout patterns 301 [1,1], . . . , 301 [M,1] of snapback device layout array 301, driver circuit layout pattern 450 shares the P-well 204 with snapback device layout patterns 301 [1,1], . . . , 301 [M,1], and thus has similar advantages to those described above for FIG. 4A, and are not repeated for brevity.

Layout design 400B is a layout diagram of snapback device array 300A of FIG. 3A. Layout design 400B is usable to manufacture snapback device array 300A of FIG. 3A.

Layout design 400B includes layout design 300B and driver circuit layout pattern 450.

Driver circuit layout pattern 450 is usable to manufacture driver circuit 440 of FIG. 4A. In some embodiments, driver circuit layout pattern 450 corresponds to a location of the driver circuit 440 of FIG. 4A. In some embodiments, driver circuit 440 corresponds to transistor 260, and therefore the driver circuit layout pattern 450 corresponds to a layout design of transistor 260.

In some embodiments, each of the layout designs in column 1 of snapback device layout array 301 includes driver circuit layout pattern 450. In some embodiments, at least one of the layout designs in snapback device layout array 301 includes driver circuit layout pattern 450.

In some embodiments, at least another column in snapback device layout array 301 includes a layout pattern similar to driver circuit layout pattern 450, and similar detailed description is therefore omitted.

Other configurations or quantities of patterns in driver circuit layout pattern 450 are within the scope of the present disclosure.

Figure 5A:
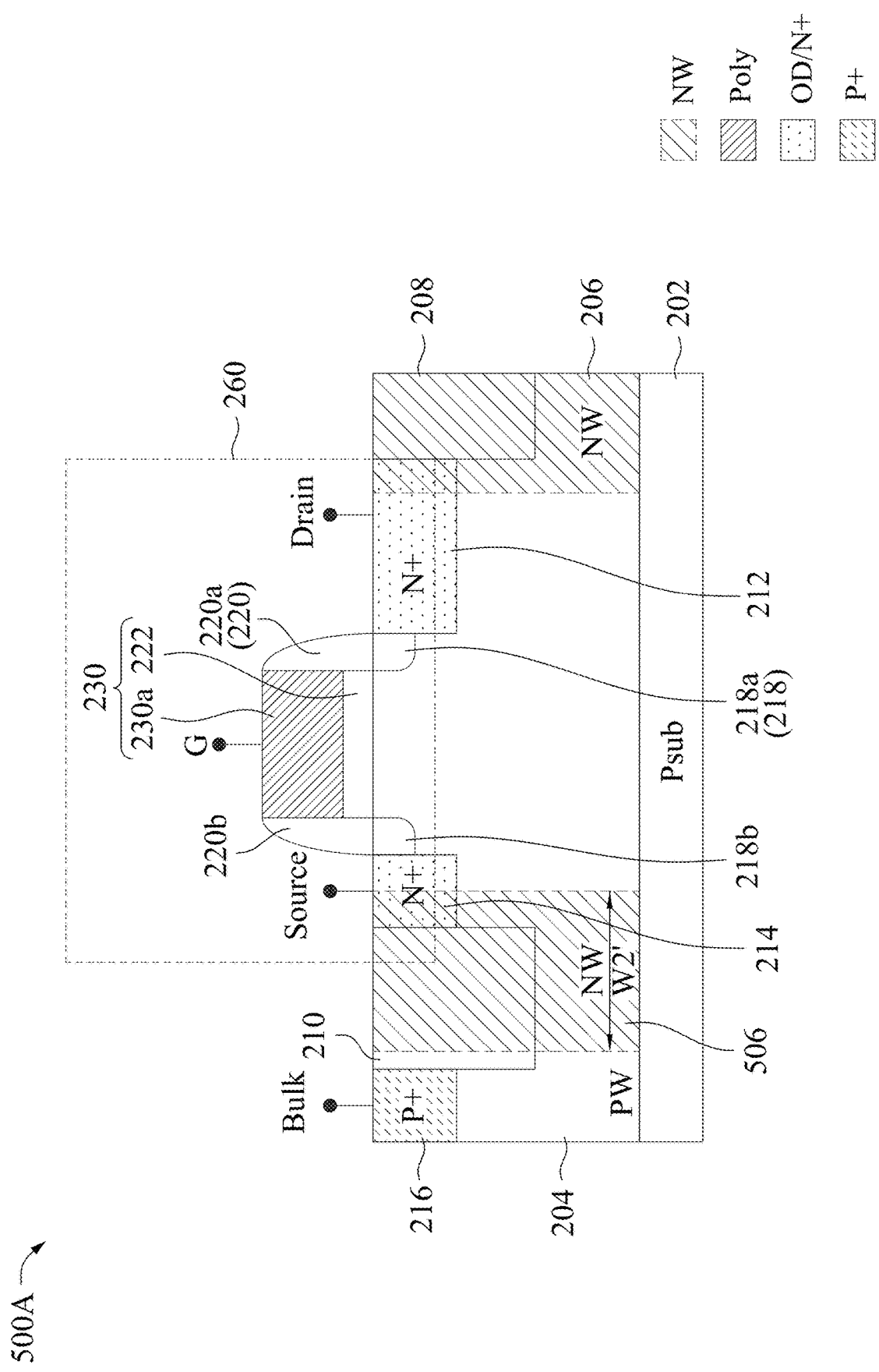
FIG. 5A is a cross-sectional view of an integrated circuit, in accordance with some embodiments.
Figure 5B:
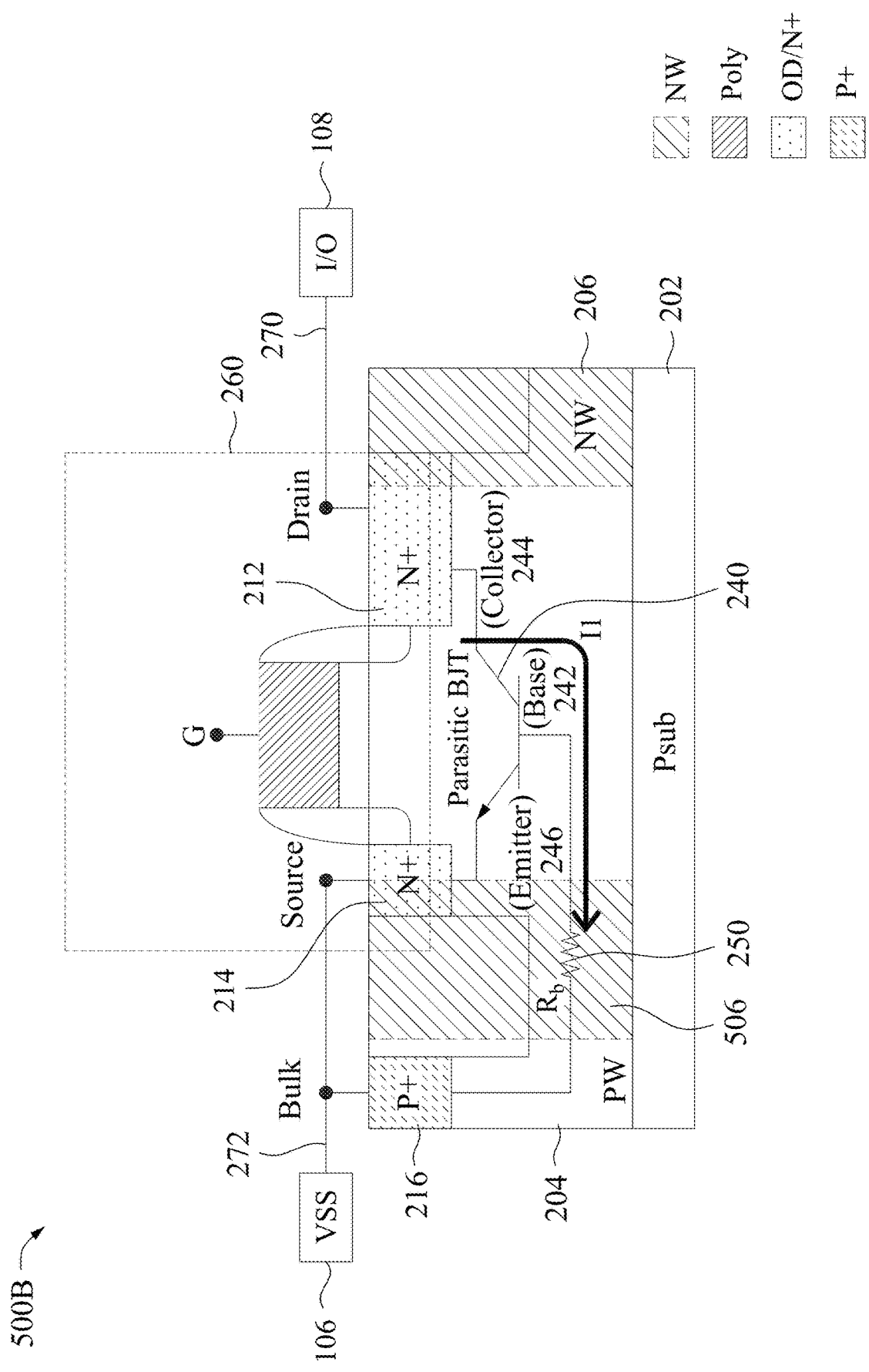
FIG. 5B is a cross-sectional view of an equivalent circuit of an integrated circuit, in accordance with some embodiments.
Figure 5C:
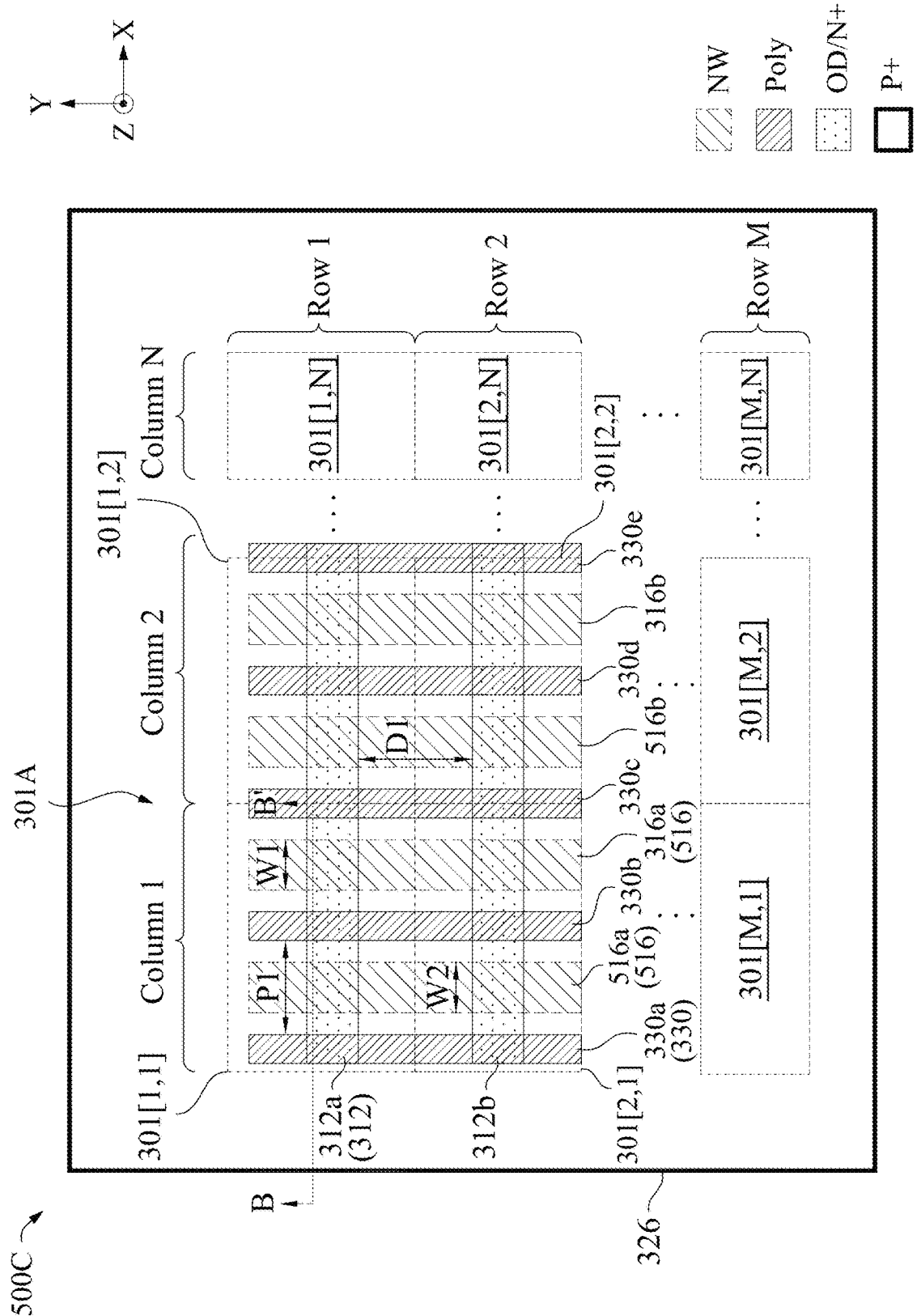
FIG. 5C is a diagram of a layout design, in accordance with some embodiments.

FIG. 5A is a cross-sectional view of an integrated circuit 500A, in accordance with some embodiments. FIG. 5B is a cross-sectional view of an equivalent circuit 500B of integrated circuit 500A, in accordance with some embodiments. FIG. 5C is a diagram of a layout design 500C, in accordance with some embodiments. In some embodiments, the cross-sectional view of integrated circuit 500A or equivalent circuit 500B corresponds to layout design 500C as intersected by plane B-B'.

Integrated circuit 500A is an embodiment of snapback device 120.

Integrated circuit 500A is a variation of integrated circuit 200A, and similar detailed description is therefore omitted. For example, integrated circuit 500A illustrates an example where an additional N-well (e.g., N-well 506) is added to snapback device 120 or integrated circuit 200A. In some embodiments, by positioning an additional N-well (e.g., N-well 506) into the P-well (e.g., P-well 204) further reduces the effective area of the P-well (e.g., P-well 204).

In comparison with integrated circuit 200A of FIG. 2A, integrated circuit 500A further includes N-well 506. N-well 506 is similar to N-well 206, and similar detailed description is therefore omitted.

P-well 204 and N-well 506 are in substrate 202. N-well 506 is within P-well 204. N-well 506 has a width W2' in the first direction X. In some embodiments, width W2' is different from width W1'. In some embodiments, width W2' is equal to width W1'.

At least N-well 506 or 206 has a dopant impurity type opposite of a dopant impurity type of P-well 204. N-well 506 includes an n-type dopant impurity, and P-well 204 includes a p-type dopant impurity. While FIGS. 5A-5B and FIGS. 6A-6B illustrate that STI region 210 is within N-well 506, in some embodiments, STI region 210 is not within N-well 506. In some embodiments, STI region 210 is adjacent or directly next to N-well 506. In some embodiments, N-well 506 is between source region 214 and STI region 210. In some embodiments, STI region 210 is not formed in the same region or space as N-well 506. In some embodiments, STI region 210 is not formed in the N-well 506. In some embodiments, integrated circuit 500A or 500B does not include STI region 208 or 210. In some embodiments, integrated circuit 600A or 600B does not include STI region 208 or 210.

N-well 506 is located on the source side of transistor 260. In some embodiments, by including N-well 506 in integrated circuit 500A decreases the effective area of P-well 204 in integrated circuit 500A thereby increasing the base resistance Rb of P-well 204 and substrate 202 during an ESD event. By increasing the base resistance Rb results in a reduction in the trigger voltage Vth of integrated circuit 500A during an ESD event than when N-wells 206 and 506 are not included.

Other configurations, dimensions or quantities of N-well 506 are within the scope of the present disclosure.

FIG. 5B is a cross-sectional view of an equivalent circuit 500B of integrated circuit 500A, in accordance with some embodiments. For example, equivalent circuit 500B corresponds to integrated circuit 500A with parasitic BJT 540. For example, in comparison with FIG. 5B, integrated circuit 500A of FIG. 5A does not show parasitic BJT 540 of FIG. 5B for ease of illustration.

FIG. 5C is a diagram of a layout design 500C, in accordance with some embodiments.

Layout design 500C is a layout diagram of integrated circuit 500A or equivalent circuit 500B. Layout design 500C is usable to manufacture integrated circuit 500A or equivalent circuit 500B. In some embodiments, FIG. 5C includes additional elements not shown in FIG. 5C.

In some embodiments, the cross-sectional view of integrated circuit 500A or equivalent circuit 500B corresponds to layout design 500C as intersected by plane B-B'.

Layout design 500C is a layout diagram of snapback device array 300A of FIG. 3A. Layout design 500C is usable to manufacture snapback device array 300A of FIG. 3A.

Layout design 500C is a variation of layout design 300B (FIG. 3B), and therefore similar detailed description is omitted. For example, layout design 500C illustrates an example where a well layout pattern 516a is added to column 1 of snapback device layout array 301, and where a well layout pattern 516b is added to column 2 of snapback device layout array 301. In some embodiments, by positioning well layout pattern 516a in column 1 of snapback device layout array 301, and positioning well layout pattern 516b in column 2 of snapback device layout array 301, each snapback device layout pattern in snapback device layout array 301 of layout design 500C is useable to manufacture at least an integrated circuit, similar to integrated circuits 500A-500B having two N-wells (e.g., N-well 206 and N-well 506), thereby further reducing the area of P-well 204, and thus has similar advantages to those described above for FIG. 5A, and are not repeated for brevity.

In comparison with layout design 300B of FIG. 3B, layout design 500C further includes well layout pattern 516a and well layout pattern 516b. Well layout pattern 516a or 516b is similar to corresponding well layout pattern 316a or 316b, and similar detailed description is therefore omitted.

In comparison with layout design 300B of FIG. 3B, set of well layout patterns 516 replaces set of well layout patterns 316 of FIG. 3B, and similar detailed description is therefore omitted. Set of well layout patterns 516 includes at least well layout pattern 316a, 316b, 516a or 516b.

Well layout pattern 516a or 516b each extend in the second direction Y. Each of the well layout patterns of the set of well layout patterns 516 is separated from an adjacent well layout pattern of the set of well layout patterns 516 in the first direction X. At least well layout pattern 516a or 516b has a width W2 extending in the first direction X. In some embodiments, width W2 is equal to width W1. In some embodiments, width W2 is different from width W1. The width W2 is less than the pitch P1. In some embodiments, the width W2 is equal to the pitch P1.

At least well layout pattern 516a or 516b is usable to manufacture the N-well 506.

Well layout pattern 516a is positioned between gate layout patterns 330a and 330b (e.g., on the source side of corresponding active region layout pattern 312a or 312b of snapback device layout array 301). Well layout pattern 516b is positioned between gate layout patterns 330c and 330d (e.g., on the source side of corresponding active region layout pattern 312a or 312b of snapback device layout array 301).

Well layout pattern 516a or 516b is part of corresponding column 1 or 2 of snapback device layout array 301. In some embodiments, at least well layout pattern 516a or 516b further separates the set of active region layout patterns 312 into further discontinuous layout patterns arranged in columns. In some embodiments, at least well layout pattern 516a or 516b further separates the set of active region layout patterns 312 into further discontinuous layout patterns thereby further separating the P-well 204 into discontinuous patterns arranged in columns.

The set of well layout patterns 516 are positioned on the third level. Other configurations, levels or quantities of patterns in the set of well layout patterns 516 are within the scope of the present disclosure.

Figure 6A:
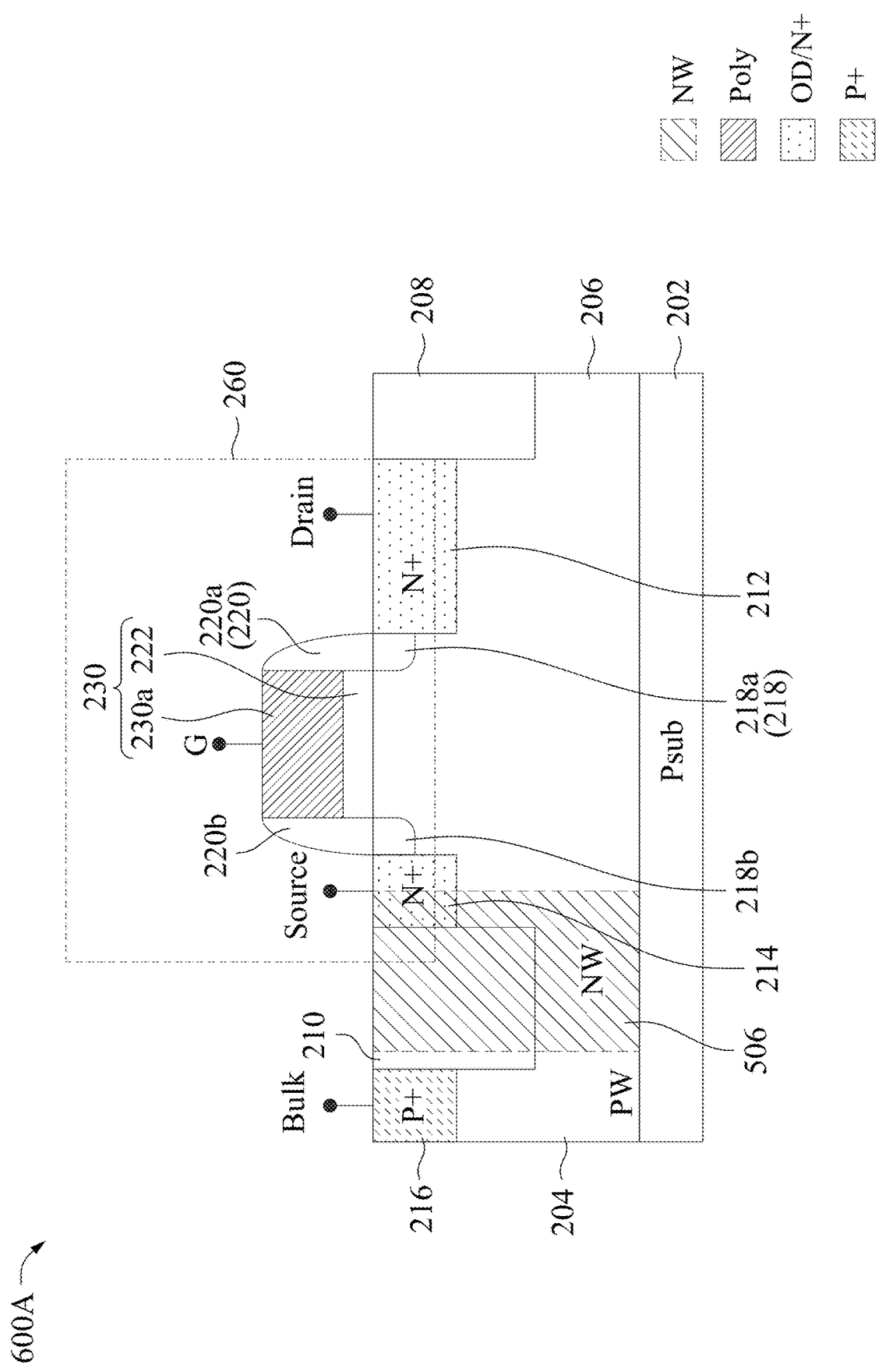
FIG. 6A is a cross-sectional view of an integrated circuit, in accordance with some embodiments.
Figure 6B:
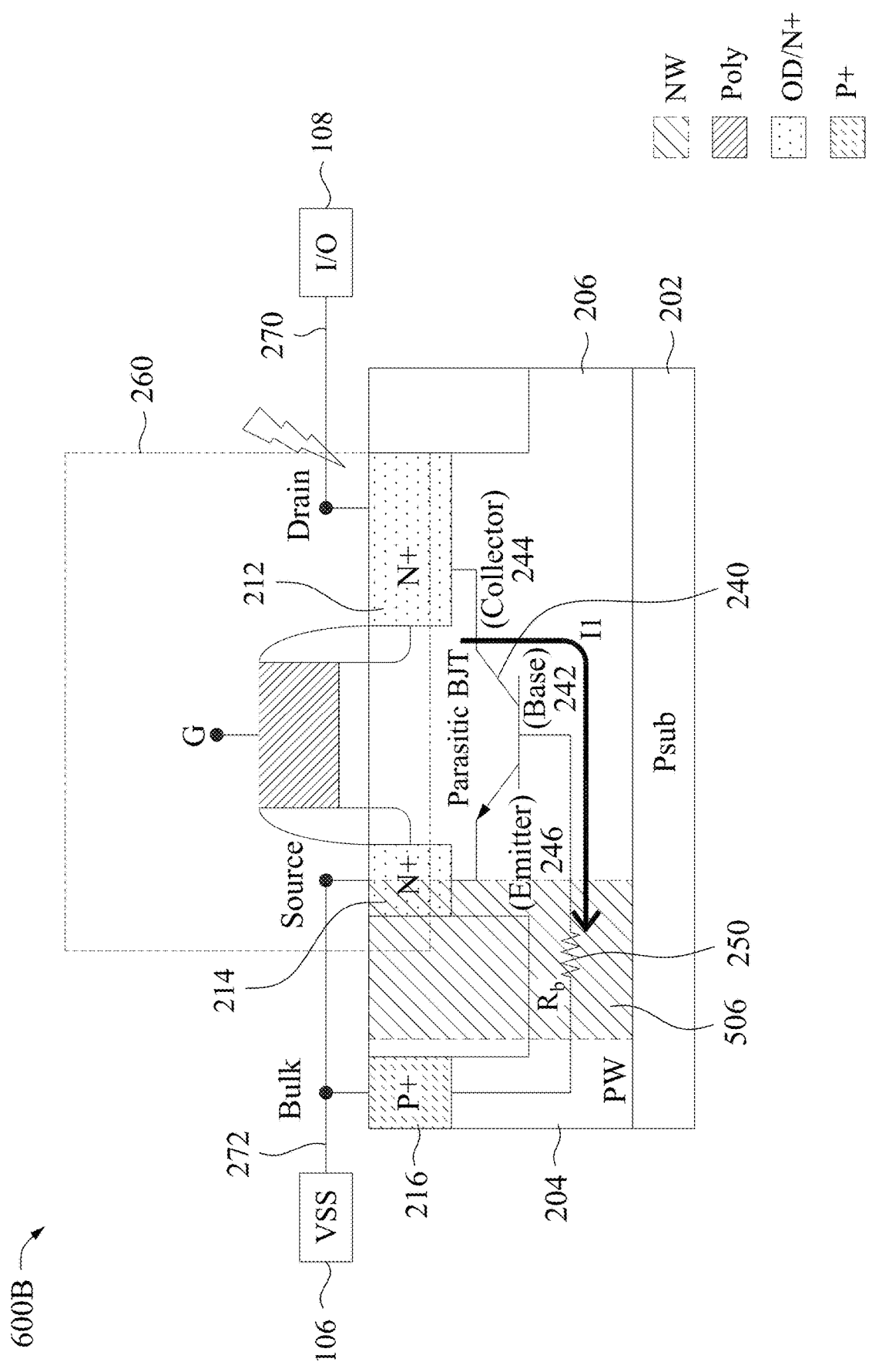
FIG. 6B is a cross-sectional view of an equivalent circuit of an integrated circuit, in accordance with some embodiments.
Figure 6C:
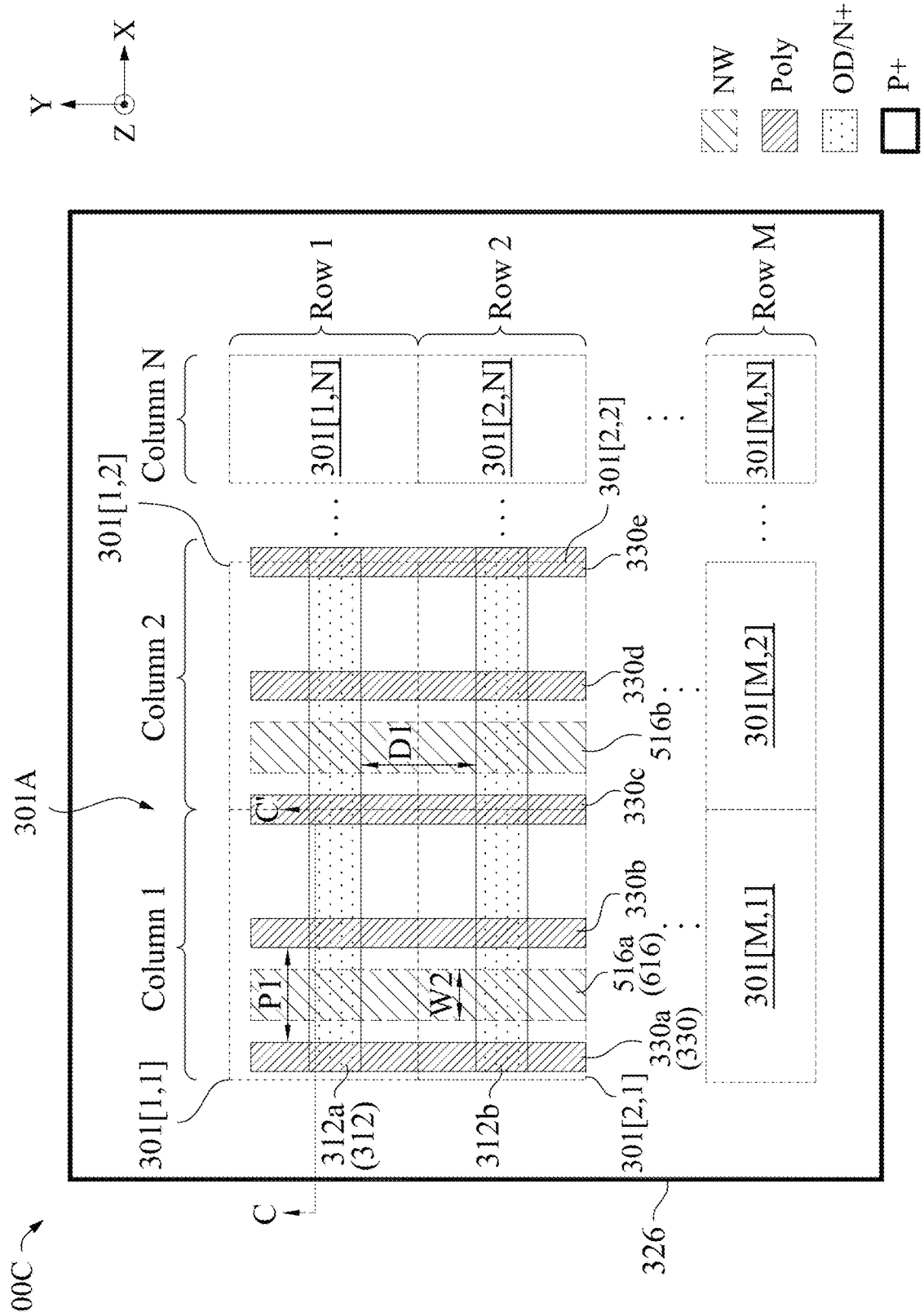
FIG. 6C is a diagram of a layout design, in accordance with some embodiments.

FIG. 6A is a cross-sectional view of an integrated circuit 600A, in accordance with some embodiments. FIG. 6B is a cross-sectional view of an equivalent circuit 600B of integrated circuit 600A, in accordance with some embodiments. FIG. 6C is a diagram of a layout design 600C, in accordance with some embodiments. In some embodiments, the cross-sectional view of integrated circuit 600A or equivalent circuit 600B corresponds to layout design 600C as intersected by plane C-C'.

Integrated circuit 600A is an embodiment of snapback device 120.

Integrated circuit 600A is a variation of integrated circuit 500A, and similar detailed description is therefore omitted. For example, integrated circuit 600A illustrates an example that does not include an N-well on the drain side (e.g., N-well 206) in snapback device 120 or integrated circuit 200A.

In comparison with integrated circuit 500A of FIG. 5A, integrated circuit 600A does not include N-well 206. Thus, integrated circuit 600A does not include an N-well on the drain side (e.g., N-well 206), but includes an N-well on the source side (e.g., N-well 506) of transistor 260. In some embodiments, by including N-well 506 on the source side of integrated circuit 700A decreases the effective area of P-well 204 in integrated circuit 700A thereby increasing the base resistance Rb of P-well 204 and substrate 202 during an ESD event. By increasing the base resistance Rb results in a reduction in the trigger voltage Vth of integrated circuit 600A during an ESD event than when N-well 506 is not included.

Other configurations, dimensions or quantities of elements in integrated circuit 600A are within the scope of the present disclosure.

FIG. 6B is a cross-sectional view of an equivalent circuit 600B of integrated circuit 600A, in accordance with some embodiments. For example, equivalent circuit 600B corresponds to integrated circuit 600A with parasitic BJT 640. For example, in comparison with FIG. 6B, integrated circuit 600A of FIG. 6A does not show parasitic BJT 640 of FIG. 6B for ease of illustration.

FIG. 6C is a diagram of a layout design 600C, in accordance with some embodiments.

Layout design 600C is a layout diagram of integrated circuit 600A or equivalent circuit 600B. Layout design 600C is usable to manufacture integrated circuit 600A or equivalent circuit 600B. In some embodiments, FIG. 6C includes additional elements not shown in FIG. 6C.

In some embodiments, the cross-sectional view of integrated circuit 600A or equivalent circuit 600B corresponds to layout design 600C as intersected by plane C-C'.

Layout design 600C is a layout diagram of snapback device array 300A of FIG. 3A. Layout design 600C is usable to manufacture snapback device array 300A of FIG. 3A.

Layout design 600C is a variation of layout design 500C (FIG. 5C), and therefore similar detailed description is omitted. In comparison with integrated circuit 500C of FIG. 5C, layout design 600C does not include well layout patterns 316a and 316b. Thus, layout design 600C does not include well layout patterns 316a and 316b on the drain side, but includes well layout patterns 516a and 516b on the source side of transistor 260.

In some embodiments, by positioning well layout pattern 516a or 516b in corresponding column 1 or 2 of snapback device layout array 301 on the drain side, each snapback device layout pattern in snapback device layout array 301 of layout design 600C is useable to manufacture at least an integrated circuit, similar to integrated circuit 600A or equivalent circuit 600B having an N-well 506 on the drain side, thereby further reducing the area of P-well 204, and thus has similar advantages to those described above for FIG. 6A, and are not repeated for brevity.

Other configurations, levels or quantities of patterns in layout design 600C are within the scope of the present disclosure.

Figure 7A:
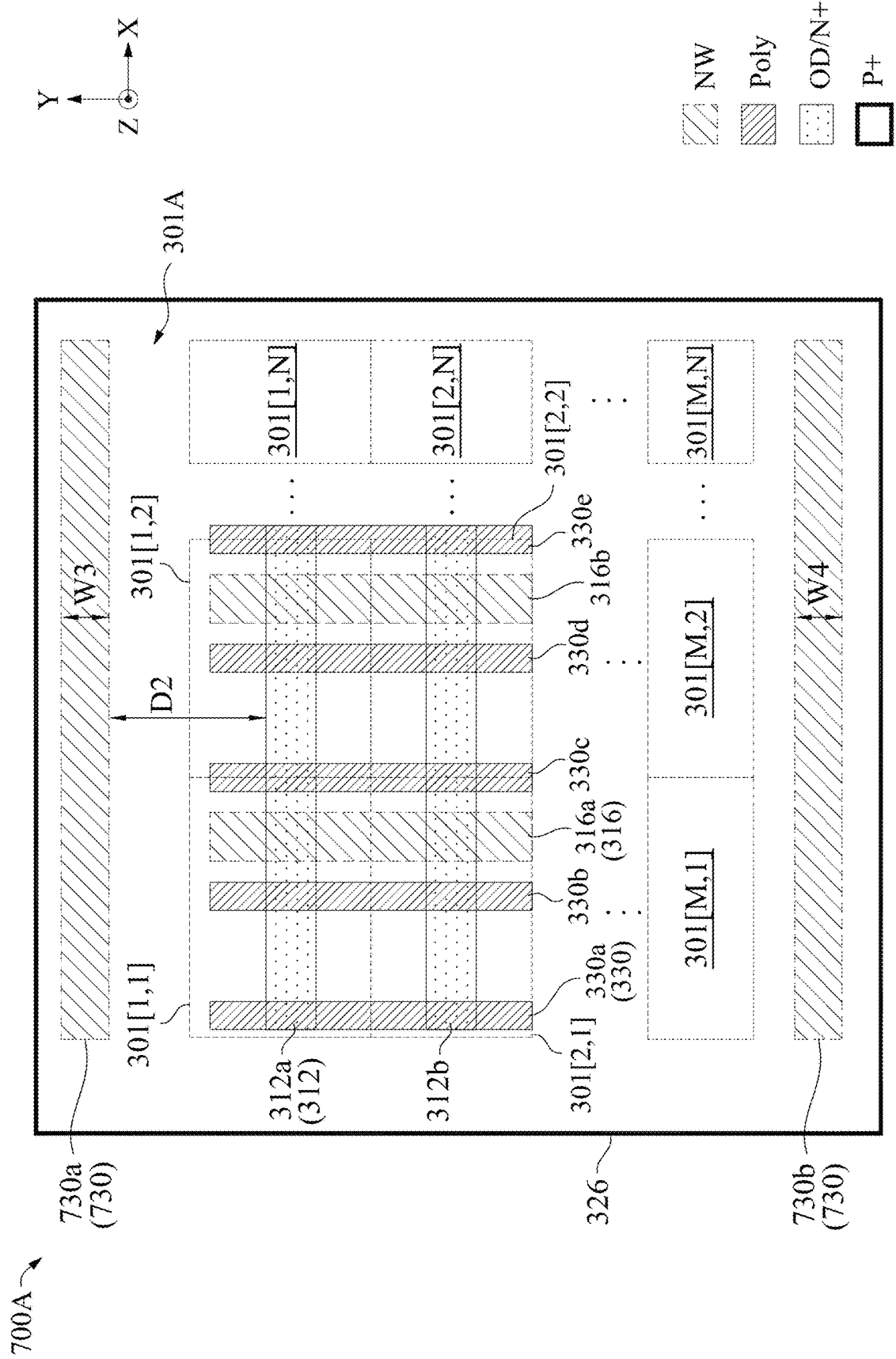
FIGS. 7A-7C are corresponding diagrams of corresponding layout designs, in accordance with some embodiments.

FIG. 7A is a diagram of a layout design 700A, in accordance with some embodiments.

Layout design 700A is a layout diagram of integrated circuit 200A or equivalent circuit 200B. Layout design 700A is usable to manufacture integrated circuit 200A or equivalent circuit 200B. In some embodiments, FIGS. 7A-7C includes additional elements not shown in FIGS. 7A-7C.

In some embodiments, the cross-sectional view of integrated circuit 200A or equivalent circuit 200B corresponds to at least layout design 700A as intersected by plane A-A'.

Layout design 700A is a layout diagram of snapback device array 300A of FIG. 3A. Layout design 700A is usable to manufacture snapback device array 300A of FIG. 3A.

Layout design 700A is a variation of layout design 300B (FIG. 3B), and therefore similar detailed description is omitted. In comparison with layout design 300B of FIG. 3B, layout design 700A further includes a set of well layout patterns 730. Set well layout pattern 730 includes at least well layout pattern 730a or well layout pattern 730b. At least well layout pattern 730a or 730b is similar to well layout pattern 316a or 316b, and similar detailed description is therefore omitted.

Well layout pattern 730a or 730b each extend in the first direction X. Each of the well layout patterns of the set of well layout patterns 730 is separated from an adjacent well layout pattern of the set of well layout patterns 730 in the second direction Y. Well layout pattern 730a has a width W3 extending in the second direction Y, and well layout pattern 730b has a width W4 extending in the second direction Y. In some embodiments, width W3 is equal to width W4. In some embodiments, width W3 is different from width W4.

Well layout pattern 730a is separated from active region layout pattern 312a in the second direction Y by a distance D2. Well layout pattern 730b is separated from an active region layout pattern (not shown) in row M of snapback device layout array 301 in the second direction Y by a distance D2 (no shown). In some embodiments, at least width W3 or width W4 is equal to distance D2. In some embodiments, at least width W3 or width W4 is different from distance D2.

At least well layout pattern 730a or 730b is usable to manufacture a corresponding N-well similar to N-well 506. In some embodiments, at least well layout pattern 730a or 730b is usable to manufacture a corresponding N-well (not shown) in snapback device array layout 301 and is positioned in a similar position as that shown in layout designs 700A-700C.

At least well layout pattern 730a or 730b is positioned outside of snapback device layout array 301. At least well layout pattern 730a or 730b is positioned between snapback device layout array 301 and well layout pattern 326. In some embodiments, a length of at least well layout pattern 730a or 730b in the first direction X is the same as a length of snapback device array layout 301 in the first direction X. In some embodiments, a length of at least well layout pattern 730a or 730b in the first direction X is different from the length of snapback device array layout 301 in the first direction X.

In some embodiments, by positioning well layout pattern 730a between well layout pattern 326 and active region 312a, and positioning well layout pattern 730b between well layout pattern 326 and the active region (not shown) in row M of snapback device layout array 301, layout designs 700A-700C are useable to manufacture corresponding integrated circuits, similar to integrated circuit 300A having additional N-wells (not shown), similar to N-well 316a or 316b, thereby further increasing the base resistance Rb between P-well tap 216 and each of the drains of transistor 260 in array of snapback devise 301A'. By increasing the base resistance Rb results in a reduction in the trigger voltage Vth of integrated circuit manufactured by layout designs 700A-700C during an ESD event than when additional N-wells are not included.

The set of well layout patterns 730 are positioned on the third level. Other configurations, levels or quantities of patterns in the set of well layout patterns 730 are within the scope of the present disclosure. For example, in some embodiments, layout design 700A does not include well layout pattern 730a or 730b.

Figure 7B:
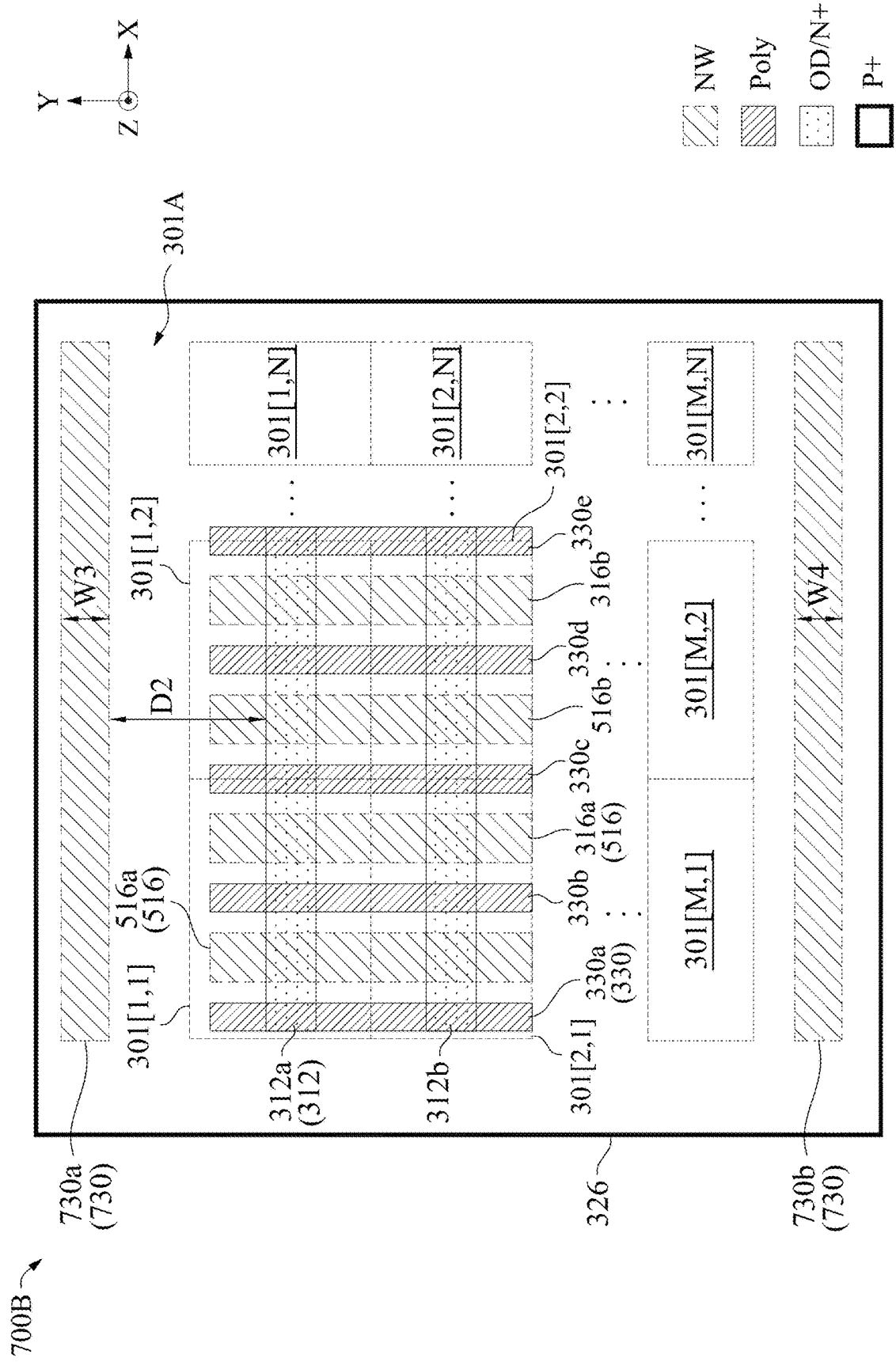
Figure 7C:
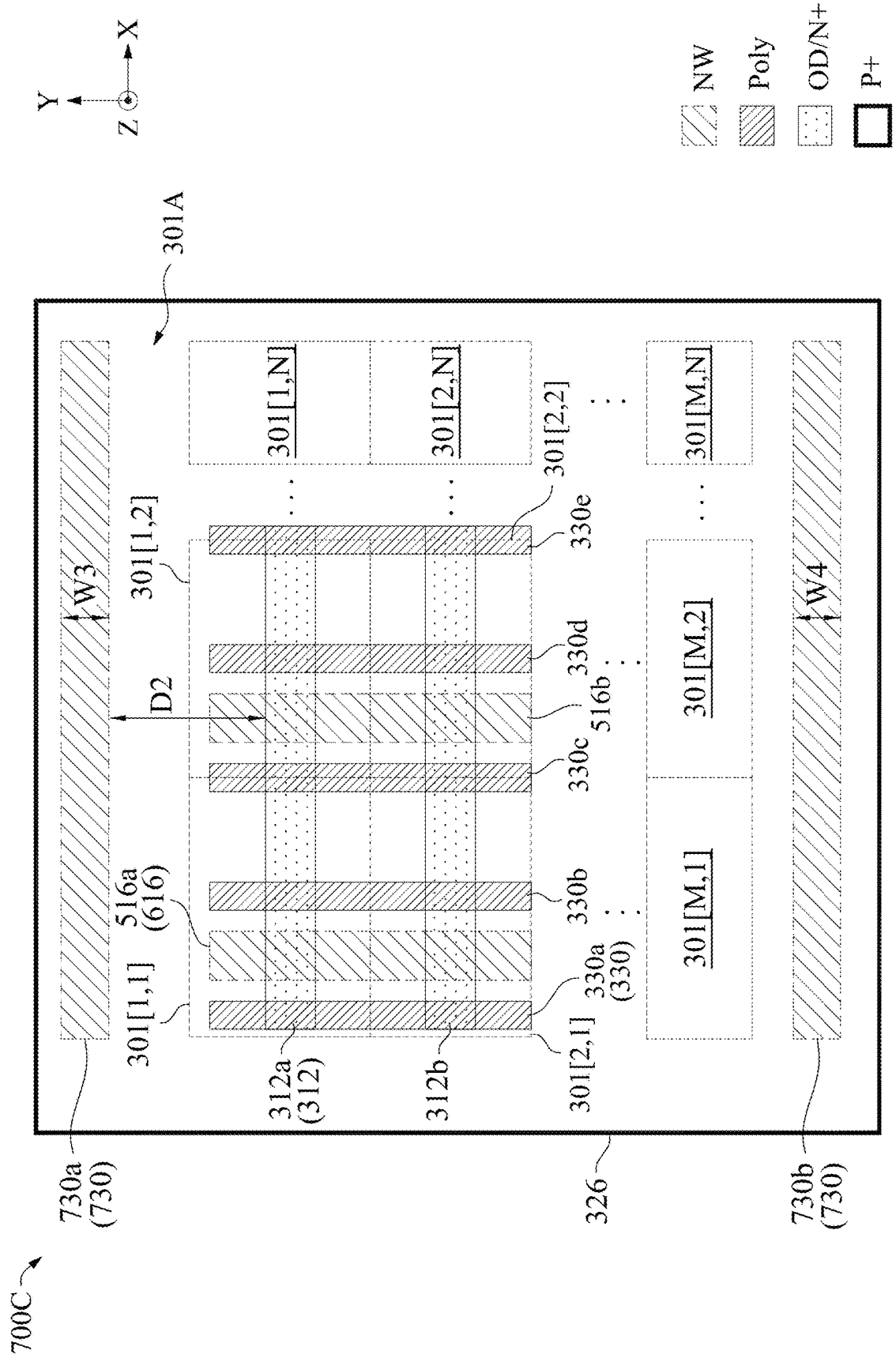

FIGS. 7B-7C are diagrams of corresponding layout designs 700B-700C, in accordance with some embodiments.

At least layout design 700B or 700C is a layout diagram of integrated circuit 200A or equivalent circuit 200B. At least layout design 700B or 700C is usable to manufacture integrated circuit 200A or equivalent circuit 200B.

At least layout design 700B or 700C is a layout diagram of snapback device array 300A of FIG. 3A. At least layout design 700B or 700C is usable to manufacture snapback device array 300A of FIG. 3A.

FIG. 7B is a diagram of a corresponding layout design 700B, in accordance with some embodiments.

In some embodiments, the cross-sectional view of integrated circuit 500A or equivalent circuit 500B corresponds to at least layout design 700B as intersected by plane B-B'.

Layout design 700B is a variation of layout design 500C (FIG. 5C) and layout design 700A (FIG. 7A), and therefore similar detailed description is omitted. For example, layout design 700B illustrates at least an embodiment where well layout patterns 730a and 730b are added to layout design 500C of FIG. 5C, similar detailed description is omitted. In other words, layout design 700B includes well layout patterns 730a and 730b of FIG. 7A added to layout design 500C of FIG. 5C.

FIG. 7C is a diagram of a corresponding layout design 700C, in accordance with some embodiments.

In some embodiments, the cross-sectional view of integrated circuit 600A or equivalent circuit 600B corresponds to at least layout design 700C as intersected by plane C-C'.

Layout design 700C is a variation of layout design 600C (FIG. 6C) and layout design 700A (FIG. 7A), and therefore similar detailed description is omitted. For example, layout design 700C illustrates at least an embodiment where well layout patterns 730a and 730b are added to layout design 600C of FIG. 6C, similar detailed description is omitted. In other words, layout design 700C includes well layout patterns 730a and 730b of FIG. 7A added to layout design 600C of FIG. 6C.

For at least reasons similar as described above for FIG. 7A, in some embodiments, by positioning well layout pattern 730a between well layout pattern 326 and active region 312a, and positioning well layout pattern 730b between well layout pattern 326 and the active region (not shown) in row M of snapback device layout array 301, layout designs 700B and 700C are useable to manufacture a corresponding integrated circuit with increased base resistance Rb between P-well tap 216 and each of the drains of transistor 260 in array of snapback device 301A', and thus has similar advantages to those described above for FIG. 7A, and are not repeated for brevity.

Other configurations, levels or quantities of patterns in at least layout design 700B or 700C are within the scope of the present disclosure. For example, in some embodiments, at least layout design 700B or 700C does not include well layout pattern 730a or 730b.

Figure 8A:
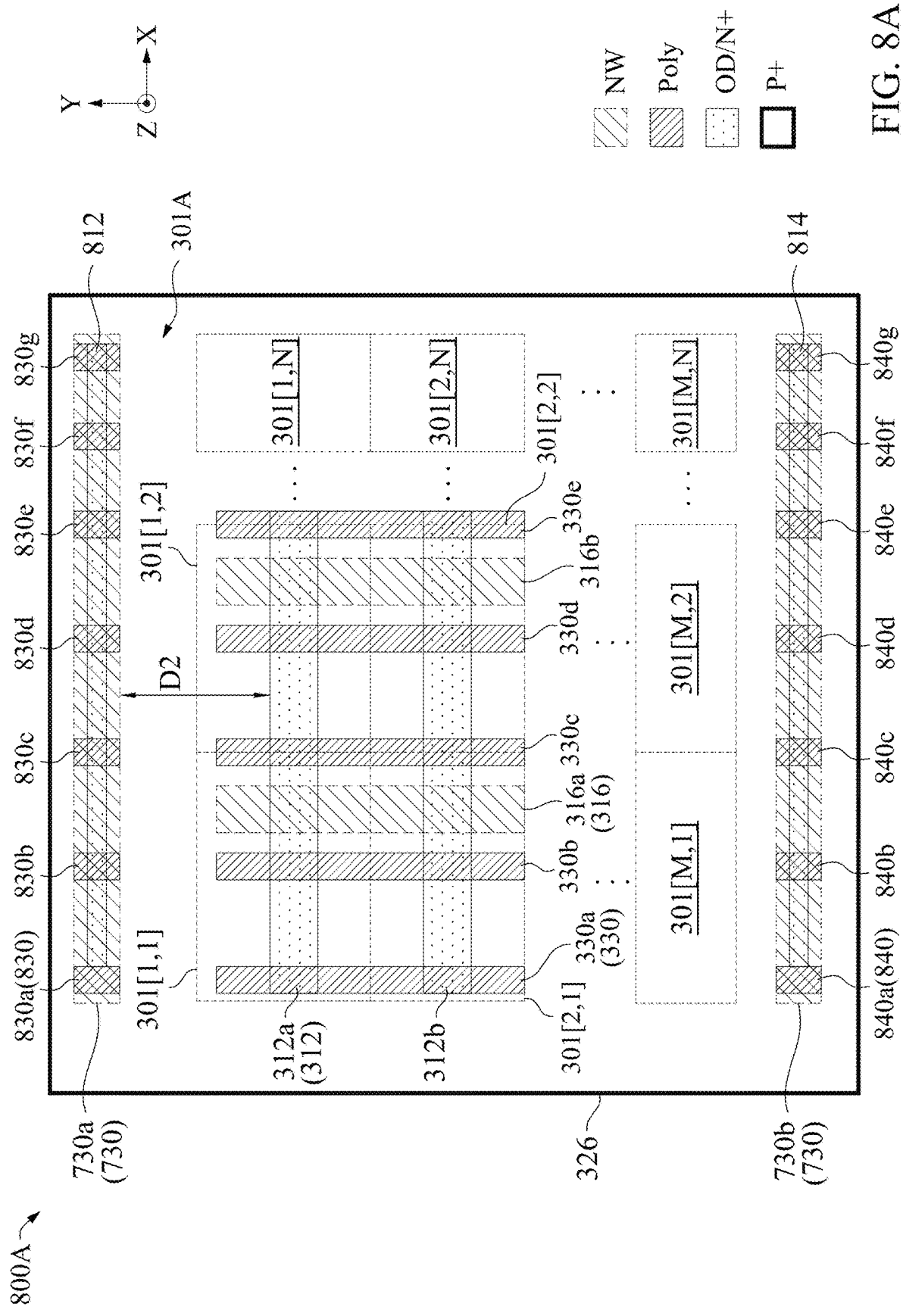
FIGS. 8A-8C are corresponding diagrams of corresponding layout designs, in accordance with some embodiments.

FIG. 8A is a diagram of a layout design 800A, in accordance with some embodiments.

Layout design 800A is a layout diagram of integrated circuit 200A or equivalent circuit 200B. Layout design 800A is usable to manufacture integrated circuit 200A or equivalent circuit 200B. In some embodiments, FIGS. 8A-8C includes additional elements not shown in FIGS. 8A-8C.

In some embodiments, the cross-sectional view of integrated circuit 200A or equivalent circuit 200B corresponds to at least layout design 800A as intersected by plane A-A'.

Layout design 800A is a layout diagram of snapback device array 300A of FIG. 3A. Layout design 800A is usable to manufacture snapback device array 300A of FIG. 3A.

Layout design 800A is a variation of layout design 700A (FIG. 7A), and therefore similar detailed description is omitted. In comparison with layout design 700A of FIG. 7A, layout design 800A further includes active region layout patterns 812 and 814, and set of gate layout patterns 830 and 840.

At least active layout pattern 812 or 814 is similar to corresponding active layout pattern 312a or 312b, and similar detailed description is therefore omitted. At least active layout pattern 812 or 814 extend in the second direction Y. Active region layout patterns 812 and 814 are separated from one another in the second direction Y. In some embodiments, at least active region layout patterns 812 or 814 is on corresponding well layout pattern 730a or 730b.

At least active region layout pattern 812 or 814 is positioned outside of snapback device layout array 301. At least active region layout pattern 812 or 814 is positioned between snapback device layout array 301 and well layout pattern 326.

In some embodiments, active region layout pattern 312a is usable to manufacture an active region (e.g., drain region 212 and source region 214) of a transistor similar to transistor 260 of FIGS. 2A-2B, but being a dummy transistor.

In some embodiments, at least active region layout pattern 812 or 814 is a continuous layout pattern that extends in the first direction X. In some embodiments, at least active region layout pattern 812 or 814 includes discontinuous layout patterns that extend in the first direction X.

In some embodiments, at least active region layout patterns 812 or 814 is located on the first level. Other configurations, levels or quantities of patterns in at least active region layout patterns 812 or 814 are within the scope of the present disclosure.

At least set of gate layout patterns 830 or 840 is similar to set of gate layout patterns 330, and similar detailed description is therefore omitted.

Set of gate layout patterns 830 includes at least gate layout pattern 830a, 830b, ..., 830f or 830g. Set of gate layout patterns 840 includes at least gate layout pattern 840a, 840b, ..., 840f or 840g. Set of gate layout patterns 830 and 840 each extend in the second direction Y. Each of the gate layout patterns of the set of gate layout patterns 830 or 840 is separated from a corresponding adjacent gate layout pattern in the corresponding set of gate layout patterns 830 or 840 in the first direction X by a second pitch (not labelled).

In some embodiments, at least gate layout pattern 830a, 830b, ..., 830f or 830g or at least gate layout pattern 840a, 840b, ..., 840f or 840g is usable to manufacture a gate similar to at least gate structure 230 or gate of NMOS transistor N1, but being a dummy gate structure. In some embodiments, a dummy gate structure is a nonfunctional gate structure.

In some embodiments, a number of gate layout patterns in at least the set of gate layout patterns 830 or 840 is the same as a number of gate layout patterns 330. In some embodiments, a number of gate layout patterns in at least the set of gate layout patterns 830 or 840 is different from a number of gate layout patterns 330.

The set of gate layout patterns 830 or 840 are positioned on the second level. Other configurations, levels or quantities of patterns in the set of gate layout patterns 830 or 840 are within the scope of the present disclosure.

In some embodiments, by positioning well layout pattern 730a, active region layout pattern 812 and set of gate layout patterns 830 between well layout pattern 326 and active region 312a, and positioning well layout pattern 730b, active region layout pattern 814 and set of gate layout patterns 840 between well layout pattern 326 and the active region (not shown) in row M of snapback device layout array 301, layout designs 800A-800C are useable to manufacture corresponding integrated circuits, similar to integrated circuit 300A having additional N-wells (not shown), similar to N-well 316a or 316b, thereby further increasing the base resistance Rb between P-well tap 216 and each of the drains of transistor 260 in array of snapback devise 301A'. By increasing the base resistance Rb results in a reduction in the trigger voltage Vth of integrated circuit manufactured by layout designs 800A-800C during an ESD event than when additional N-wells are not included.

Other configurations, levels or quantities of patterns in at least layout design 800A are within the scope of the present disclosure. For example, in some embodiments, layout design 800A does not include at least well layout pattern 830a or 830b, active region layout pattern 812 or 814, or set of gate layout patterns 830 or 840.

Figure 8B:
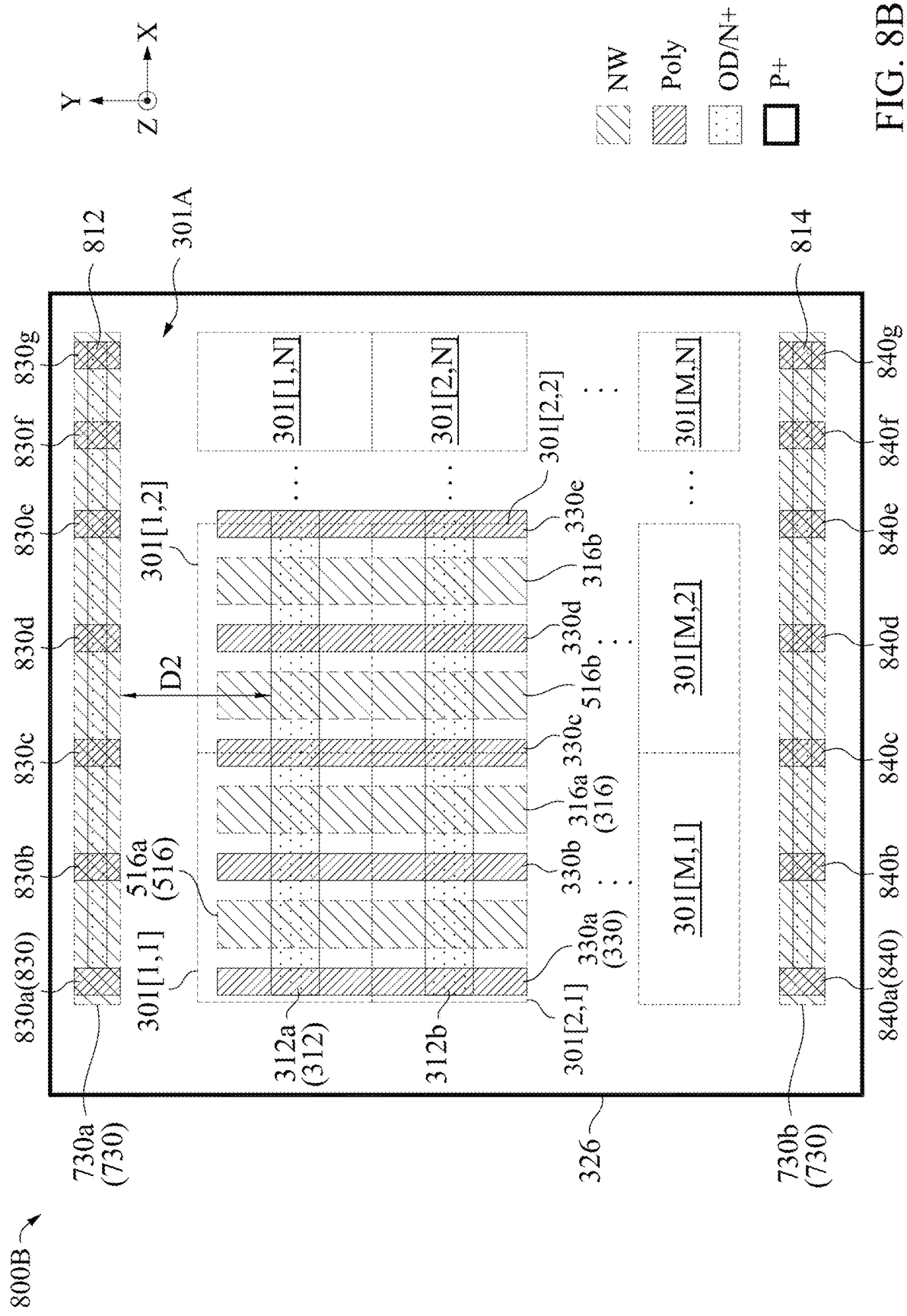
Figure 8C:
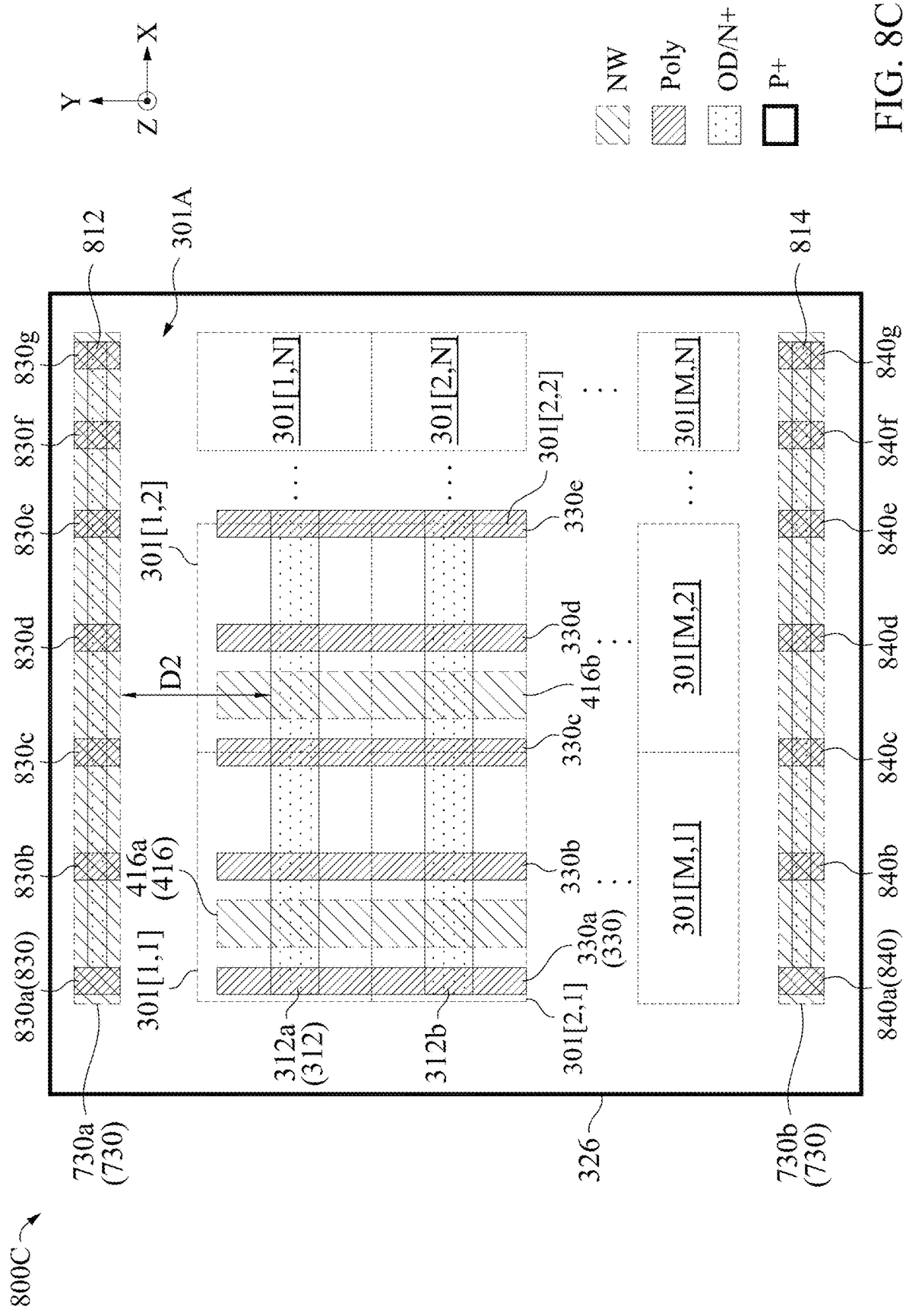

FIGS. 8B-8C are diagrams of corresponding layout designs 800B-800C, in accordance with some embodiments.

At least layout design 800B or 800C is a layout diagram of integrated circuit 200A or equivalent circuit 200B. At least layout design 800B or 800C is usable to manufacture integrated circuit 200A or equivalent circuit 200B.

At least layout design 800B or 800C is a layout diagram of snapback device array 300A of FIG. 3A. At least layout design 800B or 800C is usable to manufacture snapback device array 300A of FIG. 3A.

FIG. 8B is a diagram of a corresponding layout design 800B, in accordance with some embodiments.

In some embodiments, the cross-sectional view of integrated circuit 500A or equivalent circuit 500B corresponds to at least layout design 800B as intersected by plane B-B'.

Layout design 800B is a variation of layout design 700B (FIG. 7B) and layout design 800A (FIG. 8A), and therefore similar detailed description is omitted. For example, layout design 800B illustrates at least an embodiment where active region layout patterns 812 and 814, and set of gate layout patterns 830 and 840 are added to layout design 700B of FIG. 7B, and similar detailed description is omitted. In other words, layout design 800B includes active region layout patterns 812 and 814, and set of gate layout patterns 830 and 840 of FIG. 8A added to layout design 700B of FIG. 7B.

FIG. 8C is a diagram of a corresponding layout design 800C, in accordance with some embodiments.

In some embodiments, the cross-sectional view of integrated circuit 600A or equivalent circuit 600B corresponds to at least layout design 800C as intersected by plane C-C'.

Layout design 800C is a variation of layout design 700C (FIG. 7C) and layout design 800A (FIG. 8A), and therefore similar detailed description is omitted. For example, layout design 800C illustrates at least an embodiment where active region layout patterns 812 and 814, and set of gate layout patterns 830 and 840 are added to layout design 700C of FIG. 7C, and similar detailed description is omitted. In other words, layout design 800C includes active region layout patterns 812 and 814, and set of gate layout patterns 830 and 840 of FIG. 8A added to layout design 700C of FIG. 7C.

For at least reasons similar to that described above for FIG. 8A, in some embodiments, by positioning well layout pattern 730a, active region layout pattern 812 and set of gate layout patterns 830 between well layout pattern 326 and active region 312a, and positioning well layout pattern 730b, active region layout pattern 814 and set of gate layout patterns 840 between well layout pattern 326 and the active region (not shown) in row M of snapback device layout array 301, layout designs 800B and 800C are useable to manufacture a corresponding integrated circuit with increased base resistance Rb between P-well tap 216 and each of the drains of transistor 260 in array of snapback device 301A', and thus has similar advantages to those described above for FIG. 8A, and are not repeated for brevity.

Other configurations, levels or quantities of patterns in at least layout design 800B or 800C are within the scope of the present disclosure. For example, in some embodiments, at least layout design 800B or 800C does not include at least well layout pattern 830a or 830b, active region layout pattern 812 or 814, or set of gate layout patterns 830 or 840.

Figure 9:
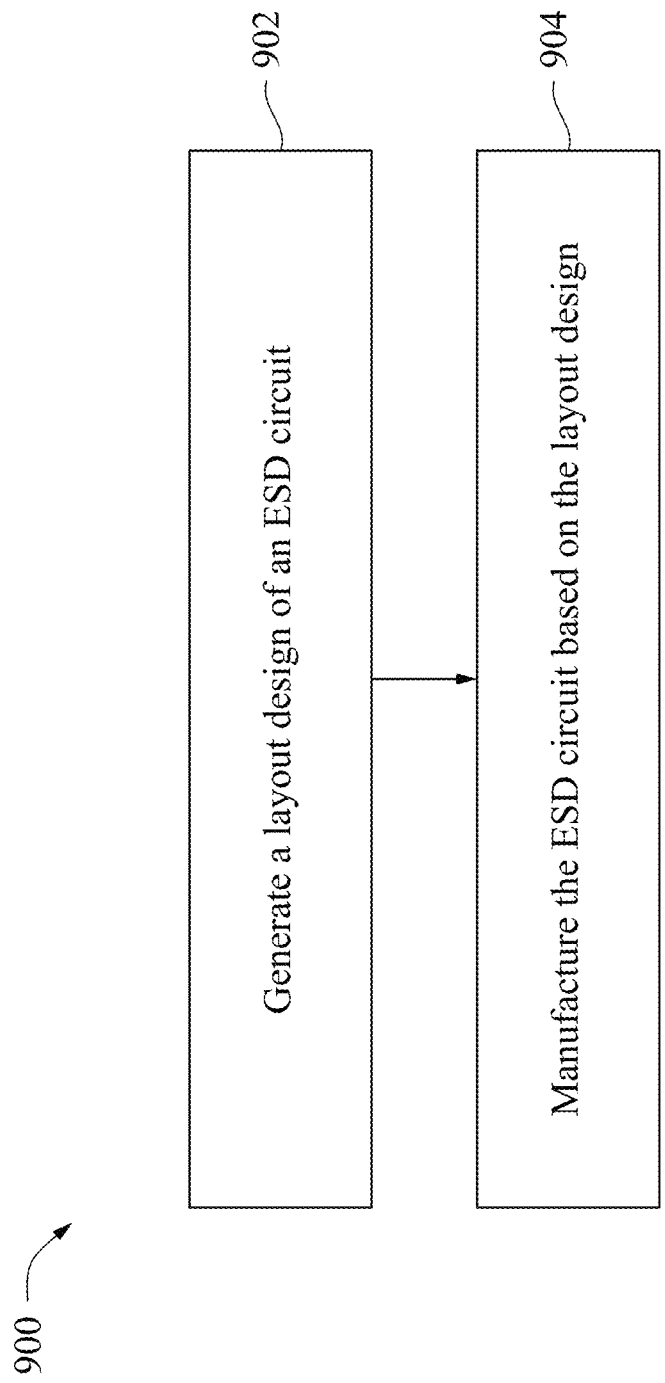
FIG. 9 is a flowchart of a method of forming or manufacturing an ESD circuit in accordance with some embodiments.

FIG. 9 is a flowchart of a method 900 of forming or manufacturing an ESD circuit in accordance with some embodiments. It is understood that additional operations may be performed before, during, and/or after the method 900 depicted in FIG. 9, and that some other operations may only be briefly described herein. In some embodiments, the method 900 is usable to form ESD circuits, such as integrated circuit 100A-100B, 200A, 400A, 500A, 600A (FIGS. 1A-1B, 2A, 4A, 5A or 6A), snapback device array 300A (FIG. 3A), or equivalent circuit 200B (FIG. 2B), 500B (FIG. 5B) or 600B (FIG. 6B). In some embodiments, the method 900 is usable to form ESD circuits having similar structural relationships as one or more of layout designs 300B, 400B, 500C, 600C, 700A-700C or 800A-800C (FIGS. 3B, 4B, 5C, 6C, 7A-7C or 8A-8C). In some embodiments, other order of operations of method 900 is within the scope of the present disclosure. Method 900 includes exemplary operations, but the operations are not necessarily performed in the order shown. Operations may be added, replaced, changed order, and/or eliminated as appropriate, in accordance with the spirit and scope of disclosed embodiments.

In operation 902 of method 900, a layout design of an ESD circuit is generated. Operation 902 is performed by a processing device (e.g., processor 1202 (FIG. 12)) configured to execute instructions for generating a layout design. In some embodiments, the layout design is a graphic database system (GDSII) file format.

In some embodiments, the ESD circuit of method 900 includes at least integrated circuit 100A-100B, 200A, 400A, 500A, 600A (FIGS. 1A-1B, 2A, 4A, 5A or 6A), snapback device array 300A (FIG. 3A), or equivalent circuit 200B (FIG. 2B), 500B (FIG. 5B) or 600B (FIG. 6B). In some embodiments, the layout design of method 900 includes at least layout design 300B, 400B, 5C, 600C, 700A-700C or 800A-800C (FIGS. 3B, 4B, 5C, 6C, 7A-7C or 8A-8C).

In operation 904 of method 900, the ESD circuit is manufactured based on layout design. In some embodiments, operation 904 of method 900 comprises manufacturing at least one mask based on the layout design, and manufacturing the ESD circuit based on the at least one mask.

Figure 10A:
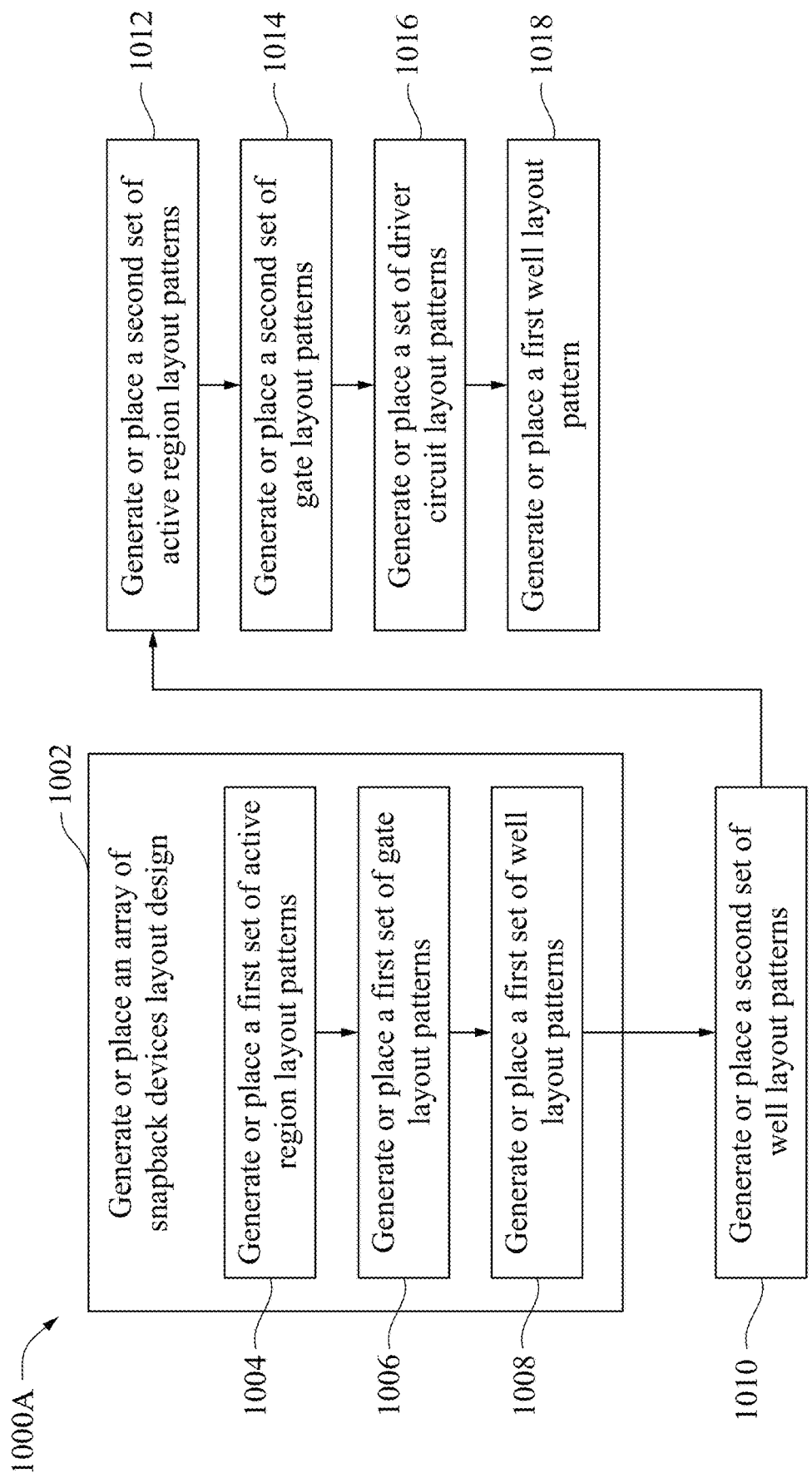
FIG. 10A is a functional flow chart of at least a portion of an integrated circuit design and manufacturing flow, in accordance with some embodiments.

FIG. 10A is a functional flow chart of at least a portion of an integrated circuit design and manufacturing flow 1000A, in accordance with some embodiments. It is understood that additional operations may be performed before, during, and/or after the method 1000A depicted in FIG. 10A, and that some other processes may only be briefly described herein. In some embodiments, other order of operations of method 1000A is within the scope of the present disclosure. Method 1000A includes exemplary operations, but the operations are not necessarily performed in the order shown. Operations may be added, replaced, changed order, and/or eliminated as appropriate, in accordance with the spirit and scope of disclosed embodiments.

In some embodiments, method 1000A is an embodiment of operation 902 of method 900. In some embodiments, the method 1000A is usable to at least generate or place one or more layout patterns of layout design 300B, 400B, 500C, 600C, 700A-700C or 800A-800C (FIGS. 3B, 4B, 5C, 6C, 7A-7C or 8A-8C) of an integrated circuit, such as integrated circuit 100A-100B, 200A, 400A, 500A, 600A (FIGS. 1A-1B, 2A, 4A, 5A or 6A), snapback device array 300A (FIG. 3A), or equivalent circuit 200B (FIG. 2B), 500B (FIG. 5B) or 600B (FIG. 6B).

In operation 1002 of method 1000A, an array of snapback devices layout designs is generated or placed. In some embodiments, the array of snapback devices layout design of method 1000A includes at least layout design 300B, 400B, 500C, 600C, 700A-700C or 800A-800C. In some embodiments, the array of snapback devices layout design of method 1000A includes at least a layout design of layout designs 301 [1,1], 301 [1,2], . . . , 301 [2,2], . . . , 301 [M,N]. In some embodiments, operation 1002 includes at least operation 1004, 1006 or 1008.

In operation 1004 of method 1000A, a first set of active region layout patterns is generated or placed on a first level of a layout design. In some embodiments, the layout design of method 1000A includes at least layout design. In some embodiments, the first level of method 1000A corresponds to the OD level. In some embodiments, the first level of method 1000A corresponds to the first level described in the specification. In some embodiments, the first set of active region layout patterns of method 1000A includes at least one or more active region layout patterns of at least the set of active region layout patterns 312.

In operation 1006 of method 1000A, a first set of gate layout patterns is generated or placed on a second level of the layout design. In some embodiments, the second level of method 1000A corresponds to the POLY level. In some embodiments, the second level of method 1000A corresponds to at least one of the levels described in the specification. In some embodiments, the first set of gate layout patterns of method 1000A includes at least one or more gate layout patterns of at least the set of gate layout patterns 330.

In operation 1008 of method 1000A, a first set of well layout patterns is generated or placed on a third level of the layout design. In some embodiments, the third level of method 1000A corresponds to the N-well level. In some embodiments, the third level of method 1000A corresponds to at least one of the levels described in the specification. In some embodiments, the first set of well layout patterns of method 1000A includes at least one or more well layout patterns of at least the set of well layout patterns 316 or 516.

In operation 1010 of method 1000A, a second set of well layout patterns is generated or placed on the third level of the layout design. In some embodiments, the second set of well layout patterns of method 1000A includes at least one or more well layout patterns of at least the set of well layout patterns 730.

In operation 1012 of method 1000A, a second set of active region layout patterns is generated or placed on the first level of a layout design. In some embodiments, the second set of active region layout patterns of method 1000A includes at least one or more active region layout patterns of at least the set of active region layout patterns 812 or 814.

In operation 1014 of method 1000A, a second set of gate layout patterns is generated or placed on the second level of the layout design. In some embodiments, the second set of gate layout patterns of method 1000A includes at least one or more gate layout patterns of at least the set of gate layout patterns 830 or 840.

In operation 1016 of method 1000A, a set of driver circuit layout patterns is generated or placed on the layout design. In some embodiments, the set of driver circuit layout patterns of method 1000A includes at least one or more portions of well layout pattern 450. In some embodiments, the set of driver circuit layout patterns of method 1000A includes at least one or more layout designs of layout designs 301 [1,1], 301 [1,2], . . . , 301 [2,2], . . . , 301 [M,N] combined with at least a portion of well layout pattern 450.

In some embodiments, operation 1016 includes one or more operations to generate or place a single column and row entry in the array of snapback devices layout patterns 301. In some embodiments, operation 1016 comprises placing a driver circuit layout pattern in a first row of the layout design of the array of snapback ESD protection circuits, where the driver circuit layout pattern corresponds to fabricating driver circuit 440. In some embodiments, placing the driver circuit layout pattern comprises placing a third active region layout pattern of the first set of active region layout patterns in the first layout level, the third active region layout pattern extending in the first direction, and corresponding to fabricating a drain region of the driver circuit; and placing a fourth active region layout pattern of the first set of active region layout patterns in the first layout level, the fourth active region layout pattern extending in the first direction, and corresponding to fabricating a source region of the driver circuit, the driver circuit sharing the p-well of the snapback ESD protection circuit with the first snapback ESD protection circuit of the array of snapback ESD protection circuits. In some embodiments, the first active region layout pattern and the second active region layout pattern are in a second row of the layout design of the array of snapback ESD protection circuits, the second row being adjacent to the first row.

In operation 1018 of method 1000A, a first well layout pattern is generated or placed on the third level of the layout design. In some embodiments, the first well layout pattern of method 1000A includes at least a portion of well layout pattern 326.

In some embodiments, one or more of the operations of method 1000A is performed to generate or place a first layout pattern on the layout design of method 1000A, and then one or more of the operations of method 1000A is repeated to generate or place additional layout patterns on the design of method 1000A. In some embodiments, one or more of the operations of method 1000A is performed to generate or place a first layout design on the layout design of method 1000A, and then one or more of the operations of method 1000A is repeated to generate or place additional layout designs on the design of method 1000A.

Figure 12:
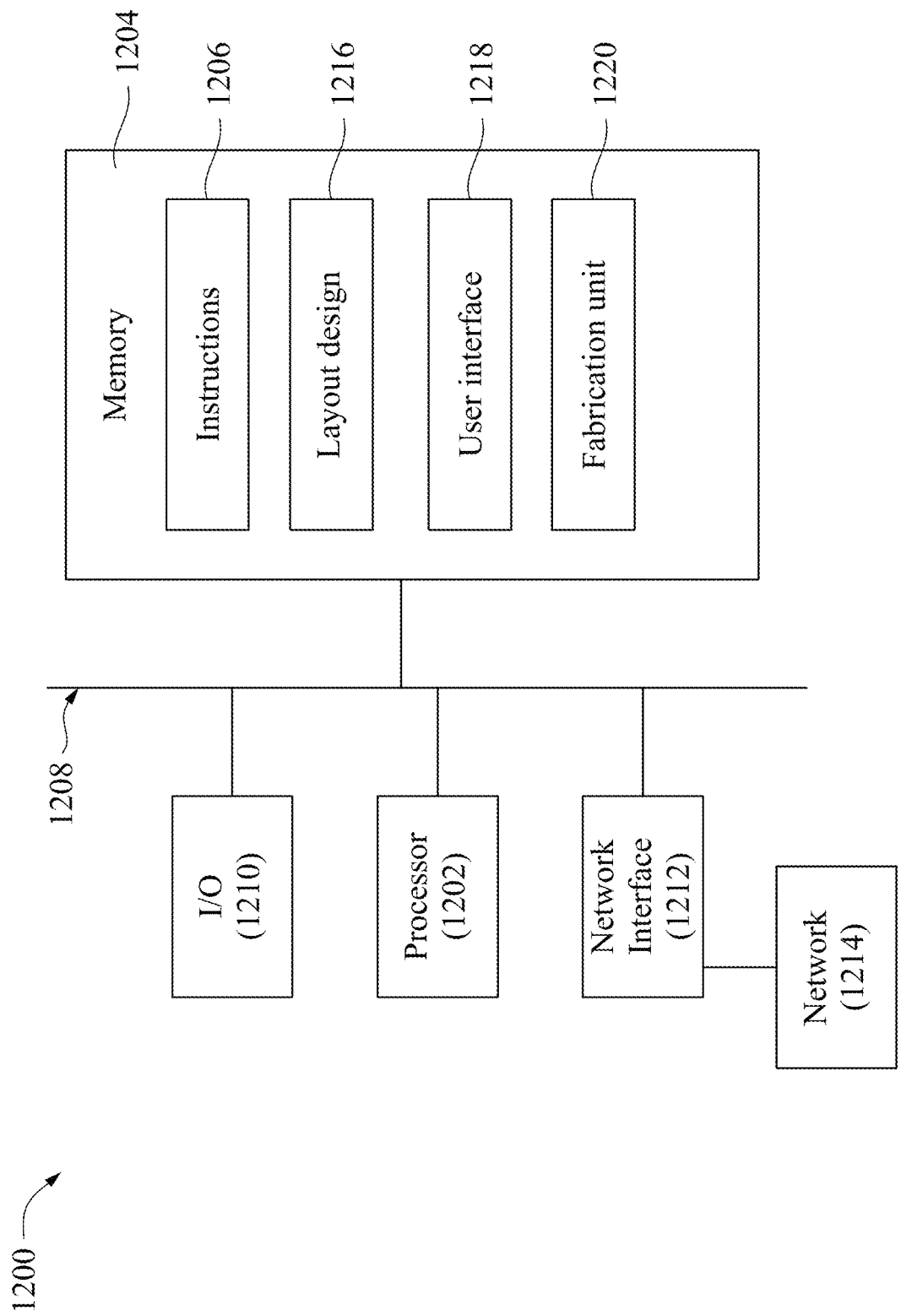
FIG. 12 is a schematic view of a system for designing an IC layout design and manufacturing an IC circuit in accordance with some embodiments.

In some embodiments, at least one or more operations of method 1000A is performed by an EDA tool, such as system 1200 of FIG. 12. In some embodiments, at least one method(s), such as method 1000A discussed above, is performed in whole or in part by at least one EDA system, including system 1200. In some embodiments, an EDA system is usable as part of a design house of an IC manufacturing system 1300 of FIG. 13.

One or more of the operations of method 1000A is performed by a processing device configured to execute instructions for manufacturing the integrated circuit of method 1000A. In some embodiments, one or more operations of method 1000A is performed using a same processing device as that used in a different one or more operations of method 1000A. In some embodiments, a different processing device is used to perform one or more operations of method 1000A from that used to perform a different one or more operations of method 1000A.

Figure 10B:
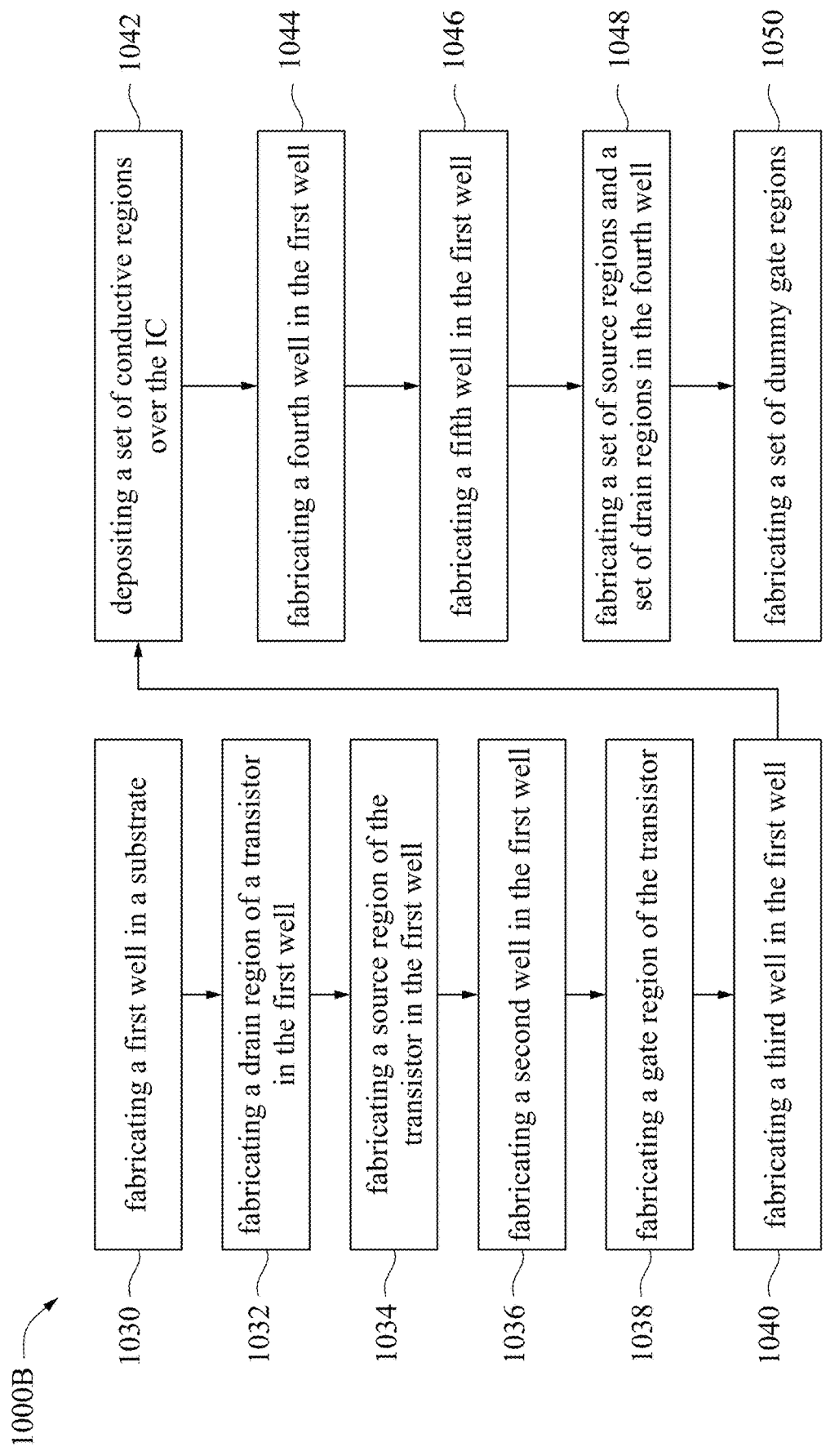
FIG. 10B is a functional flow chart of a method of manufacturing an integrated circuit device, in accordance with some embodiments.

FIG. 10B is a functional flow chart of a method of manufacturing an integrated circuit (IC) device, in accordance with some embodiments. It is understood that additional operations may be performed before, during, and/or after the method 1000B depicted in FIG. 10B, and that some other processes may only be briefly described herein. In some embodiments, other order of operations of method 1000B is within the scope of the present disclosure. Method 1000B includes exemplary operations, but the operations are not necessarily performed in the order shown. Operations may be added, replaced, changed order, and/or eliminated as appropriate, in accordance with the spirit and scope of disclosed embodiments.

In some embodiments, method 1000B is an embodiment of operation 904 of method 900. In some embodiments, the method 1000B is usable to manufacture or fabricate at least integrated circuit 100A-100B, 200A, 400A, 500A, 600A (FIGS. 1A-1B, 2A, 4A, 5A or 6A), snapback device array 300A (FIG. 3A), or equivalent circuit 200B (FIG. 2B), 500B (FIG. 5B) or 600B (FIG. 6B) or an integrated circuit with similar features as at least layout design 300B, 400B, 500C, 600C, 700A-700C or 800A-800C (FIGS. 3B, 4B, 5C, 6C, 7A-7C or 8A-8C).

In operation 1030 of method 1000B, a first well is fabricated in a substrate. In some embodiments, the first well extends in the second direction Y, and has the first dopant type. In some embodiments, the first well of method 1000B includes at least P-well 204. In some embodiments, the substrate of method 1000B includes at least substrate 202.

In some embodiments, the first well comprises p-type dopants. In some embodiments, the p-dopants include boron, aluminum or other suitable p-type dopants. In some embodiments, the first well comprises an epi-layer grown over substrate 202. In some embodiments, the epi-layer is doped by adding dopants during the epitaxial process. In some embodiments, the epi-layer is doped by ion implantation after the epi-layer is formed. In some embodiments, the first well is formed by doping substrate 202. In some embodiments, the doping is performed by ion implantation. In some embodiments, the first well has a dopant concentration ranging from $1\times10^{12}$ atoms/cm$^3$ to $1\times10^{14}$ atoms/cm$^3$.

In operation 1032 of method 1000B, a drain region of a transistor is fabricated in the first well. In some embodiments, the drain region extends in the second direction Y, and has the second dopant type. In some embodiments, the drain region of method 1000B includes at least drain region 212, the drain of transistor 260 or the drain of NMOS transistor N1. In some embodiments, the transistor of method 1000B includes at least transistor 260 or NMOS transistor N1.

In operation 1034 of method 1000B, a source region of the transistor is fabricated in the first well. In some embodiments, the source region extends in the second direction Y, has the second dopant type, and is separated from the drain region in the first direction X. In some embodiments, the source region of method 1000B includes at least source region 214, the source of transistor 260 or the source of NMOS transistor N1.

In some embodiments, at least operation 1032 or 1034 includes the formation of source/drain features formed in the substrate. In some embodiments, the formation of the source/drain features includes, a portion of the substrate is removed to form recesses at an edge of each spacer 220a, 220b, and a filling process is then performed by filling the recesses in the substrate. In some embodiments, the recesses are etched, for example, a wet etching or a dry etching, after removal of a pad oxide layer or a sacrificial oxide layer. In some embodiments, the etch process is performed to remove a top surface portion of the active region adjacent to an isolation region, such as STI region 208 or 210. In some embodiments, the filling process is performed by an epitaxy or epitaxial (epi) process. In some embodiments, the recesses are filled using a growth process which is concurrent with an etch process where a growth rate of the growth process is greater than an etch rate of the etch process. In some embodiments, the recesses are filled using a combination of growth process and etch process. For example, a layer of material is grown in the recess and then the grown material is subjected to an etch process to remove a portion of the material. Then a subsequent growth process is performed on the etched material until a desired thickness of the material in the recess is achieved. In some embodiments, the growth process continues until a top surface of the material is above the top surface of the substrate. In some embodiments, the growth process is continued until the top surface of the material is coplanar with the top surface of the substrate. In some embodiments, a portion of well 204 is removed by an isotropic or an anisotropic etch process. The etch process selectively etches well 204 without etching gate structure 230 and spacers 220. In some embodiments, the etch process is performed using a reactive ion etch (RIE), wet etching, or other suitable techniques. In some embodiments, a semiconductor material is deposited in the recesses to form the source/drain features. In some embodiments, an epi process is performed to deposit the semiconductor material in the recesses. In some embodiments, the epi process includes a selective epitaxy growth (SEG) process, CVD process, molecular beam epitaxy (MBE), other suitable processes, and/or combination thereof. The epi process uses gaseous and/or liquid precursors, which interacts with a composition of substrate 202. In some embodiments, the source/drain features include epitaxially grown silicon (epi Si), silicon carbide, or silicon germanium. Source/drain features of the IC device associated with gate structure 230 are in-situ doped or undoped during the epi process in some instances. When source/drain features are undoped during the epi process, source/drain features are doped during a subsequent process in some instances. The subsequent doping process is achieved by an ion implantation, plasma immersion ion implantation, gas and/or solid source diffusion, other suitable processes, and/or combination thereof. In some embodiments, source/drain features are further exposed to annealing processes after forming source/drain features and/or after the subsequent doping process.

In operation 1036 of method 1000B, a second well is fabricated in the first well. In some embodiments, the second well extends in the second direction Y, and has the second dopant type. In some embodiments, the second well is adjacent to one of a portion of the drain region or a portion of the source region. In some embodiments, the second well of method 1000B includes at least N-well 206 or 506. In some embodiments, multiple wells are formed prior to the formation of the source region and the drain region. In some embodiments, the second well of method 1000B is formed prior to formation of the source region and the drain region of method 1000B. For example, in some embodiments, operation 1036 is performed prior to operations 1032 and 1034. In some embodiments, operation 1036 is performed after operation 1030, and then operations 1032 and 1034 are performed after operation 1036.

In some embodiments, at least the second well, the fourth well (described below) or the fifth well (described below) include n-type dopants. In some embodiments, the n-type dopants include phosphorus, arsenic or other suitable n-type dopants. In some embodiments, the n-type dopant concentration ranges from about $1 \times 10^{12}$ atoms/cm$^2$ to about $1 \times 10^{14}$ atoms/cm$^2$. In some embodiments, at least the second well, the fourth well or the fifth well is formed by ion implantation. The power of the ion implantation ranges from about 1500 k electron volts (eV) to about 8000 k eV. In some embodiments, a depth of double deep well 120 ranges from about 5 microns (μm) to about 10 μm. In some embodiments, at least the second well, the fourth well or the fifth well is epitaxially grown. In some embodiments, at least the second well, the fourth well or the fifth well comprises an epi-layer grown over the surface. In some embodiments, the epi-layer is doped by adding dopants during the epitaxial process. In some embodiments, the epi-layer is doped by ion implantation after the epi-layer is formed, and has the dopant concentration described above.

In operation 1038 of method 1000B, a gate region of the transistor is fabricated. In some embodiments, the gate region is between the drain region and the source region. In some embodiments, the gate region is over the first well and the substrate. In some embodiments, the gate region of method 1000B includes at least gate structure 230, the gate of transistor 260 or NMOS transistor N1.

In some embodiments, at least fabricating the gate regions of operation 1038 or fabricating the dummy gate regions of operation 1050 includes performing one or more deposition processes to form one or more dielectric material layers. In some embodiments, a deposition process includes a chemical vapor deposition (CVD), a plasma enhanced CVD (PECVD), an atomic layer deposition (ALD), or other process suitable for depositing one or more material layers. In some embodiments, fabricating the gate regions includes performing one or more deposition processes to form one or more conductive material layers. In some embodiments, fabricating the gate regions includes forming gate electrodes or dummy gate electrodes. In some embodiments, fabricating the gate regions includes depositing or growing at least one dielectric layer, e.g., gate dielectric 222. In some embodiments, gate regions are formed using a doped or non-doped polycrystalline silicon (or polysilicon). In some embodiments, the gate regions include a metal, such as Al, Cu, W, Ti, Ta, TiN, TaN, NiSi, CoSi, other suitable conductive materials, or combinations thereof.

In operation 1040 of method 1000B, a third well is fabricated in the first well. In some embodiments, the third well has the first dopant type, extends in the second direction Y. In some embodiments, the third well surrounds the second well, the drain region, the source region, and the gate region. In some embodiments, the third well of method 1000B includes at least P-well tap 216. In some embodiments, the fabrication of the third well is similar to at least a portion of operation 1030, and similar description is therefore omitted.

In operation 1042 of method 1000B, a set of conductive regions is deposited over the IC. In some embodiments, operation 1042 includes at least depositing a first conductive region over the drain region thereby forming a drain contact of transistor 260 or NMOS transistor N1, depositing a second conductive region over the source region thereby forming a source contact of transistor 260 or NMOS transistor N1, depositing a third conductive region over the third well thereby forming a tap contact of transistor 260 or NMOS transistor N1, depositing a fourth conductive region over the drain contact thereby coupling the drain contact to the IO pad region 108, or depositing a fifth conductive region over the source contact and the tap contact thereby coupling the source contact, the tap contact and a reference voltage supply terminal 106 together. In some embodiments, the fourth conductive region of method 1000B is conductive region 270. In some embodiments, the fifth conductive region of method 1000B is conductive region 272.

In some embodiments, operation 1042 further includes depositing a sixth conductive region over the gate region thereby forming a gate contact of transistor 260 or NMOS transistor N1.

In some embodiments, the set of conductive regions of method 1000B are formed using a combination of photolithography and material removal processes to form openings in an insulating layer (not shown) over the substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

In operation 1044 of method 1000B, a fourth well is fabricated in the first well. In some embodiments, the fourth well has the second dopant type, extends in the second direction Y, and is separated from the second well in the first direction X. In some embodiments, the fourth well is adjacent to the other of the portion of the source region or the portion of the drain region. In some embodiments, the fourth well of method 1000B includes at least N-well 206 or 506.

In operation 1046 of method 1000B, a fifth well is fabricated in the first well. In some embodiments, the fifth well has the second dopant type, extends in the first direction X, and is separated from the second well in the second direction Y. In some embodiments, the fifth well is between a side of the third well and the second well. In some embodiments, the fifth well is a corresponding well manufactured by at least well layout pattern 730a or 730b. In some embodiments, the fifth well is similar to at least N-well 206 or 506, and similar detailed description is omitted.

In operation 1048 of method 1000B, a set of source regions and a set of drain regions are fabricated in the fourth well. In some embodiments, the set of source regions and the set of drain regions have the second dopant type, and extend in the second direction Y. In some embodiments, the set of source regions of method 1000B is a corresponding source region manufactured by at least active region layout pattern 812 or 814. In some embodiments, the set of drain regions of method 1000B is a corresponding drain region manufactured by at least active region layout pattern 812 or 814. In some embodiments, the drain region is similar to the drain of transistor 260, and similar detailed description is omitted. In some embodiments, the source region is similar to the source of transistor 260, and similar detailed description is omitted.

In operation 1050 of method 1000B, a set of dummy gate regions is fabricated between the set of source regions and the set of drain regions. In some embodiments, the set of dummy gate regions extends in the second direction Y, and are separated from each other in the first direction X. In some embodiments, the set of source regions, the set of drain regions and the set of dummy gate regions correspond to a set of dummy transistors. In some embodiments, the set of dummy gate regions of method 1000B is a corresponding dummy gate region manufactured by at least set of gate layout patterns 830 or 840. In some embodiments, the dummy gate region is similar to the gate of transistor 260, and similar detailed description is omitted.

In some embodiments, at least one or more operations of method 1000B is performed to fabricate NMOS transistor N1, and the operations are similar to that described above, and similar detailed description is therefore omitted. In some embodiments, one or more of the operations of method 1000B is performed to manufacture an integrated circuit similar to integrated circuit 100A-100B, 200A, 400A, 500A, 600A (FIGS. 1A-1B, 2A, 4A, 5A or 6A), snapback device array 300A (FIG. 3A), or equivalent circuit 200B (FIG. 2B), 500B (FIG. 5B) or 600B (FIG. 6B) or an integrated circuit with similar features as at least layout design 300B, 400B, 500C, 600C, 700A-700C or 800A-800C (FIGS. 3B, 4B, 5C, 6C, 7A-7C or 8A-8C), and then one or more of the operations of method 1000B is repeated to manufacture additional integrated circuits similar to integrated circuit 100A-100B, 200A, 400A, 500A, 600A (FIGS. 1A-1B, 2A, 4A, 5A or 6A), snapback device array 300A (FIG. 3A), or equivalent circuit 200B (FIG. 2B), 500B (FIG. 5B) or 600B (FIG. 6B) or an integrated circuit with similar features as at least layout design 300B, 400B, 500C, 600C, 700A-700C or 800A-800C (FIGS. 3B, 4B, 5C, 6C, 7A-7C or 8A-8C).

Figure 13:
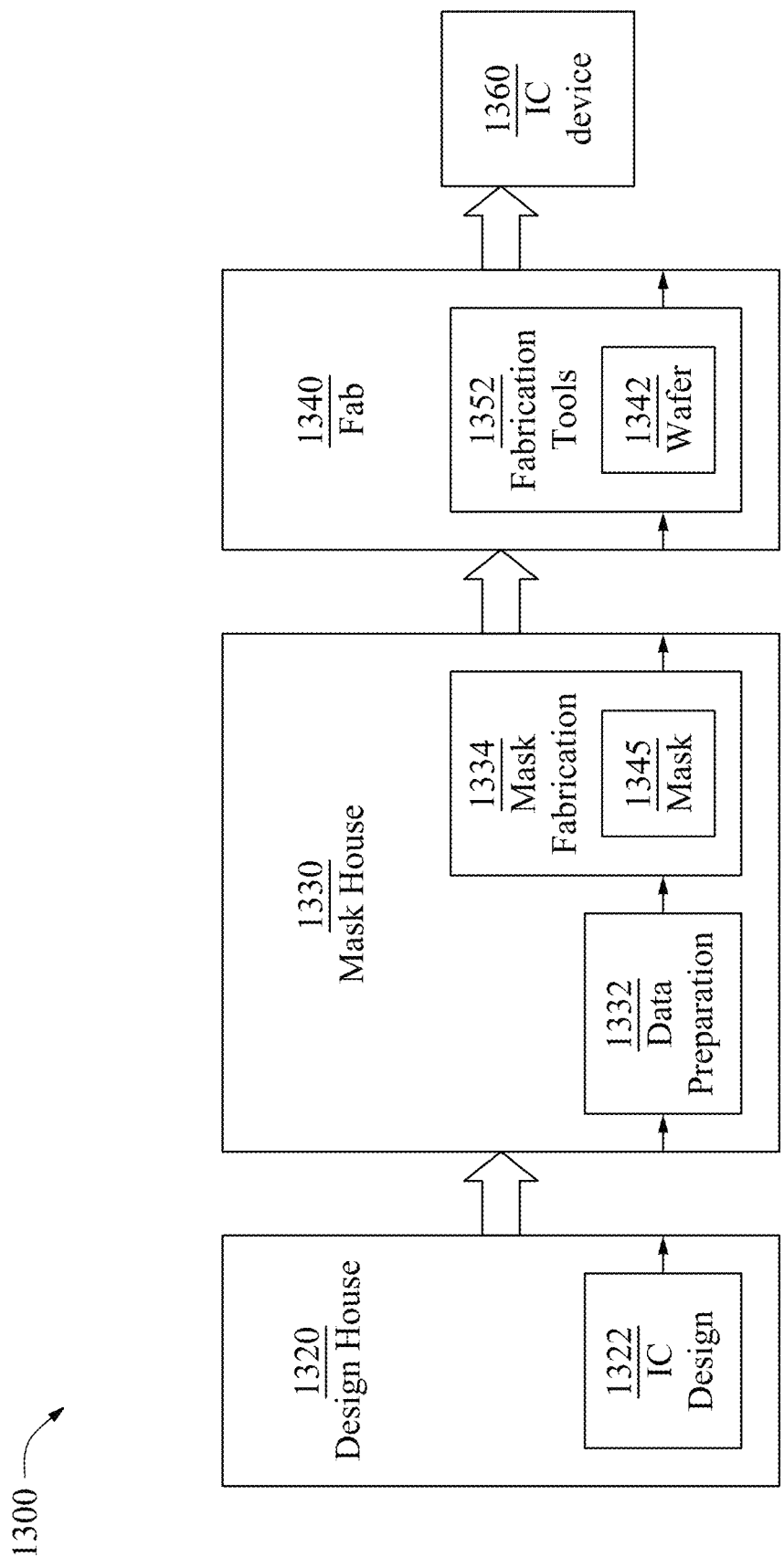
FIG. 13 is a block diagram of an integrated circuit (IC) manufacturing system, and an IC manufacturing flow associated therewith, in accordance with at least one embodiment of the present disclosure.

In some embodiments, at least one or more operations of method 1000B is performed by system 1300 of FIG. 13. In some embodiments, at least one method(s), such as method 1000B discussed above, is performed in whole or in part by at least one manufacturing system, including system 1300.

One or more of the operations of method 1000B is performed by IC fab 1340 (FIG. 13) to fabricate IC device 1360. In some embodiments, one or more of the operations of method 1000B is performed by fabrication tools 1352 to fabricate wafer 1342.

Figure 11:
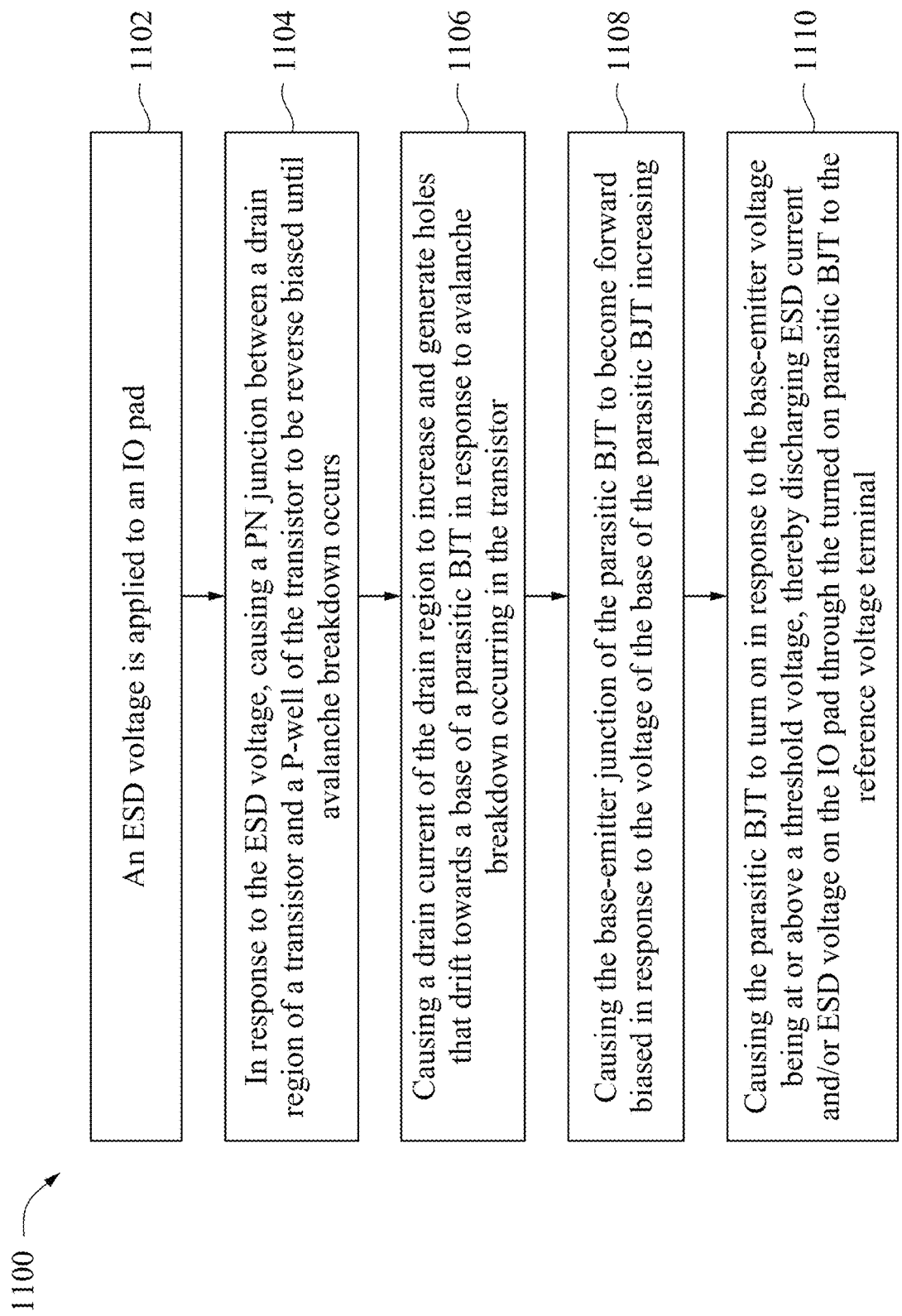
FIG. 11 is a flowchart of a method of operating a circuit, in accordance with some embodiments.

FIG. 11 is a flowchart of a method 1100 of operating a circuit, in accordance with some embodiments. In some embodiments, the circuit of method 1100 includes at least integrated circuit 100A-100B, 200A, 400A, 500A, 600A (FIGS. 1A-1B, 2A, 4A, 5A or 6A), snapback device array 300A (FIG. 3A), or equivalent circuit 200B (FIG. 2B), 500B (FIG. 5B) or 600B (FIG. 6B). It is understood that additional operations may be performed before, during, and/or after the method 1100 depicted in FIG. 11, and that some other processes may only be briefly described herein. It is understood that method 1100 utilizes features of one or more of integrated circuit 100A-100B, 200A, 400A, 500A, 600A (FIGS. 1A-1B, 2A, 4A, 5A or 6A), snapback device array 300A (FIG. 3A), or equivalent circuit 200B (FIG. 2B), 500B (FIG. 5B) or 600B (FIG. 6B).

In operation 1102 of method 1100, an ESD voltage is applied on an IO pad 108. In some embodiments, the ESD voltage is greater than a supply voltage VDD of voltage supply terminal 104.

At operation 1104, in response to the ESD voltage being applied to the IO pad 108, causing a PN junction between a drain region 212 and a P-well 204 of transistor 260 to be reverse biased until avalanche breakdown occurs.

At operation 1106, avalanche breakdown occurs in transistor 260 thereby causing a drain current of the drain region 212 to increase and generate holes that drift towards the base 242 of a parasitic BJT (e.g., BJT 240). In some embodiments, operation 1106 further includes causing a voltage drop across the base resistance Rb of BJT 240 in response to the flow of holes from the avalanche breakdown.

At operation 1108, causing the base-emitter junction of BJT 240 to become forward biased in response to the voltage of base 242 of BJT 240 increasing. In some embodiments, operation 1108 further includes causing a substrate current of holes to flow to the P-well tap 216 of P-well 204 in substrate 202 thereby further increasing the base-emitter voltage of the parasitic NPN BJT (e.g., BJT 240). For example, as described with respect to FIG. 2B, the substrate current of holes flow to the P-well tap 216 of P-well 204 in substrate 202 due to the low voltage level (e.g., voltage VSS) of reference voltage terminal 106 being coupled to the P-well tap 216. The current of holes flowing in P-well 204 and/or substrate 202 increases the voltage drop across the base resistance Rb, thereby increasing the base-emitter voltage Vbe of the parasitic NPN BJT (e.g., BJT 240). For example, as discussed above in FIGS. 2A-2B, the addition of N-well 206 in at least P-Well 204 or on substrate 202 causes the base resistance Rb of BJT 240 or transistor 260 to be increased compared to other approaches. Thus, the increased base resistance Rb of BJT 240 causes the base-emitter voltage Vbe of the parasitic NPN BJT (e.g., BJT 240) to be increased faster than other approaches.

At operation 1110, causing the parasitic NPN BJT (e.g., BJT 240) to turn on in response to the base-emitter voltage being at or above a threshold voltage, thereby discharging ESD current I1 and/or the ESD voltage on IO pad 108 through the turned on parasitic NPN BJT to the reference voltage terminal 106. Thus, the high ESD current I1 from the ESD event is redirected away from gate structure 230 of transistor 260. In some embodiments, because the base resistance Rb of BJT 240 is increased by the addition of N-well 206 in at least P-Well 204 or on substrate 202, causes the base-emitter voltage Vbe to rise faster toward the threshold voltage Vth of BJT 240, thereby causing BJT 240 to turn on earlier at a lowered ESD trigger voltage Vth, and the ESD voltage on IO pad 108 is discharged faster than other approaches.

In some embodiments, one or more of the operations of at least method 900, 1000A or 1100 is not performed. While method 1100 was described above with reference to FIGS. 2A-2B, it is understood that method 1100 utilizes the features of one or more of FIGS. 1A-1B & 3A-8C, in some embodiments. In these embodiments, other operations of method 1100 would be performed consistent with the description and operation of integrated circuit 200A or equivalent circuit 200B.

Other transistor types or other numbers of transistors in at least integrated circuit 100A-100B, 200A, 400A, 500A, 600A (FIGS. 1A-1B, 2A, 4A, 5A or 6A), snapback device array 300A (FIG. 3A), or equivalent circuit 200B (FIG. 2B), 500B (FIG. 5B) or 600B (FIG. 6B) are within the scope of the present disclosure.

FIG. 12 is a schematic view of a system 1200 for designing an IC layout design and manufacturing an IC circuit in accordance with some embodiments. In some embodiments, system 1200 generates or places one or more IC layout designs described herein. System 1200 includes a hardware processor 1202 and a non-transitory, computer readable storage medium 1204 (e.g., memory 1204) encoded with, i.e., storing, the computer program code 1206, i.e., a set of executable instructions 1206. Computer readable storage medium 1204 is configured for interfacing with manufacturing machines for producing the integrated circuit. The processor 1202 is electrically coupled to the computer readable storage medium 1204 via a bus 1208. The processor 1202 is also electrically coupled to an I/O interface 1210 by bus 1208. A network interface 1212 is also electrically connected to the processor 1202 via bus 1208. Network interface 1212 is connected to a network 1214, so that processor 1202 and computer readable storage medium 1204 are capable of connecting to external elements by network 1214. The processor 1202 is configured to execute the computer program code 1206 encoded in the computer readable storage medium 1204 in order to cause system 1200 to be usable for performing a portion or all of the operations as described in at least method 900 or 1000A.

In some embodiments, the processor 1202 is a central processing unit (CPU), a multi-processor, a distributed processing system, an application specific integrated circuit (ASIC), and/or a suitable processing unit.

In some embodiments, the computer readable storage medium 1204 is an electronic, magnetic, optical, electromagnetic, infrared, and/or a semiconductor system (or apparatus or device). For example, the computer readable storage medium 1204 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1204 includes a compact disk-read only memory (CD-ROM), a compact disk-read/write (CD-R/W), and/or a digital video disc (DVD).

In some embodiments, the storage medium 1204 stores the computer program code 1206 configured to cause system 1200 to perform at least method 900 or 1000A. In some embodiments, the storage medium 1204 also stores information needed for performing at least method 900 or 1000A as well as information generated during performing at least method 900 or 1000A, such as layout design 1216, user interface 1218 and fabrication unit 1220, and/or a set of executable instructions to perform the operation of at least method 900 or 1000A. In some embodiments, layout design 1216 comprises one or more of layout patterns of at least layout design 300B, 400B, 500C, 600C, 700A-700C or 800A-800C (FIGS. 3B, 4B, 5C, 6C, 7A-7C or 8A-8C).

In some embodiments, the storage medium 1204 stores instructions (e.g., computer program code 1206) for interfacing with manufacturing machines. The instructions (e.g., computer program code 1206) enable processor 1202 to generate manufacturing instructions readable by the manufacturing machines to effectively implement at least method 900 or 1000A during a manufacturing process.

System 1200 includes I/O interface 1210. I/O interface 1210 is coupled to external circuitry. In some embodiments, I/O interface 1210 includes a keyboard, keypad, mouse, trackball, trackpad, and/or cursor direction keys for communicating information and commands to processor 1202.

System 1200 also includes network interface 1212 coupled to the processor 1202. Network interface 1212 allows system 1200 to communicate with network 1214, to which one or more other computer systems are connected. Network interface 1212 includes wireless network interfaces such as BLUETOOTH, WIFI, WIMAX, GPRS, or WCDMA; or wired network interface such as ETHERNET, USB, or IEEE-1394. In some embodiments, at least method 900 or 1000A is implemented in two or more systems 1200, and information such as layout design, and user interface are exchanged between different systems 1200 by network 1214.

System 1200 is configured to receive information related to a layout design through I/O interface 1210 or network interface 1212. The information is transferred to processor 1202 by bus 1208 to determine a layout design for producing an integrated circuit, such as integrated circuit 100A-100B, 200A, 400A, 500A, 600A (FIGS. 1A-1B, 2A, 4A, 5A or 6A), snapback device array 300A (FIG. 3A), or equivalent circuit 200B (FIG. 2B), 500B (FIG. 5B) or 600B (FIG. 6B). The layout design is then stored in computer readable medium 1204 as layout design 1216. System 1200 is configured to receive information related to a user interface through I/O interface 1210 or network interface 1212. The information is stored in computer readable medium 1204 as user interface 1218. System 1200 is configured to receive information related to a fabrication unit through I/O interface 1210 or network interface 1212. The information is stored in computer readable medium 1204 as fabrication unit 1220. In some embodiments, the fabrication unit 1220 includes fabrication information utilized by system 1200. In some embodiments, the fabrication unit 1220 includes at least mask fabrication 1334 or IC fab 1340 of FIG. 13.

In some embodiments, at least method 900 or 1000A is implemented as a standalone software application for execution by a processor. In some embodiments, at least method 900 or 1000A is implemented as a software application that is a part of an additional software application. In some embodiments, at least method 900 or 1000A is implemented as a plug-in to a software application. In some embodiments, at least method 900 or 1000A is implemented as a software application that is a portion of an EDA tool. In some embodiments, at least method 900 or 1000A is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, at least a portion of at least method 900 or 1000A is implemented by a manufacturing device to manufacture an integrated circuit using a set of masks manufactured based on one or more layout designs generated by system 1200. In some embodiments, system 1200 is a manufacturing device to manufacture an integrated circuit using a set of masks manufactured based on one or more layout designs of the present disclosure. In some embodiments, system 1200 of FIG. 12 generates layout designs of an integrated circuit that are smaller than other approaches. In some embodiments, system 1200 of FIG. 12 generates layout designs of integrated circuit structure that occupy less area and provide better routing resources than other approaches.

FIG. 13 is a block diagram of an integrated circuit (IC) manufacturing system 1300, and an IC manufacturing flow associated therewith, in accordance with at least one embodiment of the present disclosure. In some embodiments, based on a layout diagram, at least one of (A) one or more semiconductor masks or (B) at least one component in a layer of a semiconductor integrated circuit is fabricated using manufacturing system 1300.

In FIG. 13, IC manufacturing system 1300 (hereinafter "system 1300") includes entities, such as a design house 1320, a mask house 1330, and an IC manufacturer/fabricator ("fab") 1340, that interact with one another in the design, development, and manufacturing cycles and/or services related to manufacturing an IC device 1360. The entities in system 1300 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, one or more of design house 1320, mask house 1330, and IC fab 1340 is owned by a single larger company. In some embodiments, one or more of design house 1320, mask house 1330, and IC fab 1340 coexist in a common facility and use common resources.

Design house (or design team) 1320 generates an IC design layout 1322. IC design layout 1322 includes various geometrical patterns designed for an IC device 1360. The geometrical patterns correspond to patterns of metal, oxide, or semiconductor layers that make up the various components of IC device 1360 to be fabricated. The various layers combine to form various IC features. For example, a portion of IC design layout 1322 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 1320 implements a proper design procedure to form IC design layout 1322. The design procedure includes one or more of logic design, physical design or place and route. IC design layout 1322 is presented in one or more data files having information of the geometrical patterns. For example, IC design layout 1322 can be expressed in a GDSII file format or DFII file format.

Mask house 1330 includes data preparation 1332 and mask fabrication 1334. Mask house 1330 uses IC design layout 1322 to manufacture one or more masks 1345 to be used for fabricating the various layers of IC device 1360 according to IC design layout 1322. Mask house 1330 performs mask data preparation 1332, where IC design layout 1322 is translated into a representative data file ("RDF"). Mask data preparation 1332 provides the RDF to mask fabrication 1334. Mask fabrication 1334 includes a mask writer. A mask writer converts the RDF to an image on a substrate, such as a mask (reticle) 1345 or a semiconductor wafer 1342. The design layout 1322 is manipulated by mask data preparation 1332 to comply with particular characteristics of the mask writer and/or requirements of IC fab 1340. In FIG. 13, mask data preparation 1332 and mask fabrication 1334 are illustrated as separate elements. In some embodiments, mask data preparation 1332 and mask fabrication 1334 can be collectively referred to as mask data preparation.

In some embodiments, mask data preparation 1332 includes optical proximity correction (OPC) which uses lithography enhancement techniques to compensate for image errors, such as those that can arise from diffraction, interference, other process effects and the like. OPC adjusts IC design layout 1322. In some embodiments, mask data preparation 1332 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1332 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1334, which may undo part of the modifications performed by OPC in order to meet mask creation rules.

In some embodiments, mask data preparation 1332 includes lithography process checking (LPC) that simulates processing that will be implemented by IC fab 1340 to fabricate IC device 1360. LPC simulates this processing based on IC design layout 1322 to create a simulated manufactured device, such as IC device 1360. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 1322.

It should be understood that the above description of mask data preparation 1332 has been simplified for the purposes of clarity. In some embodiments, data preparation 1332 includes additional features such as a logic operation (LOP) to modify the IC design layout according to manufacturing rules. Additionally, the processes applied to IC design layout 1322 during data preparation 1332 may be executed in a variety of different orders.

After mask data preparation 1332 and during mask fabrication 1334, a mask 1345 or a group of masks 1345 are fabricated based on the modified IC design layout 1322. In some embodiments, mask fabrication 1334 includes performing one or more lithographic exposures based on IC design layout 1322. In some embodiments, an electron-beam (e-beam) or a mechanism of multiple e-beams is used to form a pattern on a mask (photomask or reticle) 1345 based on the modified IC design layout 1322. The mask 1345 can be formed in various technologies. In some embodiments, the mask 1345 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary version of mask 1345 includes a transparent substrate (e.g., fused quartz) and an opaque material (e.g., chromium) coated in the opaque regions of the binary mask. In another example, the mask 1345 is formed using a phase shift technology. In the phase shift mask (PSM) version of mask 1345, various features in the pattern formed on the mask are configured to have proper phase difference to enhance the resolution and imaging quality. In various examples, the phase shift mask can be attenuated PSM or alternating PSM. The mask(s) generated by mask fabrication 1334 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1340 is an IC fabrication entity that includes one or more manufacturing facilities for the fabrication of a variety of different IC products. In some embodiments, IC Fab 1340 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 1340 includes wafer fabrication tools 1352 (hereinafter "fabrication tools 1352") configured to execute various manufacturing operations on semiconductor wafer 1342 such that IC device 1360 is fabricated in accordance with the mask(s), e.g., mask 1345. In various embodiments, fabrication tools 1352 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1340 uses mask(s) 1345 fabricated by mask house 1330 to fabricate IC device 1360. Thus, IC fab 1340 at least indirectly uses IC design layout 1322 to fabricate IC device 1360. In some embodiments, a semiconductor wafer 1342 is fabricated by IC fab 1340 using mask(s) 1345 to form IC device 1360. In some embodiments, the IC fabrication includes performing one or more lithographic exposures based at least indirectly on IC design layout 1322. Semiconductor wafer 1342 includes a silicon substrate or other proper substrate having material layers formed thereon. Semiconductor wafer 1342 further includes one or more of various doped regions, dielectric features, multilevel interconnects, and the like (formed at subsequent manufacturing steps).

System 1300 is shown as having design house 1320, mask house 1330 or IC fab 1340 as separate components or entities. However, it is understood that one or more of design house 1320, mask house 1330 or IC fab 1340 are part of the same component or entity.

Details regarding an integrated circuit (IC) manufacturing system (e.g., system 1300 of FIG. 13), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

Furthermore, various PMOS transistors shown in FIGS. 1A-13 are of a particular dopant type (e.g., N-type or P-type) and are for illustration purposes. Embodiments of the disclosure are not limited to a particular transistor type, and one or more of the PMOS or NMOS transistors shown in FIGS. 1A-13 can be substituted with a corresponding transistor of a different transistor/dopant type. Similarly, the low or high logical value of various signals used in the above description is also used for illustration. Embodiments of the disclosure are not limited to a particular logical value when a signal is activated and/or deactivated. Selecting different logical values is within the scope of various embodiments. Selecting different numbers of PMOS transistors in 1A-13 is within the scope of various embodiments.

One aspect of this description relates to an ESD protection circuit. The snapback ESD protection circuit includes a first well in a substrate, a drain region of a transistor, a source region of the transistor, a gate region of the transistor, and a second well embedded in the first well. The first well has a first dopant type. The drain region is in the first well, and has a second dopant type different from the first dopant type. The source region is in the first well, has the second dopant type, and is separated from the drain region in a first direction. The gate region is over the first well and the substrate. The second well is embedded in the first well, and is adjacent to a portion of the drain region. The second well has the second dopant type.

Another aspect of this description relates to an ESD protection circuit. In some embodiments, the ESD protection circuit includes a first well in a substrate, the first well having a first dopant type; a drain region of a first transistor, the drain region being in the first well, and having a second dopant type different from the first dopant type; a source region of the first transistor, the source region being in the first well, having the second dopant type, and being separated from the drain region in a first direction; a gate region of the first transistor, the gate region being over the first well and the substrate; a second well embedded in the first well, and adjacent to a portion of the source region, and the second well having the second dopant type; and a tap well in the first well and having the first dopant type, and being coupled to the source region. In some embodiments, the ESD protection circuit further includes an input/output (IO) pad coupled to the drain region; and a reference voltage supply terminal coupled to the source region and the tap well. In some embodiments, the gate region is coupled to the source region, the tap well and the reference voltage supply terminal. In some embodiments, the ESD protection circuit further includes a parasitic BJT in the first well, the parasitic BJT has a base, a collector and an emitter, the collector being coupled to the IO pad by the drain region, the emitter being coupled to the source region; and a parasitic base resistance of the first well and the substrate, the parasitic base resistance having a first end coupled to the reference voltage supply terminal by the tap well, and a second end coupled to the base of the parasitic BJT, wherein the parasitic BJT is configured to turn on in response to a base-emitter voltage of the parasitic BJT being at or above a threshold voltage from an ESD voltage applied to the IO pad, thereby discharging the ESD voltage through the parasitic BJT to the reference voltage supply terminal. In some embodiments, the ESD protection circuit further includes a second transistor coupled in parallel to the first transistor, the second transistor corresponding to a driver circuit, and the second transistor comprising: a gate of the second transistor configured to receive a driver signal; a drain of the second transistor coupled to the IO pad and the drain region of the first transistor; a body of the second transistor; and a source of the second transistor coupled to the body of the second transistor, the reference voltage supply terminal, and the source region of the first transistor. In some embodiments, the ESD protection circuit further includes a parasitic capacitance between the gate of the second transistor and the drain of the second transistor, wherein the gate of the second transistor is capacitively coupled to the drain of the second transistor and the IO pad through the parasitic capacitance, the gate receiving an ESD voltage applied to the IO pad, during a positive ESD event, through the parasitic capacitance thereby causing the second transistor to turn on and generate a channel current in the first well. In some embodiments, the first well has a first width in the first direction, and the second well has a second width in the first direction, the second width being less than the first width.

Yet another aspect of this description relates to a method of manufacturing a snapback electrostatic discharge (ESD) protection circuit. In some embodiments, the method includes fabricating a first well in a substrate, the first well extending in a first direction, and having a first dopant type; fabricating a drain region of a transistor in the first well, the drain region extending in the first direction, and having a second dopant type different from the first dopant type; fabricating a source region of the transistor in the first well, the source region extending in the first direction, having the second dopant type, and being separated from the drain region in a second direction different from the first direction; fabricating a second well in the first well, the second well extending in the first direction, having the second dopant type, and being adjacent to a portion of the drain region, and fabricating a gate region of the transistor, the gate region being between the drain region and the source region, and being over the first well and the substrate. In some embodiments, the method further includes fabricating a third well in the first well, the third well having the first dopant type, extending in the first direction, and surrounding the second well, the drain region, the source region, and the gate region; depositing a first conductive region over the drain region thereby forming a drain contact; depositing a second conductive region over the source region thereby forming a source contact; depositing a third conductive region over the third well thereby forming a tap contact; depositing a fourth conductive region over the drain contact thereby coupling the drain contact to an input/output (IO) pad region; and depositing a fifth conductive region over the source contact and the tap contact thereby coupling the source contact, the tap contact and a reference voltage supply terminal together. In some embodiments, the method further includes fabricating a fourth well in the first well, the fourth well having the second dopant type, extending in the first direction, being separated from the second well in the second direction, the fourth well is adjacent to a portion of the source region. In some embodiments, the method further includes fabricating a fourth well in the first well, the fourth well having the second dopant type, extending in the second direction, being separated from the second well in the first direction, the fourth well is between a side of the third well and the second well; fabricating a set of source regions and a set of drain regions in the fourth well, the set of source regions and the set of drain regions having the second dopant type, and extending in the first direction; and fabricating a set of dummy gate regions between the set of source regions and the set of drain regions, the set of dummy gate regions extending in the first direction, and being separated from each other in the second direction, the set of source regions, the set of drain regions and the set of dummy gate regions corresponding to a set of dummy transistors.

Another aspect of this description relates to a method of manufacturing a snapback ESD protection circuit. The method includes generating, by a processor, a layout design of the snapback ESD protection circuit and manufacturing the snapback ESD protection circuit based on the layout design of the snapback ESD protection circuit. In some embodiments, generating the layout design of the snapback ESD protection circuit includes generating a first active region layout pattern extending in a first direction, and being in a first layout level, the first active region layout pattern corresponding to fabricating a drain region of the snapback ESD protection circuit in a p-well. In some embodiments, generating the layout design of the snapback ESD protection circuit further includes generating a second active region layout pattern extending in the first direction, and being in the first layout level, the second active region layout pattern corresponding to fabricating a source region of the snapback ESD protection circuit in the p-well. In some embodiments, generating the layout design of the snapback ESD protection circuit further includes generating a first well layout pattern extending in a second direction different from the first direction, being in a second layout level and being over the first active region layout pattern, the first well layout pattern corresponding to fabricating a first n-well of the snapback ESD protection circuit, the first n-well embedded in the p-well and adjacent to a portion of the drain region.

Yet another aspect of this description relates to a method of manufacturing a snapback ESD protection circuit. The method includes placing, by a processor, a layout design of the array of snapback ESD protection circuits and manufacturing the array of snapback ESD protection circuits based on the layout design of the array of snapback ESD protection circuits. In some embodiments, placing the layout design of the array of snapback ESD protection circuits includes placing a first active region layout pattern in a first layout level, the first active region layout pattern extending in a first direction, and corresponding to fabricating a drain region of a first snapback ESD protection circuit of the array of snapback ESD protection circuits in a p-well. In some embodiments, placing the layout design of the array of snapback ESD protection circuits further includes placing a second active region layout pattern in the first layout level, the second active region layout pattern extending in the first direction, and corresponding to fabricating a source region of the first snapback ESD protection circuit of the array of snapback ESD protection circuits in the p-well. In some embodiments, placing the layout design of the array of snapback ESD protection circuits further includes placing a first well layout pattern over the first active region layout pattern or the second active region layout pattern, and in a second layout level, the first well layout pattern extending in a second direction different from the first direction, and corresponding to fabricating a first n-well of the first snapback ESD protection circuit of the array of snapback ESD protection circuits, the first n-well embedded in the p-well and adjacent to a portion of the drain region or the source region.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source. As such, the term source and drain are used interchangeably. Various signals are generated by corresponding circuits, but, for simplicity, the circuits are not shown.

Various figures show capacitive circuits using discrete capacitors for illustration. Equivalent circuitry may be used. For example, a capacitive device, circuitry or network (e.g., a combination of capacitors, capacitive elements, devices, circuitry, or the like) can be used in place of the discrete capacitor. The above illustrations include exemplary steps, but the steps are not necessarily performed in the order shown. Steps may be added, replaced, changed order, and/or eliminated as appropriate, in accordance with the spirit and scope of disclosed embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A snapback electrostatic discharge (ESD) protection circuit comprising:
   a first well in a substrate, the first well having a first dopant type;
   a drain region of a transistor, the drain region being in the first well, and having a second dopant type different from the first dopant type;
   a source region of the transistor, the source region being in the first well, having the second dopant type, and being separated from the drain region in a first direction;
   a gate region of the transistor, the gate region being over the first well and the substrate;
   a second well embedded in the first well, and adjacent to a portion of the drain region, and the second well having the second dopant type;
   a third well embedded in the first well, the third well having the second dopant type, and being adjacent to a portion of the source region, a top surface of the third well is coplanar with a top surface of the first well and a top surface of the source region; and
   a first shallow trench isolation (STI) region adjacent to the drain region of the transistor, and being in the second well;
   wherein the first well has a first depth in a second direction different from the first direction; and
   the second well has a second depth in the second direction, and the second depth is equal to the first depth.

2. The snapback ESD protection circuit of claim 1, further comprising:
   a tap well in the first well and having the first dopant type.

3. The snapback ESD protection circuit of claim 2, further comprising:
   an input/output (IO) pad coupled to the drain region; and
   a reference voltage supply terminal coupled to the source region and the tap well.

4. The snapback ESD protection circuit of claim 3, further comprising:
   a parasitic bipolar junction transistor (BJT) in the first well, the parasitic BJT has a base, a collector and an emitter, the collector being coupled to the IO pad by the drain region, the emitter being coupled to the source region; and
   a parasitic base resistance of the first well and the substrate, the parasitic base resistance having a first end coupled to the reference voltage supply terminal by the tap well, and a second end coupled to the base of the parasitic BJT,
   wherein the parasitic BJT is configured to turn on in response to a base-emitter voltage of the parasitic BJT being at or above a threshold voltage from an ESD voltage applied to the IO pad, thereby discharging the ESD voltage through the parasitic BJT to the reference voltage supply terminal.

5. The snapback ESD protection circuit of claim 3, wherein
   the gate region is coupled to the source region, the tap well and the reference voltage supply terminal, the reference voltage supply terminal being a ground terminal.

6. The snapback ESD protection circuit of claim 1, wherein
the first well has a first width in the first direction, and
the second well has a second width in the first direction, the second width being less than the first width.

7. The snapback ESD protection circuit of claim 6, wherein
the third well has a third width in the first direction, the third width being different from at least the first width or the second width.

8. The snapback ESD protection circuit of claim 1, wherein
the transistor corresponds to a driver circuit,
the gate region corresponds to a gate of the driver circuit;
the drain region corresponds to a drain of the driver circuit; and
the source region corresponds to a source of the driver circuit.

9. The snapback ESD protection circuit of claim 1, wherein a portion of the first well is in direct contact with a portion of the second well.

10. An electrostatic discharge (ESD) protection circuit comprising:
a first well in a substrate, the first well having a first dopant type;
a drain region of a first transistor, the drain region being in the first well, and having a second dopant type different from the first dopant type;
a source region of the first transistor, the source region being in the first well, having the second dopant type, and being separated from the drain region in a first direction;
a gate region of the first transistor, the gate region being over the first well and the substrate;
a second well embedded in the first well, and adjacent to a portion of the source region, and the second well having the second dopant type, a top surface of the second well is coplanar with a top surface of the first well and a top surface of the source region;
a tap well in the first well and having the first dopant type, and being coupled to the source region;
a third well embedded in the first well, the third well having the second dopant type, and being adjacent to a portion of the drain region; and
a first shallow trench isolation (STI) region adjacent to the drain region of the first transistor, and being in the third well;
wherein the first well has a first depth in a second direction different from the first direction; and
the second well has a second depth in the second direction, and the second depth is equal to the first depth.

11. The ESD protection circuit of claim 10, further comprising:
an input/output (IO) pad coupled to the drain region; and
a reference voltage supply terminal coupled to the source region and the tap well.

12. The ESD protection circuit of claim 11, wherein
the gate region is coupled to the source region, the tap well and the reference voltage supply terminal, the reference voltage supply terminal being a ground terminal.

13. The ESD protection circuit of claim 11, further comprising:
a parasitic bipolar junction transistor (BJT) in the first well, the parasitic BJT has a base, a collector and an emitter, the collector being coupled to the IO pad by the drain region, the emitter being coupled to the source region; and
a parasitic base resistance of the first well and the substrate, the parasitic base resistance having a first end coupled to the reference voltage supply terminal by the tap well, and a second end coupled to the base of the parasitic BJT,
wherein the parasitic BJT is configured to turn on in response to a base-emitter voltage of the parasitic BJT being at or above a threshold voltage from an ESD voltage applied to the IO pad, thereby discharging the ESD voltage through the parasitic BJT to the reference voltage supply terminal.

14. The ESD protection circuit of claim 11, further comprising:
a second transistor coupled in parallel to the first transistor, the second transistor corresponding to a driver circuit, and the second transistor comprising:
a gate of the second transistor configured to receive a driver signal;
a drain of the second transistor coupled to the IO pad and the drain region of the first transistor;
a body of the second transistor; and
a source of the second transistor coupled to the body of the second transistor, the reference voltage supply terminal, and the source region of the first transistor.

15. The ESD protection circuit of claim 14, further comprising:
a parasitic capacitance between the gate of the second transistor and the drain of the second transistor,
wherein the gate of the second transistor is capacitively coupled to the drain of the second transistor and the IO pad through the parasitic capacitance, the gate receiving an ESD voltage applied to the IO pad, during a positive ESD event, through the parasitic capacitance thereby causing the second transistor to turn on and generate a channel current in the first well.

16. A snapback electrostatic discharge (ESD) protection circuit comprising:
a first well in a substrate, the first well having a first dopant type;
a drain of a transistor, the drain being in the first well, and having a second dopant type different from the first dopant type;
a source of the transistor, the source being in the first well, having the second dopant type, and being separated from the drain in a first direction;
a gate of the transistor, the gate being over the first well and the substrate;
a second well in the first well, and adjacent to a first portion of the drain, and the second well having the second dopant type;
a third well embedded in the first well, the third well having the second dopant type, and being adjacent to a first portion of the source, a top surface of the third well is coplanar with a top surface of the first well and a top surface of the source; and
a first shallow trench isolation (STI) region adjacent to the drain of the transistor, and being in the second well;
wherein the first well has a first depth in a second direction different from the first direction; and
the second well has a second depth in the second direction, and the second depth is equal to the first depth.

17. The snapback ESD protection circuit of claim 16, further comprising:

a first conductive line extending in the first direction, and being coupled to at least the drain.

18. The snapback ESD protection circuit of claim 17, further comprising:
   an input/output (IO) pad coupled to the drain by the first conductive line; and
   a reference voltage supply terminal coupled to the source and a tap well.

19. The snapback ESD protection circuit of claim 18, further comprising:
   a parasitic bipolar junction transistor (BJT) in the first well, the parasitic BJT has a base, a collector and an emitter, the collector being coupled to the IO pad by the drain, the emitter being coupled to the source; and
   a parasitic base resistance of the first well and the substrate, the parasitic base resistance having a first end coupled to the reference voltage supply terminal by the tap well, and a second end coupled to the base of the parasitic BJT,
   wherein the parasitic BJT is configured to turn on in response to a base-emitter voltage of the parasitic BJT being at or above a threshold voltage from an ESD voltage applied to the IO pad, thereby discharging the ESD voltage through the parasitic BJT to the reference voltage supply terminal.

20. The snapback ESD protection circuit of claim 16, wherein
   the first well has a first width in the first direction,
   the second well has a second width in the first direction, the second width being less than the first width; and
   the third well has a third width in the first direction, the third width being different from at least the first width or the second width.

* * * * *